US008848421B2

(12) United States Patent
Kawai et al.

(10) Patent No.: US 8,848,421 B2
(45) Date of Patent: Sep. 30, 2014

(54) FORMING METHOD OF PERFORMING FORMING ON VARIABLE RESISTANCE NONVOLATILE MEMORY ELEMENT, AND VARIABLE RESISTANCE NONVOLATILE MEMORY DEVICE

(75) Inventors: Ken Kawai, Osaka (JP); Kazuhiko Shimakawa, Osaka (JP); Koji Katayama, Nara (JP)

(73) Assignee: Panasonic Corporation, Osaka (JP)

( * ) Notice: Subject to any disclaimer, the term of this patent is extended or adjusted under 35 U.S.C. 154(b) by 239 days.

(21) Appl. No.: 13/634,161

(22) PCT Filed: Mar. 28, 2011

(86) PCT No.: PCT/JP2011/001809
§ 371 (c)(1),
(2), (4) Date: Sep. 11, 2012

(87) PCT Pub. No.: WO2011/121970
PCT Pub. Date: Oct. 6, 2011

(65) Prior Publication Data
US 2013/0044534 A1 Feb. 21, 2013

(30) Foreign Application Priority Data
Mar. 30, 2010 (JP) ................................. 2010-079478

(51) Int. Cl.
| | |
|---|---|
| *G11C 11/00* | (2006.01) |
| *H01L 45/00* | (2006.01) |
| *H01L 27/10* | (2006.01) |
| *G11C 13/00* | (2006.01) |
| *H01L 27/24* | (2006.01) |

(52) U.S. Cl.
CPC ............ *G11C 13/0007* (2013.01); *H01L 45/08* (2013.01); *H01L 45/16* (2013.01); *H01L 45/146* (2013.01); *G11C 2013/0073* (2013.01); *H01L 27/101* (2013.01); *H01L 45/1233* (2013.01); *G11C 2013/0083* (2013.01); *G11C 2213/32* (2013.01); *H01L 27/2436* (2013.01); *G11C 2213/79* (2013.01); *G11C 13/0069* (2013.01)
USPC ....................... 365/148; 365/185.24; 365/163

(58) Field of Classification Search
CPC ..................... G11C 13/0069; G11C 2013/009; G11C 13/0002
USPC ........................................ 365/148, 185.24, 163
See application file for complete search history.

(56) References Cited

U.S. PATENT DOCUMENTS

| | | | |
|---|---|---|---|
| 7,369,431 | B2 | 5/2008 | Muraoka et al. |
| 7,558,099 | B2 | 7/2009 | Morimoto |

(Continued)

FOREIGN PATENT DOCUMENTS

| | | |
|---|---|---|
| CN | 101636792 | 1/2010 |
| JP | 2006-351780 | 12/2006 |

(Continued)

OTHER PUBLICATIONS

International Search Report issued May 10, 2011 in International (PCT) Application No. PCT/JP2011/001809.

(Continued)

*Primary Examiner* — Son Dinh
*Assistant Examiner* — Nam Nguyen
(74) *Attorney, Agent, or Firm* — Wenderoth, Lind & Ponack, LLP

(57) ABSTRACT

A forming method of a variable resistance nonvolatile memory element capable of lowering a forming voltage and preventing variations of the forming voltage depending on variable resistance elements. The forming method is for initializing a variable resistance element, including a step (S24) of determining whether or not a current flowing in a 1T1R memory cell is greater than a reference current; a step (S22) of applying a forming positive voltage pulse having a pulse width (Tp(n)) is gradually increased when it is determined that the current is not greater than the reference current; and a step (S23) of applying a negative voltage pulse having a pulse width Tn equal to or shorter than a pulse width Tp(n). The determining step (S24), the application step (S22), and the application step (S23) are repeated until the forming becomes successful.

25 Claims, 25 Drawing Sheets

(56) References Cited

U.S. PATENT DOCUMENTS

| | | |
|---|---|---|
| 8,022,502 B2 | 9/2011 | Kanzawa et al. |
| 8,094,481 B2 | 1/2012 | Katoh et al. |
| 8,411,486 B2 | 4/2013 | Sekine et al. |
| 8,553,444 B2 * | 10/2013 | Muraoka et al. .............. 365/148 |
| 2007/0115714 A1 | 5/2007 | Muraoka et al. |
| 2007/0195581 A1 | 8/2007 | Morimoto |
| 2009/0283736 A1 | 11/2009 | Kanzawa et al. |
| 2010/0110767 A1 | 5/2010 | Katoh et al. |
| 2010/0207094 A1 | 8/2010 | Kanzawa et al. |
| 2011/0002154 A1 | 1/2011 | Mitani et al. |
| 2011/0044088 A1 | 2/2011 | Muraoka et al. |
| 2011/0069530 A1 | 3/2011 | Sekine et al. |
| 2011/0294259 A1 | 12/2011 | Kanzawa et al. |

FOREIGN PATENT DOCUMENTS

| | | |
|---|---|---|
| JP | 2007-4873 | 1/2007 |
| JP | 2007-134512 | 5/2007 |
| JP | 2007-515026 | 6/2007 |
| JP | 2007-226883 | 9/2007 |
| JP | 2008-210441 | 9/2008 |
| JP | 2011-66363 | 3/2011 |
| WO | 2008/149484 | 12/2008 |
| WO | 2009/050833 | 4/2009 |
| WO | 2010/004705 | 1/2010 |
| WO | 2010/021134 | 2/2010 |

OTHER PUBLICATIONS

I. G. Baek et al., "Highly Scalable Non-volatile Resistive Memory using Simple Binary Oxide Driven by Asymmetric Unipolar Voltage Pulses", IEEE IEDM, Dec. 2004, p. 587 (Fig. 5 (b)).

Office Action issued Feb. 8, 2014 in corresponding Chinese patent application No. 201180014829.1 with partial translation of search report.

* cited by examiner

FIG. 19

| Operation Mode / Node | Forming | | | Normal Operation | | |
|---|---|---|---|---|---|---|
| | Positive Pulse Application | Negative Pulse Application | Determination (Reading) | "0" Writing Positive Pulse Application | "1" Writing Negative Pulse Application | Reading |
| WL | VL (3.3V) | VL (3.3V) | VDD (1.8V) | VL (2.4V) | VL (2.4V) | VDD (1.8V) |
| SL | 0V | VL (3.3V) | 0V | 0V | VL (2.4V) | 0V |
| BL | VH 0V ↕ Variable Pulse Width | VH 0V | Vread (0.4V) | VH 0V | VH 0V | Vread (0.4V) |

FORMING METHOD OF PERFORMING FORMING ON VARIABLE RESISTANCE NONVOLATILE MEMORY ELEMENT, AND VARIABLE RESISTANCE NONVOLATILE MEMORY DEVICE

TECHNICAL FIELD

The present invention relates to a forming (initializing) method for providing stable resistance change to a variable resistance nonvolatile memory element having a resistance value reversibly changed based on electrical signals, and to a variable resistance nonvolatile memory device having a function of such a forming method.

BACKGROUND ART

In recent years, variable resistance nonvolatile memory devices (hereinafter, referred to also simply as "nonvolatile memory devices") having memory cells including variable resistance nonvolatile memory elements (hereinafter, referred to also simply as "variable resistance elements") have been researched and developed. The variable resistance elements are elements having characteristics in which a resistance value reversibly changes based on electrical signals, and capable of holding data corresponding to the resistance value in a nonvolatile manner.

Commonly known is a nonvolatile memory device including a matrix of so-called 1T1R memory cells in each of which a Metal Oxide Semiconductor (MOS) transistor and a variable resistance element are connected in series with each other at a location close to a cross-point between a bit line and a word line that are arranged perpendicular to each other. In each of the 1T1R memory cells, one of two terminals of the variable resistance element is connected to the bit line or a source line, while the other terminal is connected to a drain or source of the MOS transistor. A gate of the MOS transistor is connected to the word line. The other terminal of the MOS transistor is connected to the source line or the bit line which is not connected to the terminal of the variable resistance element. The source line is arranged parallel to the bit line or the word line.

Another memory cell structure is also generally known as a nonvolatile memory device including a matrix of cross point memory cells called 1D1R memory cells in each of which a diode and a variable resistance element are connected in series with each other at a cross-point between a bit line and a word line that are arranged perpendicular to each other.

The following describes typical examples of conventional variable resistance elements (Non-Patent Literature 1, and Patent Literatures 1 and 2).

First, Non-Patent Literature 1 discloses the following nonvolatile memory including 1T1R memory cells each using a transition metal oxide as a variable resistance element. A transition metal oxide thin film is generally a super high resistance that is almost an insulator before forming, and its resistance is not changed even by applying a pulse. A resistance value of the transition metal oxide film can therefore be changed by application of a pulse, by performing a forming to form a conducting path for switching the resistance value between a high resistance state and a low resistance state. Here, the forming (or forming processing) refers to initialization processing of a variable resistance element. The forming is an operation for changing a variable resistance element from a state having an extremely high resistance value after manufacture of the variable resistance element (in other words, an initial state where a voltage has not yet been applied after manufacturing) to an operable state where a resistance value of the variable resistance element is in a range lower than the initial state and can be changed between a high resistance state and a low resistance state according to application of a pulse. In other words, the forming is used to change the variable resistance element from a state after the manufacture where the variable resistance element has not yet operated as a variable resistance element to a state where the variable resistance element is capable of serving as a variable resistance element. In general, the forming is performed only once after the manufacture.

FIG. 25 is a graph plotting a dependency of a forming voltage (V_form) on a transition metal oxide film thickness (TMO) which is disclosed in Non-Patent Literature 1. The "forming voltage" refers to a voltage applied to perform a forming for a variable resistance element. The graph indicates four kinds of properties, NiO, $TiO_2$, $HfO_2$, and $ZrO_2$, as transition metal oxides. The forming voltage depends on the kinds of the transition metal oxides. Furthermore, when a thickness of a transition metal oxide is greater, the forming start voltage is higher. It is disclosed that, in order to decrease the forming voltage, it is therefore preferable to select a transition metal oxide such as NiO to form a transition metal oxide film having a small thickness.

Moreover, Patent Literature 1 discloses a metal ion conductive nonvolatile memory element in which rare earth oxide thin films are used as variable resistance elements.

FIG. 26 is a cross-sectional view of a memory cell disclosed in Patent Literature 1.

This memory cell has the following structure. A lower electrode 2 is formed on a substrate 1 having a high electrical conductivity (a silicon substrate 1 doped with a P-type high-concentration impurity, for example). An ion source layer 3 including a metallic element as an ion source is formed on the lower electrode 2. A memory layer 4 having a relatively high resistance value is formed on the ion source layer 3. An upper electrode 6 is formed to contact the memory layer 4 through an opening in an insulation layer 5 on the memory layer 4.

Patent Literature 1 discloses CuTe, GeSbTe, AgGeTe, and the like as a material of the ion source layer 3, and discloses a rear earth element oxide such as a gadolinium oxide as a material of the memory layer 4. A material of the lower electrode 2 and the upper electrode 6 is described as a common semiconductor line material such as TiW and TaN. Furthermore, a gadolinium oxide for the memory layer 4 is added with metallic particles such as Cu having an amount not enough to form a layer, namely, an amount enough to keep insulation properties or semi-insulation properties.

A method of writing data into the memory cell shown in FIG. 26 is as follows. When a negative voltage causing a potential of the upper electrode 6 to be lower than a potential of the lower electrode 2, a conducting path including a large amount of metallic elements is formed in the memory layer 4, or a large number of defects resulting from the metallic elements are formed in the memory layer 4. As a result, a resistance value of the memory layer 4 is decreased. On the other hand, when a positive voltage causing the potential of the upper electrode 6 to be higher than the potential of the lower electrode 2 is applied, the conducting path or the defects formed in the memory layer 4 due to the metallic elements disappear. As a result, the resistance value of the memory layer 4 is increased.

FIG. 27 is a graph plotting I-V properties changed from an initial state regarding the memory cell shown in FIG. 26. In the first loop, a relatively high negative voltage is applied to the memory cell to change a high resistance state of the initial state to a low resistance state. The voltage is assumed to be an initialization voltage Vo. Then, when a positive potential is increased, an erasing voltage Ve is applied to the memory cell to change the low resistance state to a high resistance state. Furthermore, after the first loop, a writing voltage Vr having an absolute value smaller than that of the initialization voltage Vo is applied to the memory cell to change the high resistance state to a low resistance state.

As described above, according to Patent Literature 1, once initialization is first performed by the high voltage Vo, the resistance state can be afterwards changed by the low erasing voltage Ve and writing voltage Vr. Patent Literature 1 also discloses that the initialization voltage Vo can be controlled by adding metal particles to the memory layer 4 to form defection caused by the metal element in the memory layer 4.

Furthermore, Patent Literature 2 disclose an initialization (forming) method for ion conductive nonvolatile variable resistance elements, by which data writing and erasing after initialization can be performed at a high speed.

FIG. 28 shows an initial pulse waveform for performing the initialization which is disclosed in Patent Literature 2. As shown in FIG. 28, without performing initialization by a pair of a writing voltage pulse and an erasing voltage pulse, writing and erasing are repeated alternately so that a pulse width is gradually decreased from a long pulse of approximately a few hundred ms which is a required minimum pulse for initialization to a desired pulse width for data writing and erasing.

More specifically, the first pair of a writing voltage pulse PW1 and an erasing voltage pulse PE1 is set to be a long pulse having a width o approximately a few hundred ms. The second pair of a writing voltage pulse PW2 and an erasing voltage pulse PE2 is set to have a pulse width slightly shorter than the pulse width of the first pair of the pulse PW1 and the PE1. The third pair of a writing voltage pulse PW3 and an erasing voltage pulse PE3 is set to have a further shorter pulse width. Then, the fourth pair of a writing voltage pulse PW4 and an erasing voltage pulse PE4 is set to have the same pulse width as a pulse width of voltage pulses for subsequent data writing and erasing.

Therefore, Patent Literature 2 discloses that, by performing initialization (forming) to change a pulse width from a long pulse width to a short pulse width after application of voltage having the long pulse width, it is possible to perform data writing and erasing at a high speed with the short pulse width.

CITATION LIST

Patent Literature

[PTL 1] Japanese Unexamined Patent Application Publication No. 2006-351780 (FIG. 1)
[PTL 2] Japanese Unexamined Patent Application Publication No. 2007-4873 (FIG. 6)
[PTL 3] International Publication No. WO 2008/149484
[PTL 4] International Publication No. WO 2009/050833

Non Patent Literature

[NPL 1] I. G. Baek et al., IEDM 2004, p. 587 (FIG. 5(b))

SUMMARY OF INVENTION

Technical Problem

Here, the conventional technologies disclosed in Background Art are summarized. Non-Patent Literature 1 discloses the following. Some kinds of transition metal oxides show nonvolatile variable change phenomenon due to application of electrical pulse. Non-Patent Literature 1 also discloses that the transition metal oxides are in a considerably high resistance state after manufacturing, and their resistance can be changed by initialization (forming) where a relatively high voltage which is considered to form a conducting path is applied.

Patent Literature 1 discloses that even a metal ion conductive variable resistance element made of a material that is not a transition metal oxide also needs application of a relatively high voltage, and that the initialization (forming) processing enables the same resistance change caused by electrical pulse. Patent Literature 2 discloses that, prior to the first data writing to a variable resistance element, as initialization (forming) processing, not only the first voltage application having a long pulse width but also continuous voltage application with gradually shortening pulse width are performed on the variable resistance element in initialization so as to perform forming, so that resistance change can be performed even by a short pulse.

Thus, the prior arts disclose that a variable resistance nonvolatile memory element is capable of having a simple structure in which some materials such as transition metal oxides are sandwiched between two electrodes. The prior arts also disclose that a forming using a high voltage is initially (immediately after manufacturing) performed for the nonvolatile memory element so as to form a conducting path, so that stable control of a change between a low resistance state (LR) and a high resistance state (HR) can be achieved afterwards only by applying electrical signals having a short pulse, and these resulting states are nonvolatile. If these variable resistance nonvolatile memory elements are used as memory cells, it would be possible to offer memories capable of being operated at a higher speed and manufactured at a lower cost more than commonly-known nonvolatile memories such as Flash memory.

In consideration of the above disclosers, the inventors of the present application use tantalum (Ta) that is one of transition metals for an example of a material of variable resistance nonvolatile memory devices, in order to provide a variable resistance nonvolatile memory device including memory cells each having a variable resistance layer comprising the oxygen-deficient oxide (tantalum oxide, hereinafter, referred to as a "Ta oxide") and a switch element.

Here, the oxygen-deficient oxide refers to an oxide having an oxygen content amount that is less than that of an oxide having a stoichiometric composition. Preparing for explaining problems of the conventional technologies, the following describes some properties obtained by experiments regarding a variable resistance element having a variable resistance layer comprising an oxygen-deficient Ta oxide (TaO$_x$, where 0<x<2.5). It should be noted that the explanation is disclosed in detail in the relevant patents, Patent Literatures 3 and 4.

FIG. 29 is a pattern view of a structure (structure for one bit) of a 1T1R memory cell using a conventional variable resistance element. As shown in FIG. 29, the 1T1R memory cell generally includes an NMOS transistor and a variable resistance element 100.

As shown in FIG. 29, the variable resistance element 100 includes a lower electrode 100a, a variable resistance layer 100b, and an upper electrode 100c which are stacked on one by one. The variable resistance layer 100b includes a first transition metal oxide layer 100b-1 and a second transition metal oxide layer 100b-2 stacked on the layer 100b-1. The first transition metal oxide layer (here, TaO$_x$, where 0<x<2.5) 100b-1 comprises the above-described oxygen-deficient transition metal oxide (here, Ta oxide) and has low resistance. The second transition metal oxide layer (here, TaO$_y$, where x<y) 100b-2 comprises the above-described oxygen-deficient transition metal oxide (here, Ta oxide) and has high resistance. A lower electrode terminal B (105) extends from the lower electrode 100a, and an upper electrode terminal A extends form the upper electrode 100c. An NMOS transistor 104 serving as a selection transistor (namely, an example of a switch element) has a gate terminal G. The lower electrode terminal B (105) of the variable resistance element 100 is connected in series with a source or drain (N$^+$ diffusion) region of the NMOS transistor 104. Another drain or source (N$^+$ diffusion) region not connected to the variable resistance element 100 extends from the NMOS transistor 104 as the lower electrode side terminal C. The substrate terminal is connected to a ground potential. Here, the second transition metal oxide layer 100b-2 having a high resistance is arranged close to the upper electrode terminal A arranged opposite to the NMOS transistor 104.

Here, as disclosed in Patent Literature 4 that is a relevant patent of the present invention, the upper electrode 100c is made of, for example, platinum (Pt), iridium (Ir), palladium (Pd), silver (Ag), nickel (Ni), tungsten (W), copper (Cu), or the like. It is disclosed that resistance change is likely to occur near an interface between (a) an electrode material having a standard electrode potential higher than that of Ta that is a constituent element of the variable resistance layer 100b and (b) the variable resistance layer, while resistance change is unlikely to occur at an interface between (c) an electrode material having a standard electrode potential lower than that of Ta and (b) the variable resistance layer. It is also disclosed that resistance change is more likely to occur as a difference between a standard electrode potential of the electrode material and a standard electrode potential of the metal included in the variable resistance layer is greater, while resistance change is less likely to occur as the difference is smaller. Here, in general, the standard electrode potential is one of indexes for indicating a likeliness of being oxidized. A greater value of the standard electrode potential indicates a less likeliness of being oxidized, while a smaller value indicates a more likeliness of being oxidized. In particular, it is desirable to use Pt or Ir, which has a high standard electrode potential, for electrodes so as to obtain good resistance changing.

However, in the above-described conventional variable resistance semiconductor memory device, there are problems that a forming voltage is varied depending on each of variable resistance elements included in a memory cell array, or that a forming voltage, which is initially applied to variable resistance elements to be in a state from which variable change starts, is high.

In order to solve the above problems, one non-limiting and exemplary embodiment of the present invention provides (a) a forming method of performing forming on a variable resistance nonvolatile memory element, by which a forming voltage can be set to lower than a conventional one, and variations of the forming voltage depending on each of variable resistance elements can be prevented, and (b) a variable resistance nonvolatile memory device that performs the forming method.

Solution to Problem

In one general aspect, the techniques disclosed here feature; a forming method of performing forming on a variable resistance nonvolatile memory element, by applying a voltage pulse to a memory cell in which the variable resistance nonvolatile memory element is connected in series with a switch element, so as to change a resistance state of the variable resistance nonvolatile memory element from an initial state after manufacturing to a changeable state, the initial state having not yet been changed to the changeable state, and the changeable state being a state where the resistance state is reversibly changeable between a high resistance state and a low resistance state according to a polarity of an applied voltage pulse, the variable resistance nonvolatile memory element including: a first electrode connected to the switch element; a second electrode; and an oxygen-deficient transition metal oxide layer provided between the first electrode and the second electrode, the oxygen-deficient transition metal oxide layer including: a first transition metal oxide layer in contact with the first electrode; and a second transition metal oxide layer in contact with the second electrode, the second transition metal oxide layer having an oxygen deficient degree lower than an oxygen deficient degree of the first transition metal oxide layer, the variable resistance nonvolatile memory element having: characteristics by which the resistance state is changed to the low resistance state when a low resistance writing voltage pulse having a positive potential and equal to or higher than a first threshold voltage is applied to the first electrode with reference to the second electrode, and the resistance state is changed to the high resistance state when a high resistance writing voltage pulse having a positive potential and equal to or higher than a second threshold voltage is applied to the second electrode with reference to the first electrode; non-linear current-voltage characteristics in the initial state; and characteristics by which as a current flowing in the variable resistance nonvolatile memory element is increased in the initial state, a time period required for the forming is decreased in an exponential manner, and the forming method including: applying a first voltage pulse to the variable resistance nonvolatile memory element when the variable resistance nonvolatile memory element is in the initial state, the first voltage pulse (1) having (1-i) a positive potential at the second electrode with reference to the first electrode and an amplitude equal to or greater than an amplitude of a predetermined voltage higher than the second threshold voltage or (1-ii) a negative potential at the second electrode with reference to the first electrode and an amplitude equal to or greater than an amplitude of a predetermined voltage higher than the first threshold voltage, and the first voltage pulse (2) having a first pulse width; and determining whether or not the forming is successful by the applying of the first voltage pulse, wherein the applying of the first voltage pulse and the determining are repeated until it is determined in the determining that the forming is successful, and in the applying of the first voltage pulse in the repeating, a new first voltage pulse is applied to the variable resistance nonvolatile memory element, the new first voltage pulse having a pulse width longer than a pulse width of the first voltage pulse applied in the applying of the first voltage pulse which is performed immediately prior to the applying of the new first voltage pulse.

By the above method, in the forming, the first voltage pulse for the forming is applied, and if the forming is not successful, the new first voltage pulse is further applied. Therefore, the cumulative pulse application time period is increased to increase a probability of the forming success. Furthermore, since the pulse width of the new first voltage pulse is longer than the pulse width of the immediately-prior first voltage pulse, the cumulative pulse application time is increased at an accelerated rate. Therefore, the forming becomes successful within a time period shorter than that in the case where a voltage pulse having the same pulse width is repeatedly applied.

Here, it is also possible that in the applying of the first voltage pulse, as the first voltage pulse, a first positive voltage pulse is applied to the variable resistance nonvolatile memory element, the first positive voltage pulse (1) having an amplitude equal to or greater than an amplitude of the predetermined voltage having a positive potential at the second electrode with reference to the first electrode, and the first positive voltage pulse (2) having the first pulse width, and that in the determining, a first negative voltage pulse is applied to the variable resistance nonvolatile memory element, the first negative voltage pulse (1) having a voltage amplitude equal to or greater than a voltage amplitude of the low resistance writing voltage pulse, and the first negative voltage pulse (2) having a same polarity as a polarity of the low resistance writing voltage pulse, and after the applying of the first negative voltage pulse, it is determined whether or not the variable resistance nonvolatile memory element is in the low resistance state, so as to determine whether or not the forming is successful. By the above method, in the determining, a negative voltage pulse is applied to change the resistance state of the variable resistance nonvolatile memory element to a low resistance state, and then its resistance value is detected. Therefore, the detected resistance value of the variable resistance nonvolatile memory element after the forming success is lower than a resistance value in the case without application of the negative voltage pulse. As a result, it is possible to easily and correctly determine forming success.

It is desirable that in the applying of the first voltage pulse in the repeating, the new first voltage pulse is applied to the variable resistance nonvolatile memory element, the new first voltage pulse having the pulse width that is increased in an exponential manner from the pulse width of the first voltage pulse applied in the applying of the first voltage pulse which is performed immediately prior to the applying of the new first voltage pulse. It is also desirable that a pulse width of the first negative voltage pulse is equal to a pulse width of the low resistance writing voltage pulse.

It is further possible that the forming method further includes applying a second positive voltage pulse to the variable resistance nonvolatile memory element after the applying of the first negative voltage pulse in the determining, the second positive voltage pulse having a polarity, a voltage amplitude, and a pulse width which are equal to a polarity, the amplitude, and the first pulse width of the first positive voltage pulse, respectively, and that a pulse width of the first negative voltage pulse is longer than a pulse width of the low resistance writing voltage pulse. By the above method, the positive voltage pulse is applied again, or the pulse width of the negative voltage pulse is as short as the pulse width of the voltage pulse in the normal writing. Therefore, it is possible to prevent troubles that the resistance state of the variable resistance nonvolatile memory element is not changeable from a low resistance state due to the application of the negative voltage pulse.

In another general aspect, the techniques disclosed here feature; A variable resistance nonvolatile memory device including memory cells in each of which a variable resistance nonvolatile memory element is connected in series with a switch element, the variable resistance nonvolatile memory element including: a first electrode connected to the switch element; a second electrode; and an oxygen-deficient transition metal oxide layer provided between the first electrode and the second electrode, the oxygen-deficient transition metal oxide layer including: a first transition metal oxide layer in contact with the first electrode; and a second oxygen-deficient transition metal oxide layer in contact with the second electrode, the second oxygen-deficient transition metal oxide layer having an oxygen deficient degree lower than an oxygen deficient degree of the first transition metal oxide layer, the variable resistance nonvolatile memory element having: characteristics by which a resistance state of the variable resistance nonvolatile memory element is changed to the low resistance state when a low resistance writing voltage pulse having a positive voltage and equal to or higher than a first threshold voltage is applied to the first electrode with reference to the second electrode, and the resistance state is changed to a high resistance state when a high resistance writing voltage pulse having a positive voltage and equal to or higher than a second threshold voltage is applied to the second electrode with reference to the first electrode; non-linear current-voltage characteristics in an initial state after manufacturing where the resistance state has not yet been changed to a changeable state where the resistance state is reversibly changeable between the high resistance state and the low resistance state according to a polarity of an applied voltage pulse; and characteristics by which (i) when a voltage pulse of a voltage equal to or higher than a predetermined voltage is applied in the initial state and is kept being applied for a predetermined time period, forming occurs to change the resistance state from the initial state to the changeable state, and (ii) as a current flowing in the variable resistance nonvolatile memory element is increased, a time period required for the forming is decreased in an exponential manner, and the variable resistance nonvolatile memory device including: a memory cell array including the memory cells in each of which the variable resistance nonvolatile memory element is connected in series with the switch element; a selection unit configured to select at least one memory cell from the memory cell array; a forming power source unit configured to generate a forming voltage to perform the forming on the variable resistance nonvolatile memory element included in the at least one memory cell selected by the selection unit; a writing power source unit configured to generate a writing voltage to perform writing to change the resistance state of the variable resistance nonvolatile memory element included in the at least one memory cell selected by the selection unit from the high resistance state to the low resistance state or from the low resistance state to the high resistance state; a variable pulse width writing voltage pulse generation unit configured to generate a writing voltage pulse having a variable pulse width to change the resistance state of the variable resistance nonvolatile memory element to a desired state, when one of the forming and the writing is performed on the variable resistance nonvolatile memory element included in the at least one memory cell selected by the selection unit; and a reading unit including (a) a forming determination unit configured to determine whether or not the forming is successful on the variable resistance nonvolatile memory element included in the at least one memory cell selected by the selection unit and (b) a normal determination unit configured to determine whether or not the variable resistance nonvolatile memory element included in the at least one memory cell selected by the selection unit is in the high resistance state or in the low resistance state, wherein the variable pulse width writing voltage pulse generation unit is configured, for the forming on the variable resistance nonvolatile memory element, to apply a first voltage pulse to the variable resistance nonvolatile memory element, the first voltage pulse (1) having (1-i) a positive potential at the second electrode with reference to the first electrode and an amplitude equal to or greater than an amplitude of a predetermined voltage higher than the second threshold voltage or (1-ii) a negative potential at the second electrode with reference to the first electrode and an amplitude equal to or greater than an amplitude of a predetermined voltage higher than the first threshold voltage, and the first voltage pulse (2) having a first pulse width, the application by the variable pulse width writing voltage pulse generation unit and the determination by the forming determination unit are repeated until the forming determination unit determines that the forming is successful, and in the repetition, the variable pulse width writing voltage pulse generation unit is configured to apply a new first voltage pulse to the variable resistance nonvolatile memory element, the new first voltage pulse having a pulse width longer than a pulse width of the first voltage pulse applied immediately prior to the new first voltage pulse.

In still another general aspect, the techniques disclosed here feature; a variable resistance nonvolatile memory element connected in series with a switch element to form a memory cell, the variable resistance nonvolatile memory element including: a first electrode connected to the switch element; a second electrode; and an oxygen-deficient transition metal oxide layer provided between the first electrode and the second electrode, wherein the oxygen-deficient transition metal oxide layer includes: a first transition metal oxide layer in contact with the first electrode; and a second transition metal oxide layer in contact with the second electrode, the second transition metal oxide layer having an oxygen deficient degree lower than an oxygen deficient degree of the first transition metal oxide layer, and the variable resistance nonvolatile memory element has: characteristics by which a resistance state of the variable resistance nonvolatile memory element is changed to a low resistance state when a low resistance writing voltage pulse having a positive potential and equal to or higher than a first threshold voltage is applied to the first electrode with reference to the second electrode, and the resistance state is changed to a high resistance state when a high resistance writing voltage pulse having a positive potential and equal to or higher than a second threshold voltage is applied to the second electrode with reference to the first electrode; an initial state after manufacturing where the resistance state has not yet been changed to a changeable state where the resistance state is reversibly changeable between the high resistance state and the low resistance state according to a polarity of an applied voltage pulse; non-linear current-voltage characteristics in the initial state; characteristics by which (i) when a voltage pulse of a voltage equal to or higher than a predetermined voltage is applied in the initial state and is kept being applied for a predetermined time period, forming occurs, and (ii) as a current flowing in the variable resistance nonvolatile memory element is increased, a time period required for the forming is decreased in an exponential manner; and characteristics, in the forming, by which as a cumulative pulse application time period of at least one applied voltage pulse is increased, a probability that the forming is successful is increased.

Advantageous Effects of Invention (a) The forming method of performing forming on a variable resistance nonvolatile memory element and (b) the variable resistance nonvolatile memory device according to the present invention can set a forming voltage to be lower than a conventional one and prevent variations of the forming voltage depending on each of variable resistance elements. As a result, it is possible to perform forming on all memory cells having various forming characteristics, within a practical voltage range and without increasing an array area. As a result, high reliability and a smaller area can be achieved. Furthermore, application of a positive voltage pulse and application of a negative voltage pulse can be added only for a memory cell for which forming is necessary. As a result, it is possible to perform forming on the memory cell array at a high speed. In addition, after application of a positive voltage pulse for forming, a pulse width of a negative voltage pulse is set to be equal to a pulse width of a low resistance writing voltage pulse in normal data writing. It is therefore possible to prevent troubles that the resistance state of the variable resistance nonvolatile memory element is not changeable from a lower resistance state. As a result, a forming technique with a high reliability can be achieved and a yield can be improved.

BRIEF DESCRIPTION OF DRAWINGS

FIG. 1 is a flowchart of a forming flow for a 1T1R memory cell according to an embodiment of the present invention.

FIG. 2(a) is a circuit diagram of a memory cell for measuring a relationship between a cumulative pulse application time period and a resistance value of a variable resistance element for each bit in the case where forming is performed by continuous application of a positive voltage pulse. FIG. 2(b) is a graph plotting a result of the measurement.

FIG. 3 is a graph plotting resistance transition in the case where forming of a 1T1R memory cell is performed by the 1T1R memory forming flow according to the embodiment of the present invention.

FIG. 4 is a graph showing a relationship between (a) a voltage having a voltage pulse used in forming and (b) a cumulative pulse time required to the forming regarding the 1T1R memory cell, according to the embodiment of the present invention.

FIG. 5 is an operation point analysis graph for examining an operation point in the forming according to the embodiment of the present invention.

FIG. 6 is a graph plotting a relationship between an average forming time period and a forming current regarding a variable resistance nonvolatile memory device according to the embodiment of the present invention.

FIG. 7 is a graph plotting a relationship between a voltage Ve between variable resistance element terminals and a forming current according to the embodiment of the present invention.

FIG. 8 is a graph plotting I-V characteristics from an initial state of a 1T1R cell according to the embodiment of the present invention.

FIG. 9 is a graph plotting a dependency of a selection transistor gate width in a cumulative probability distribution of a forming voltage Vb of a variable resistance element (upper electrode Ir) according to the embodiment of the present invention.

FIG. 10 is a time chart showing a voltage waveform of a voltage pulse applied to a memory cell in forming and in normal data writing for a 1T1R memory cell according to the embodiment of the present invention.

FIG. 11 is a graph plotting resistance change characteristics in the case of positive/negative alternation pulse application to a 1T1R memory cell according to the embodiment of the present invention.

FIG. 12 is a time chart showing a voltage waveform of a voltage pulse applied to a memory cell in forming and in normal data writing for a 1T1R memory cell, as basic data for the embodiment of the present invention.

FIG. 13 is a graph for explaining troubles in resistance changes in the case of positive/negative alternation pulse application to a 1T1R memory cell, as basic data for the embodiment of the present invention.

FIG. 14 is a time chart showing a voltage waveform of a voltage pulse applied to a memory cell in forming and in normal data writing for a 1T1R memory cell according to a variation of the embodiment of the present invention.

FIG. 15 is a graph plotting resistance change characteristics in the case of positive/negative alternation pulse application to a 1T1R memory cell according to the embodiment of the present invention.

FIG. 16 is a block diagram of a variable resistance nonvolatile memory device according to an embodiment of the present invention.

FIG. 17 is a circuit diagram showing an example of a sense amplifier according to the embodiment of the present invention.

FIG. 18 is a diagram for explaining a sense amplifier determination level according to the embodiment of the present invention.

[FIG. 19] FIG. 19 is a table for explaining a setting voltage for each mode according to the embodiment of the present invention.

FIG. 20 is a flowchart of a pulse width step-up forming for the variable resistance nonvolatile memory device according to the embodiment of the present invention.

FIG. 21(a) to (c) is a time chart for explaining operation times of the variable resistance nonvolatile memory device according to the embodiment of the present invention.

FIG. 22 is a time chart for explaining forming timings of the variable resistance nonvolatile memory device according to the embodiment of the present invention.

FIG. 23 is a graph plotting cumulative forming rate distribution with respect to a cumulative pulse application time period regarding an array of the variable resistance nonvolatile memory device according to the embodiment of the present invention.

FIG. 24 is a graph plotting cumulative forming rate distribution with respect to a cumulative pulse application time period regarding an array of the variable resistance nonvolatile memory device, as basic data.

FIG. 25 is a characteristic graph plotting a transition metal oxide thickness dependency of a forming voltage for a conventional variable resistance nonvolatile memory.

FIG. 26 is a cross-sectional view of a memory cell of a conventional variable resistance nonvolatile memory element.

FIG. 27 is a graph plotting I-V characteristics from an initial state of a conventional variable resistance nonvolatile memory element.

FIG. 28 is a graph plotting an initialized pulse waveform of a conventional variable resistance nonvolatile memory element.

FIG. 29 is a schematic diagram showing a structure of a 1T1R memory cell using a conventional variable resistance element.

FIG. 30 is a graph plotting cumulative probability distribution of a forming voltage Vb of a conventional variable resistance element (upper electrode Pt).

FIG. 31 is a graph plotting cumulative probability distribution of a forming voltage Vb of a conventional variable resistance element (upper electrode Ir).

DESCRIPTION OF EMBODIMENTS

First, forming characteristics in the case where the upper electrode 100c in a 1T1R memory cell comprises platinum (Pt) and forming characteristics in the case where the upper electrode 100c comprises iridium (Ir) are described, and then their problems are explained.

Figure 29:
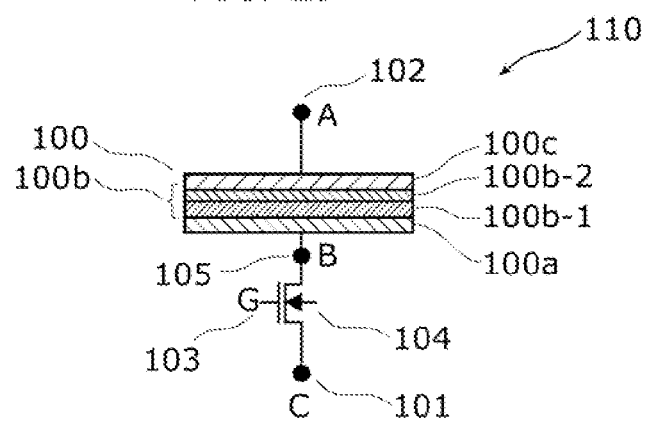
[FIG. 29]

Here, as shown in FIG. 29, the 1T1R memory cell includes variable resistance elements each of which includes a variable resistance layer. The variable resistance layer includes a first transition metal oxide layer 100b-1 (TaO$_x$, 0<x<2.5) and a second transition metal oxide layer 100b-2 (TaO$_y$, x<y).

In a sample used in this experiment, the variable resistance layer 100b has an area of 0.25 μm$^2$ (=0.5 μm×0.5 μm), and includes: the first transition metal oxide layer 100b-1 (TaO$_x$: x=1.54, thickness: 44.5 nm) in contact with the lower electrode 100a; and the second transition metal oxide layer 100b-2 (TaO$_y$: y=2.47, thickness: 5.5 nm) in contact with the upper electrode 100c. An NMOS transistor serving as a switch element has a gate width W of 0.44 μm, a gate length L of 0.18 μm, and a gate insulating film thickness Tox of 3.5 nm.

The second transition metal oxide layer 100b-2 (here, TaO$_{2.47}$) is formed by performing, prior to a process for manufacturing the upper electrode 100c, a plasma oxidation process on a surface of the first transition metal oxide layer 100b-1 (here, TaO$_{1.54}$) formed by sputtering. Therefore, the second transition metal oxide layer 100b-2 has a higher oxygen content percentage (in other words, a lower oxygen deficient) than that of the first transition metal oxide layer 100b-1 (here, TaO$_{1.54}$). This means that it has a structure with a considerably high resistance value (>1 MΩ). In order to cause resistance change, it is necessary to form a conducting path in the second transition metal oxide layer 100b-2 by first applying a certain forming voltage to the second transition metal oxide layer 100b-2.

Here, the forming is performed on the 1T1R memory cell 110 shown in FIG. 29 in the manner as described below. At the first step, while a voltage of 0 V is applied to the lower electrode side terminal C and a voltage of 3.3 V is applied to the gate terminal G, a forming voltage VPA having a pulse width of 50 ns is applied once to the upper electrode terminal A in a direction of changing the variable resistance element 100 to a high resistance state. At the second step, while a voltage of 0 V is applied to the upper electrode terminal A and a voltage of 3.3 V is applied to the gate terminal G, the same forming voltage VPA having the pulse width of 50 ns is applied once to the lower electrode side terminal C in a direction of changing the variable resistance element 100 to a low resistance state. At the third step, a voltage of 0 V is applied to the lower electrode side terminal C, a voltage of 1.8 V is applied to the gate terminal G, and a voltage of approximately 0.4 V is applied to the upper electrode side terminal A. Thereby, it is determined whether a current flowing in the 1T1R memory cell 110 is equal to or more than a predetermined current (in other words, in a low resistance state). As a result, it is possible to determine whether or not forming successfully occurs (hereinafter, expressed also as "is completed"). If it is determined that forming does not successfully occur, then the forming voltage VPA is increased by 0.1 V, and the same processing is repeated until the forming voltage VPA reaches 3.3 V at maximum.

As described above, after performing the forming by applying the voltage VPA in high resistance writing direction, the voltage VPA in low resistance writing direction is applied to change the variable resistance element 100 to a low resistance state. Therefore, a memory cell current in reading is increased to allow the forming success (completion) determination to be easily made.

Then, the flow of the forming is performed in a nonvolatile memory device in which a plurality of 1T1R memory cells 110 are arrayed in a matrix of 262,144 bits (256 Kbits).

It should be noted that this nonvolatile memory device is implemented as a known circuit performing the above processing. The main part of the nonvolatile memory device is not described in detail below but described later.

First, explanation is given for forming characteristics in the case where the upper electrode 100c in a 1T1R memory cell is made of an electrode material most of which is platinum (Pt) having a high standard electrode potential (in other words, the upper electrode 100c is formed to be likely to change resistance near an interface between the upper electrode and the variable resistance layer) and the lower electrode 100a is made of a tantalum nitride (TaN) having a low standard electrode potential (in other words, the lower electrode 100a is formed to be unlikely to change resistance near an interface between the lower electrode and the variable resistance layer).

Figure 30:
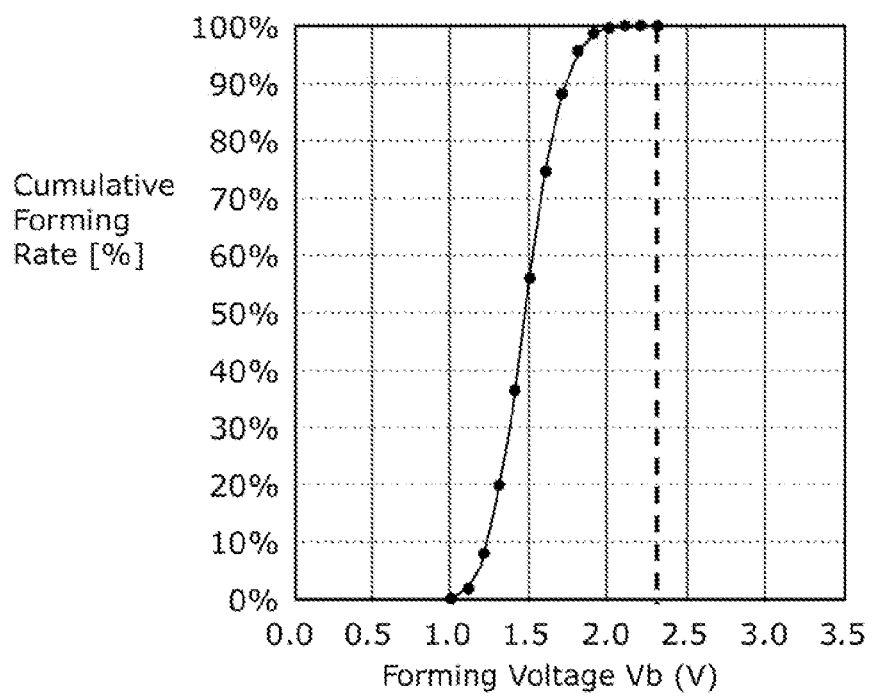
[FIG. 30]

FIG. 30 shows a graph plotting cumulative probability distribution of a voltage Vb by which forming for forming a conducting path in each memory cell is performed by applying voltages from a low voltage to a high voltage and forming is successful, in a nonvolatile memory device (with an array capacity of 256 Kbits) in which 1T1R memory cells, each of which has the variable resistance element 100 that includes the upper electrode 100c made of Pt and the variable resistance layer 100b made of oxygen-deficient tantalum oxide as shown in FIG. 29, are arranged. A horizontal axis indicates a forming voltage Vb (voltage determined as forming completion) of each memory cell in the case where a positive voltage pulse (with a pulse width of 50 ns) for applying a voltage higher than the lower electrode side terminal C is applied 1.0 V to 2.3 V into the upper electrode terminal A with reference to the lower electrode side terminal C, between the upper electrode terminal A and the lower electrode side terminal C of the memory cell shown in FIG. 29 (here, a gate voltage Vg=3.3 V). A vertical axis indicates a cumulative probability of forming success of a variable resistance element by the forming voltage Vb (here, a ratio of the variable resistance element for which forming has been completed to all variable resistance elements).

As described above, if the upper electrode 100c of the 1T1R memory cell 110 is made of platinum (Pt), the voltage is varied from 1.1 V to 2.3 V for each memory cell, but application of a predetermined forming voltage Vb (for example, 2.5 V) to a memory cell enables determination as to whether or not forming is possible for all bits of the array.

It is desirable that the platinum (Pt) layer included in the upper electrode 100c desirably has a thickness ranging from 1 nm to 23 nm, and is in physically contact with the variable resistance layer. It is more desirable that the platinum (Pt) layer has a thickness ranging from 1 nm to 10 nm. If the platinum (Pt) layer is not thin, migration occurs from platinum grain boundary, and protrusion is formed on a platinum electrode surface (interface between the platinum electrode and the variable resistance layer). If a voltage pulse is repeatedly applied to the variable resistance element having an electrode having such protrusion, electric field concentration would occur around the protrusion to destroy the variable resistance layer, which prohibits resistance change.

Next, explanation is given for forming characteristics in the case where the upper electrode 100c in a 1T1R memory cell 110 is made of an electrode material most of which is iridium (Ir) having a high standard electrode potential (in other words, the upper electrode 100c is formed to be likely to change resistance near an interface between the upper electrode and the variable resistance layer) and the lower electrode 100a is made of a tantalum nitride (TaN) having a low standard electrode potential (in other words, the lower electrode 100a is formed to be unlikely to change resistance near an interface between the lower electrode and the variable resistance layer).

Figure 31:
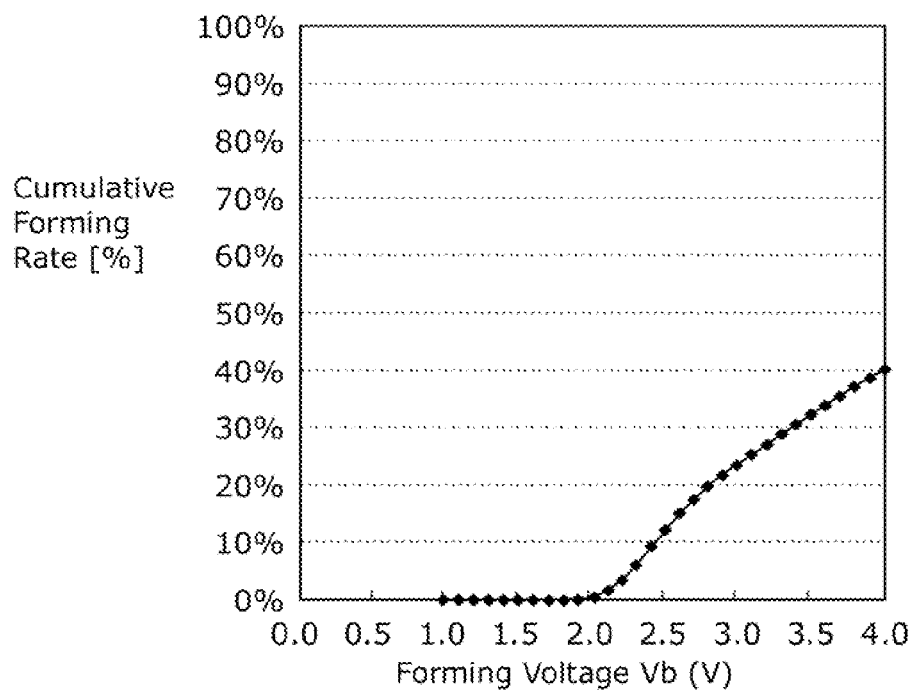
[FIG. 31]

FIG. 31 shows a graph plotting cumulative probability distribution of a voltage Vb by which forming for forming a conducting path in each memory cell is performed by applying voltages from a low voltage to a high voltage and forming is successful, in a 1T1R memory cell array (256 Kbits) having variable resistance elements 100 each of which has the upper electrode 100c made of Ir and the variable resistance layer 100b made of oxygen-deficient transition metal oxide (here, tantalum oxide) as shown in FIG. 29. The horizontal axis and the vertical axis are the same as described with reference to FIG. 30, so that the axises are not described in detail.

As shown in FIG. 31, in the above-described conventional forming method, even if the voltage is increased to 4 V at maximum, forming /has been performed only for approximately 40% of the array (256 Kbits). Therefore, there is a problem, in the 1T1R memory cell 110 using the upper electrode 100c made of Ir, that the array operation for recording data by resistance change ca be performed only for approximately 40% of bits. However, in the case of using the Ir electrode, there are advantages of less variation of characteristics after the forming and a high reliability. It should be noted that, as seen in FIG. 31, a cumulative forming ratio is gradually increased with respect to the forming voltage, and it is expected that application of higher voltage can provide forming to all memory cells. In order to achieve this, it is necessary to design corresponding to a structure for which forming with a considerably high voltage is possible. For example, it is possible to use transistors having a high pressure resistance. However, this makes it difficult to reduce a cell area, which prevents decrease of a cost.

In addition, depending on an electrode material of the upper electrode 100c, it is considered that the conventional forming method sometimes cannot perform forming completely, and cannot steadily change resistance for all of bits.

However, if the upper electrode 100c is made of Ir, variation of initial resistance prior to forming is considerably less than that in the case where the upper electrode 100c is made of Pt. If forming can be appropriately performed on a memory cell using Ir, it would be possible to reduce the variation of resistance change characteristics and improve a reliability for the memory cell.

In general, in semiconductor memory devices, if a yield or reliability is to be improved, processing is to be refined, or a memory capacity is to be increased, an approach is applied to select an optimum by comprehensively experimenting more appropriate materials. However, the approach also results in a problem of limiting a flexibility of material selection due to the above-described reason.

In view of the above situations, the inventors of the present invention have examined a new forming method for variable resistance elements and a variable resistance nonvolatile memory device performing the method, which allows all bits in a memory cell array to be formed by using practical voltage pulse.

Next, the following describes the embodiment according to the present invention. For the sake of simplifying the explanation, the description is first given for some pieces of basic data, such as a forming method focused on one bit in a 1T1R memory cell using Ir electrodes as a basic part of the present invention.

The 1T1R memory cell used in the present invention has the same structure as described with reference to FIG. 29. In particular, the upper electrode 100c in the 1T1R memory cell is mainly made of iridium (Ir). It should be noted that each of the lower electrode 100a, the variable resistance layer 100b, the first transition metal oxide layer 100b-1, the second transition metal oxide layer 100b-2, and the upper electrode 100c in the variable resistance element 100 correspond to a first electrode, a transition metal oxide layer, a first transition metal oxide layer, a second transition metal oxide layer, and a second electrode, respectively, of the variable resistance element in the forming method according to the present invention.

In the case of the above structure, after forming, in a state where resistance changing is possible, as described earlier, if a voltage (a low resistance writing voltage pulse) equal to or higher than a predetermined voltage (for example, the first threshold voltage) is applied to the lower electrode terminal 101 with reference to the upper electrode terminal 102, the variable resistance element 100 is changed to a low resistance state. On the other hand, if a value (a high resistance writing voltage pulse) equal to or higher than a different predetermined voltage (for example, the second threshold voltage) is applied to the upper electrode terminal 102 with reference to the lower electrode terminal 101, the variable resistance element 100 is changed to a high resistance state.

Figure 1:
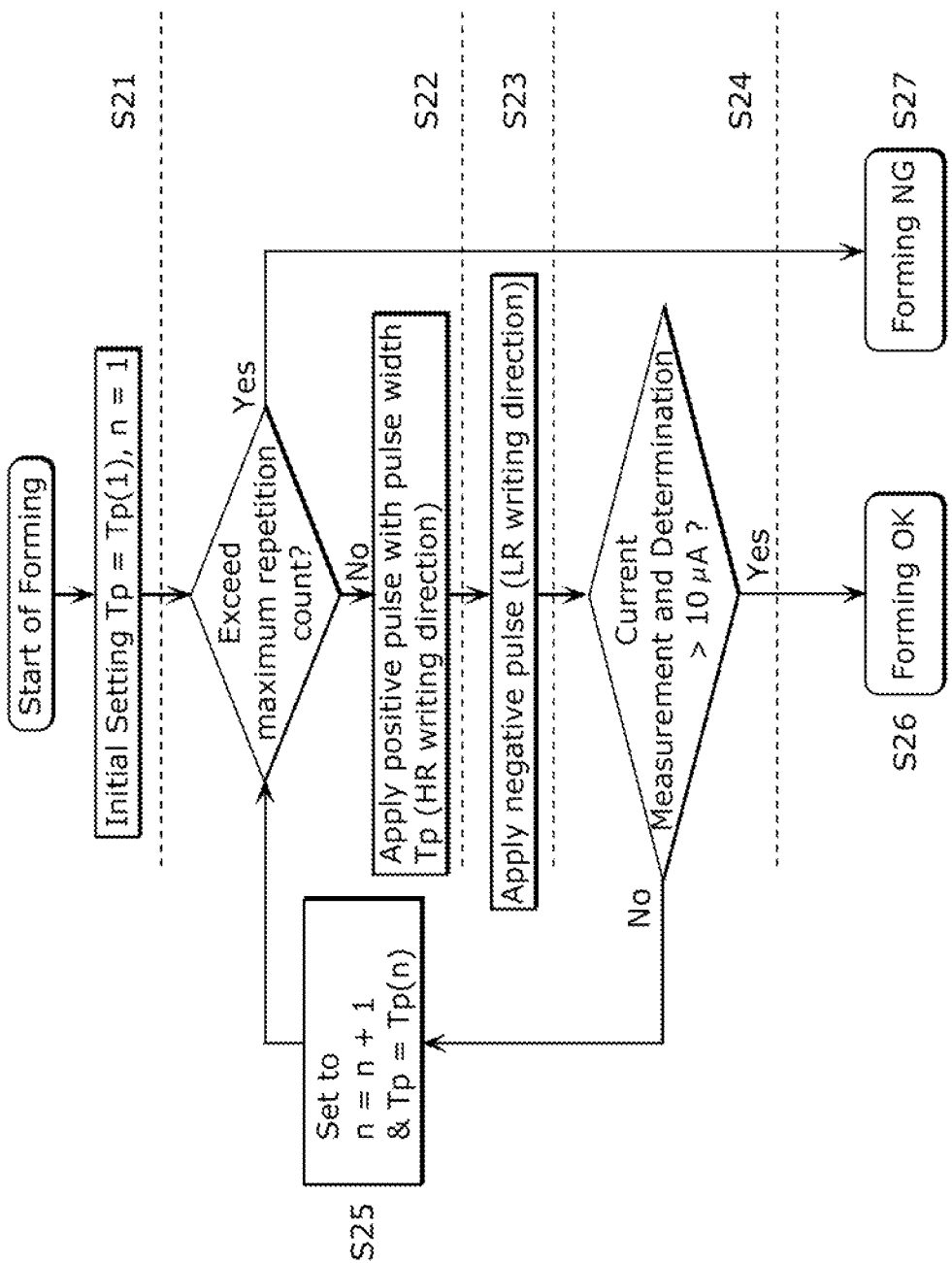
[FIG. 1]

FIG. 1 is a flowchart of the forming for the 1T1R memory cell according to the embodiment of the present invention, and includes Steps S21 to S27. More specifically, this figure shows steps of a forming method of applying voltage pulses to a memory cell in which a variable resistance element 100 is connected in series to a switch element, thereby changing a state of the variable resistance element 100 from (a) an initial state after manufacturing where the state has not yet to be a changeable state where the stage is changeable between a high resistance state and a low resistance state depending on a polarity of an applied voltage pulse, to (b) the changeable state. It should be noted that the following describes forming by a positive voltage pulse (application of a positive voltage pulse to an upper electrode with reference to a lower electrode), but the forming may use a negative voltage pulse (application of a negative voltage pulse to the upper electrode with reference to the lower electrode).

At Step S21, initial setting is performed. At this Step S21, the variable resistance element 100 is in an initial state after completion of manufacturing the 1T1R memory cell, which is considerably high resistance state of 1 MΩ or higher, where application of a normal resistance change pulse cannot cause resistance change. Furthermore, as the initial setting, a forming pulse width Tp is set to Tp(1) (=50 ns), and the number of repetitions of the forming (forming repetition count) n is set to 1.

Step S22 is a first voltage application step. Here, a pulse with a pulse width of 50 ns (variable) and a pulse of 3.3 V (a positive forming pulse in a high resistance (HR) writing direction, namely, the first voltage pulse (here, the first positive voltage pulse)) is applied once to the upper electrode terminal 102 with reference to the lower electrode terminal 101. Here, a voltage at the gate terminal 103 is 3.3 V (transistor, ON-state).

Step S23 is the first half of the determination step. Here, a pulse with a pulse width of 50 ns (constant) and a pulse of 3.3 V (a negative pulse in LR writing direction, namely, the first negative voltage pulse having a voltage amplitude equal to or greater than that of a LR writing voltage pulse and having the same polarity as that of the LR writing voltage pulse) is applied once to the lower electrode terminal 101 with reference to the upper electrode terminal 102. Here, a voltage at the gate terminal 103 is 3.3 V (transistor, ON-state).

Step S24 is the second half of the determination step. Here, a current measurement source is connected to the lower electrode terminal 101 (or the upper electrode terminal 102) with reference to the upper electrode terminal 102 (or the lower electrode terminal 101), and a current flowing from the lower electrode terminal 101 (or the upper electrode terminal 102) to the upper electrode terminal 102 (or the lower electrode terminal 101) by application of a read voltage (for example, 0.4 V) is measured. Here, a voltage at the gate terminal 103 is 3.3 V. Then, if the read current has a value greater than the reference value (for example, 10 µA) (in other words, if it is determined that the variable resistance element 100 is in a low resistance state), it is determined that the forming is successful and the forming flow is ended (S26).

On the other hand, if the read current has a value smaller than 10 µA, it is determined that the forming has not yet been completed (not successful), and the processing proceeds to Step S25 to change the applied pulse width to Tp(2) (here, the pulse width is increased by 50 ns to be 100 ns) and increment the forming repetition count, and the processing returns to Step S22 again (in other words, a new first voltage pulse (here, the first positive voltage pulse)) is applied). Then, until it is determined at Step S24 that forming is successful, the pulse width is gradually increased to a predetermined pulse width according to the forming repetition count n as seen in the following table, and such increasing is repeated.

TABLE 1

| Tp(n) | Pulse Width |
|---|---|
| Tp(1) | 50 ns |
| Tp(2) | 100 ns |
| Tp(3) | 200 ns |
| Tp(4) | 500 ns |
| Tp(5) | 1 µs |
| Tp(6) | 5 µs |
| Tp(7) | 10 µs |
| Tp(8) | 50 µs |
| Tp(9) | 100 µs |
| Tp(10) | 500 µs |
| Tp(11) | 1 ms |
| Tp(12) | 5 ms |
| Tp(13) | 10 ms |

Moreover, if it is not determined at Step S24 that forming is successful although a pulse of a maximum 10 ms is applied (here, if the forming repetition count reaches a maximum (a forming repetition count corresponding to a pulse width of 10 ms)), then it is determined that a target memory cell is a defective cell for which forming, namely, resistance changing, cannot be performed (S27).

It should be noted that at Step S22, the predetermined positive voltage (in HR writing direction) is applied to the upper electrode terminal 102. The HR writing direction is used because it corresponds to a direction of producing smaller substrate bias effects of the NMOS transistor 104, so that a driving current of the transistor in the forming is increased. More specifically, by applying a positive voltage to the upper electrode terminal 102, the source of the NMOS transistor 104 has almost the same potential as that of the lower electrode side terminal C as the reference potential, so that the substrate bias effects can be prevented. Therefore, in the NMOS transistor 104, the current driving performance in applying a positive voltage to the upper electrode terminal 102 is greater than the current driving performance in applying a negative voltage to the upper electrode terminal 102.

Here, changing of a variable resistance element to a high resistance state is referred to also as "HR writing", and changing of a variable resistance element to a low resistance state is referred to also as "LR writing".

For the same reasons, a voltage to the gate terminal 103 is also set to be higher than a voltage in normal use.

Furthermore, at Step S23, on the contrary, a predetermined positive voltage is applied to the lower electrode terminal 101 (in LR writing direction). It is determined at Step S24 whether or not the forming is successful, and the forming completion state at Step S22 is set to a high resistance state, approximately 100 kΩ. This state is lower than the initial state (approximately 1 MΩ or higher) by approximately one digit. For easier and speedier determination, it is desirable that the variable resistance element 100 is in a lower resistance state. Therefore, at Step S23, the variable resistance element 100 is temporarily changed to a low resistance state. If the forming is not successful at Step S22, then the variable resistance element 100 is kept in the initial state that is a considerably high resistance state even at Step S23.

It should be noted that the voltage at the gate terminal 103 is set to the same 3.3 V as that at Step S22, in order to reduce a time loss for voltage switching. If there is no specific problem, it is also possible to switch it to a voltage for normal resistance changing, such as 2.4 V. As long as it is possible to determine the initial state and the state after forming completion of the variable resistance element (a difference of approximately one digit between their resistance values) as described previously, Step S23 is not essential in the forming method according to the present invention.

It should also be noted that at Step S24, the current measurement is performed at the low voltage of 0.4 V. This is to prevent influent of disturbing a writing state (in other words, prevent that the resistance state of the variable resistance element 100 is changed). Furthermore, the resistance change characteristics of the variable resistance element 100 immediately after forming has a tendency of a small change width. Therefore, as the reference value of the read current, 10 µA corresponding to a memory cell current closer to a high resistance state than an intermediate value between a high resistance state and a low resistance state in normal resistance changing. It should also be noted that the measurement of the memory cell current is performed in the same direction as that at Step S23 by setting a ground voltage for the upper electrode terminal 102, in order to reduce a time loss for voltage switching. If there is no specific problem, it is also possible to make the determination in an opposite direction. It should also be noted that also at Step S24, the voltage at the gate terminal 103 is set to be the same 3.3 V as that at Step S23, in order also to reduce a time loss for voltage switching. If there is no specific problem, it is also possible to switch it to the voltage for normal reading, such as 2.4 V.

It should also be noted that for the applied pulse at Step S22 as shown in the above-presented Table 1, it is possible to appropriately determine a pulse width in starting the pulse application, a pulse width in ending the pulse application, and an interval between them. More specifically, for incrementing the forming repetition count n, it is possible to set a pulse width so that the pulse width is increased in an exponential manner, in a proportional manner, or in a mixed manner of the exponential and proportional manners as shown in the above-presented Table 1. By increasing a pulse width in an exponential manner, a cumulative pulse application time period is increased at an accelerated rate according to forming repetitions, which can complete forming in a shorter time period in comparison to the case of repetitions of positive voltage pulse application with the same pulse width. If a pulse width is set so that the pulse width is increased proportionally when the forming repetition count n is small (the pulse width is short) as shown in the above-presented Table 1, and the pulse width is increased in the exponential manner when the forming repetition count n is large, it is possible to prevent that excess forming pulse application to a memory cell that is likely to be formed, and to complete forming in a shorter time period.

Figure 2:
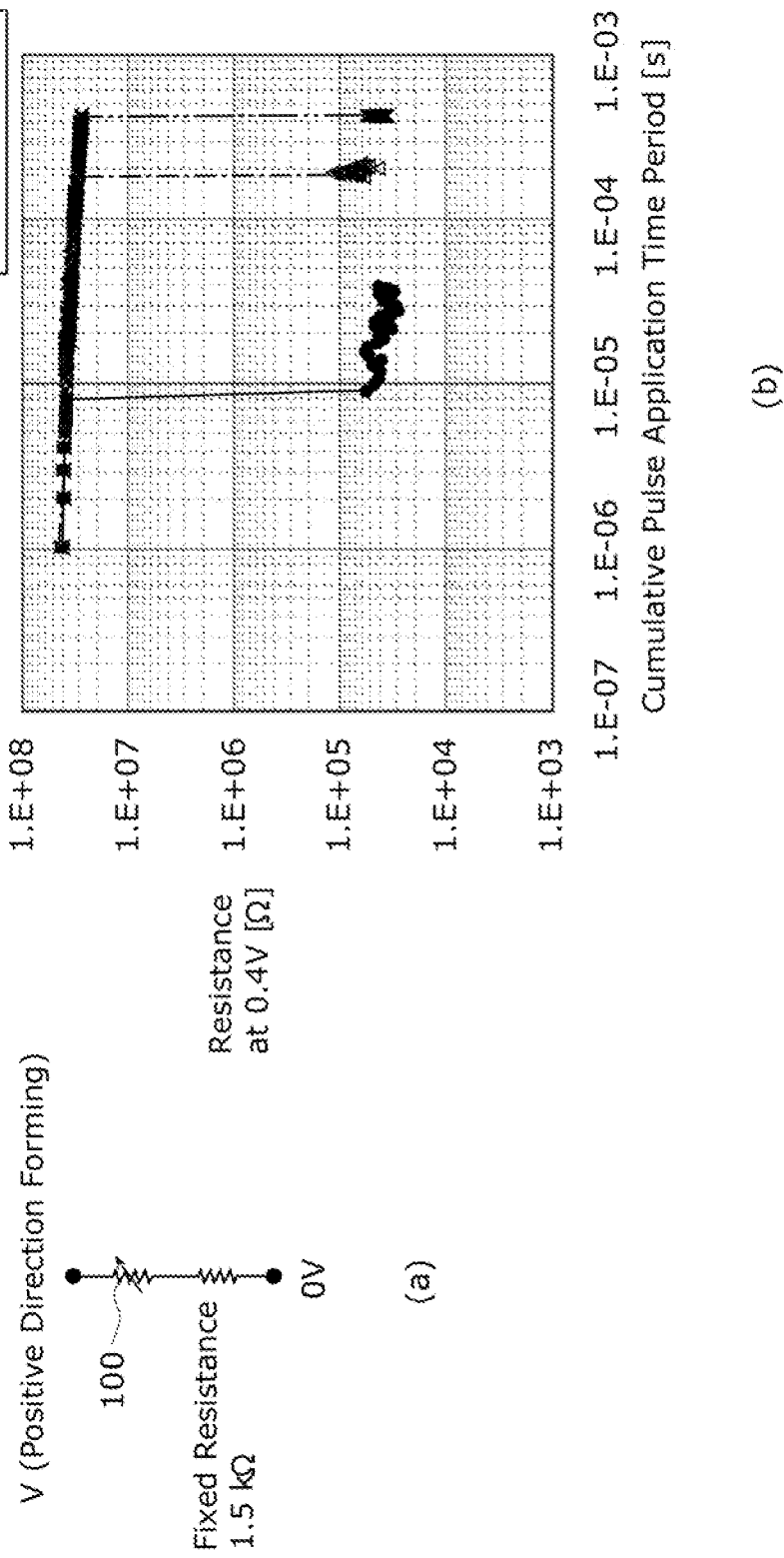
[FIG. 2]

FIG. 2(a) is a circuit diagram of a memory cell for measuring a relationship between a cumulative pulse application time period and a resistance value of a variable resistance element 100 for each bit in the case where forming is performed by continuous application of a positive voltage pulse. FIG. 2(b) is a graph plotting a result of the measurement. Here, plotted is a relationship between resistance values of the three memory cells and the cumulative pulse application time period n when forming is tried by applying a positive voltage pulse (pulse width=1 µs) for forming is applied to three memory cells. In each of the three memory cells, the variable resistance element 100 is connected in series to a fixed resistance (1.5 kΩ). The forming is performed basically according to the forming flow shown in FIG. 1. However, the forming does not include the negative voltage pulse application at Step S23. In addition, in the forming, the determination current at Step S24 is changed to 1 µA because it is necessary to compare the determination current at Step S24 to the high resistance state and the initial state (approximately 1 MΩ or higher). Here, the cumulative pulse application time period in the horizontal axis is a cumulative application time period of positive voltage pulses for forming which are applied to the variable resistance element 100 (a total time period of pulse widths). Moreover, here, for convenience of measurement, a positive voltage pulse (pulse width=1 µs) is kept being applied even after completion of forming. As seen in FIG. 2(b), depending on each of the variable resistance elements 100, a cumulative application time period required for forming is varied by one digit or more.

Figure 3:
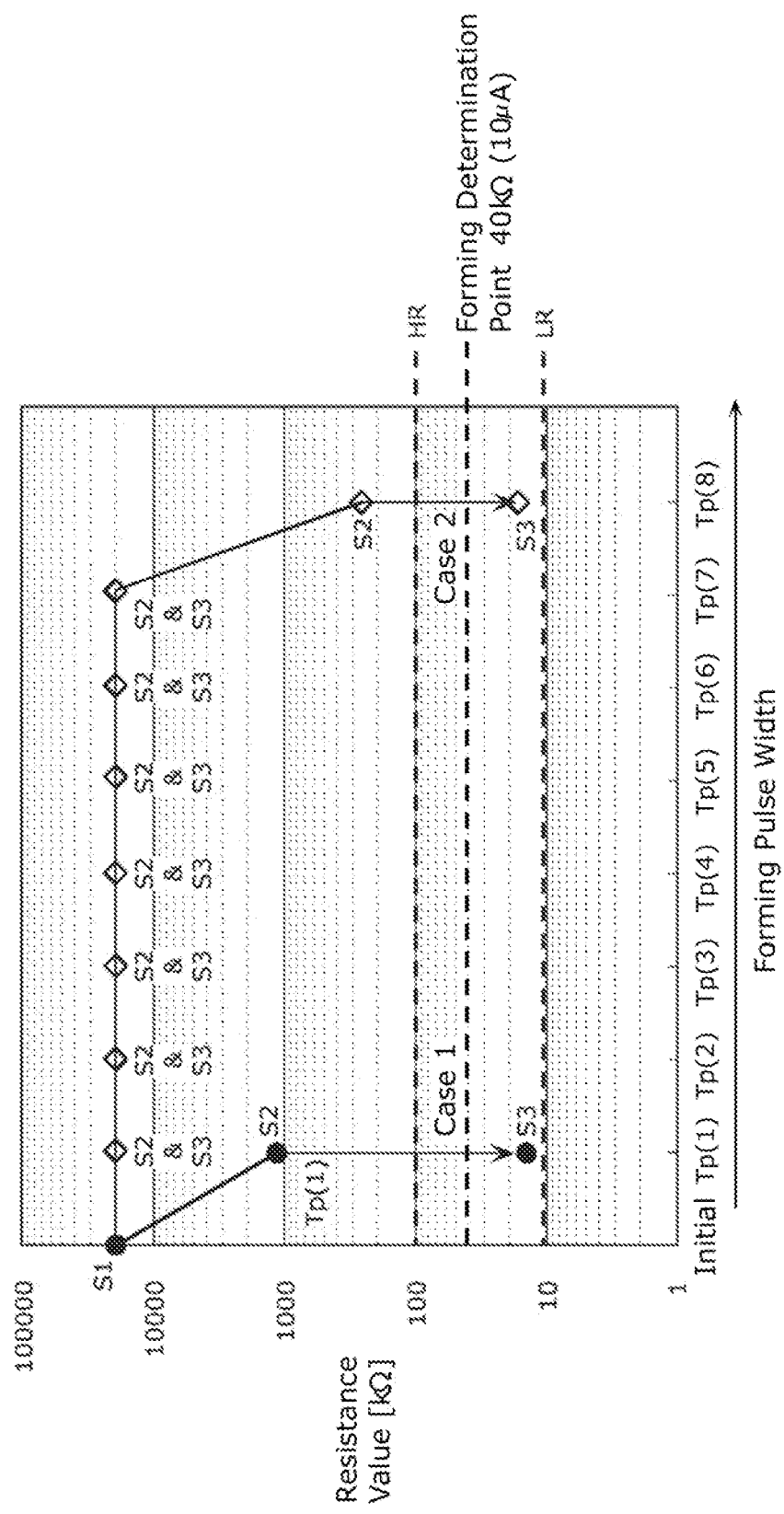
[FIG. 3]

FIG. 3 is a graph plotting resistance transition of the variable resistance element 100 in the case where forming of a 1T1R memory cell is performed according to the forming flow for the above-described 1T1R memory cell.

Here, results of performing forming on a 1T1R memory cell according to the steps of the flow shown in FIG. 1 are described with reference to FIG. 3.

The description is given for two example cases which are: Case 1: the case where it is determined that forming is completed (successful) with the first pulse width Tp(1) of 50 nm; and Case 2: the case where it is determined that forming is completed with the eighth pulse width Tp(8) of 50 µs.

Here, at Step S21 which is in the initial state after manufacturing, in each of the cases, the variable resistance element 100 is in a considerably high resistance state S1 much higher than 20 MΩ that is a measurement limit of a measurement device.

In the case 1, at first step S22, forming with the pulse width Tp(1) of 50 ns is performed on the variable resistance element 100. That is, the variable resistance element 100 is changed from the state S1 to a state S2 (black circle).

Since Step S22 is pulse application in HR writing direction, the variable resistance element 100 is changed at the forming to a high resistance state (approximately 1 MΩ, namely, the state S2 (black circle).

On the other hand, Step S23 is pulse application in LR writing direction. If forming is completed at Step S22, the variable resistance element 100 is changed to a low resistance state S3 (black circle).

Finally, at Step S24, the current measurement source of 0.4 V is connected to measure a current flowing from the lower electrode terminal 101 to the upper electrode terminal 102 of the 1T1R memory cell. However, the variable resistance element 100 is changed to the low resistance state S3 (black circle) at Step S23, a large current of approximately 29 μA is detected. This means that forming has been performed with the pulse width of 50 ns at Step S22.

Next, the case 2 is described.

At step S22, forming fails by pulse application from the first pulse application to the seventh pulse application using Tp(1) of 50 ns, Tp(2) of 100 ns, Tp(3) of 200 ns, Tp(4) of 500 ns, Tp(5) of 1 μs, Tp(6) of 5 μs, and Tp(7) of 10 μs. Therefore, with any pulse width, the variable resistance element 100 is in a considerably high resistance state (S2 (white squares) from Tp(1) to Tp(7)) exceeding the measurement limit of 20 MΩ, which is the same state as the initial state.

Although pulse application in LR writing direction is performed at Step S23, forming has not yet been completed at Step S23. Therefore, resistance change is not performed and the variable resistance element 100 is in a considerably high resistance state (S3 (white squares) from Tp(1) to Tp(7)) exceeding the measurement limit of 20 MΩ, which is the same state as the initial state.

Therefore, in the current measurement at Step S24, a current hardly flows.

On the other hand, at Step S22 in the eighth pulse application, forming with a pulse width Tp(8) of 50 μs is performed on the variable resistance element 100 and the variable resistance element 100 is changed to a high resistance state (approximately 260 kΩ, namely, S2 (white square) at Tp(8)).

Since forming is completed by the eighth pulse application at Step S22, then at Step S23, the variable resistance element 100 is changed to a low resistance state (S3 (white square) at Tp(8)).

Since the variable resistance element 100 is changed to the low resistance state at Step S23, then at Step S24, a large current of approximately 24 μA is detected so as to determine that forming is performed with a pulse width of 50 μs at Step 22 in the eighth pulse application. In this case, the cumulative pulse width of approximately 67 μs has been applied.

As described above, as shown in the example where the upper electrode 100c is made of iridium (Ir), even if forming is not performed completely in the known method of applying a predetermined voltage, it is possible to perform forming by appropriately adjusting a cumulative pulse time of the forming.

Here, based on some of experimental data, the description is given for basic characteristics of forming according to the embodiment of the present invention in the case where the upper electrode 100c is made of iridium (Ir).

Figure 4:
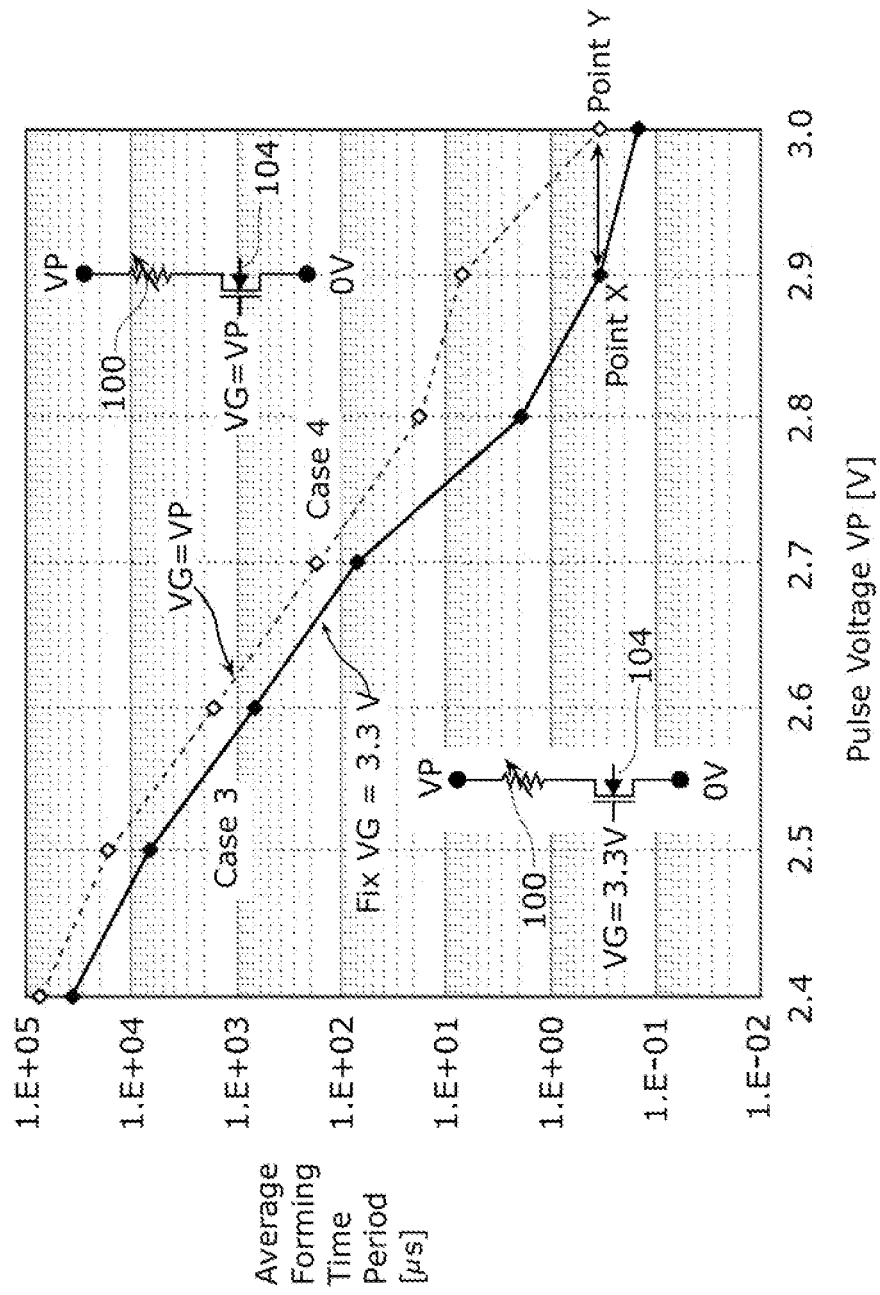
[FIG. 4]

FIG. 4 shows measurement of a relationship between (a) a voltage VP having a voltage pulse used in forming and (b) an average forming time period (average forming time period) required for the forming regarding the 1T1R memory cell shown in FIG. 29.

The measurement is performed under two conditions for a gate voltage of the NMOS transistor 104, in order to examine a relationship between a driving current amount and the forming time period of the NMOS transistor 104.

In the measurement, a variable resistance nonvolatile memory device including a memory cell array in which a plurality of 1T1R memory cells of 256 Kbits shown in FIG. 29 are arranged is used, and forming is performed by varying a voltage of a voltage pulse and a gate voltage for each region of 256 Kbits according to the forming flow shown in FIG. 1. In FIG. 4, for each region of 256 Kbits, the vertical axis indicates an average value (referred to as an "average forming time period") of a cumulative pulse time required to perform forming on each bit in a target region, and the horizontal axis indicates a voltage VP of a corresponding voltage pulse.

It should be noted that a structure of the variable resistance nonvolatile memory device used in the measurement and the detailed operation method are described later, but will be explained later in the description for the variable resistance nonvolatile memory device.

In FIG. 4, a solid line shows characteristics of the case (case 3) where the gate voltage VG is fixed to 3.3 V, and a broken line shows characteristics of the case (case 4) where the gate voltage VG and the voltage VP of the voltage pulse are changed in cooperation with each other.

In any of the cases, it is seen that the average forming time period is changed in an exponential manner with respect to the voltage VP of the voltage pulse. Furthermore, in the case 4 except the situation of VG=3.3 V, the gate voltage is lower than that in the case 3 so that a driving current of the NMOS transistor 104 is low. Even at the voltage VP with the same voltage pulse, a current flowing in the variable resistance element 100 in forming is small. As a result, it is shown that the forming time period in the case 4 is longer than that in the case 3.

In the meanwhile, if points at different voltages VP of voltage pulses are observed as having the same forming time period, it is considered that the same forming current (current flowing in forming) flows at these points.

For example, in FIG. 4, each of an average forming time period of a point X in the case 3 (where the gate voltage VG is 3.3 V, and the voltage VP of the voltage pulse is 2.9 V) and an average forming time period of a point Y in the case 4 (where each of the gate voltage VG and the voltage VP of the voltage pulse is 3.0 V) is the same 0.35 μs. The above situation is considered that both in the forming at the point X and in the forming at the point Y, the same forming drive current flows in the variable resistance element 100, and the same voltage Ve is applied between the terminals A and B of the variable resistance element 100, so that the same phenomenon occurs.

Figure 5:
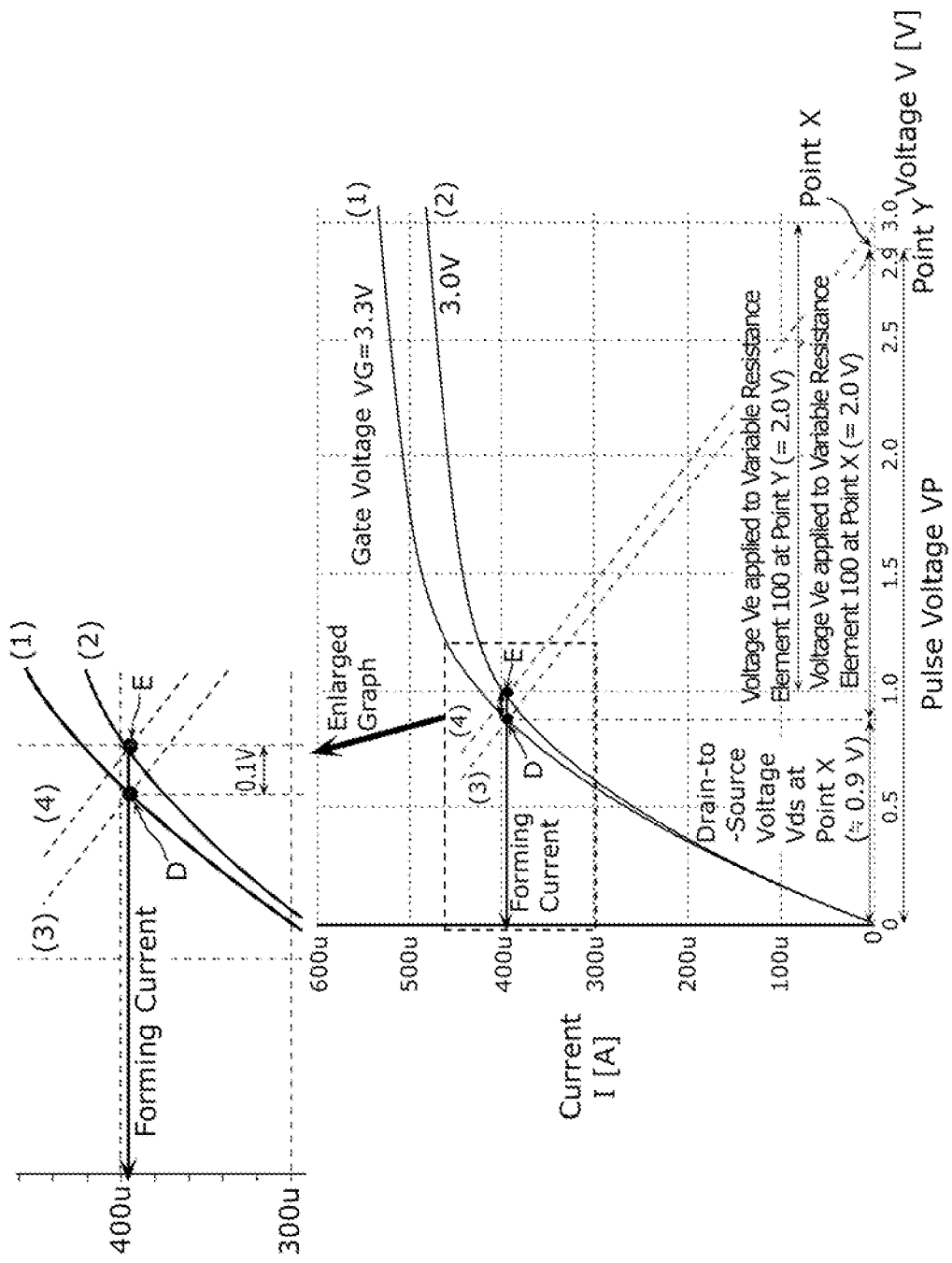
[FIG. 5]

FIG. 5 is an operation point analysis graph for examining operation points in the forming at the point X and in the forming at the point Y in FIG. 4.

Here, a curve (1) shows static characteristics of the NMOS transistor 104 in the case where the gate voltage VG corresponding to the point X is 3.3 V, and a curve (2) shows static characteristics of the NMOS transistor 104 in the case where the gate voltage VG corresponding to the point Y is 3.0 V. In addition, a straight line (3) shows load characteristics of the variable resistance element 100 which correspond to the point X, a straight line (4), which has the same slope as that of the straight line (3), shows load characteristics of the variable resistance element 100 which correspond to the point Y. Respective crosspoints between the static characteristics and the load characteristics of the NMOS transistor 104 and properties are shown as a D point and an E point. The D point and the E point correspond to operation points of the NMOS transistor 104 and the variable resistance element 100 in forming.

Here, the straight lines (3) and (4) are determined in the following manner. More specifically, it is considered that the same voltage Ve between terminals of the variable resistance element 100 is applied at each of the points X and Y, and that the same current flows at each of the points X and Y. In other words, the graph is plotted by adjusting the slopes of the straight lines (3) and (4) so that the points D and E have the same current value.

It is shown in FIG. 5 that forming at the points X and Y have the same forming current of 395 μA, and the same voltage Ve of approximately 2.0 A between terminals of the variable resistance element 100. That is, it is leaned that in order to perform forming in an average forming time period of 0.35 μs, the forming current of 395 μA is necessary and a voltage Ve between terminals A and B of the variable resistance element 100 is 2.0 V.

Figure 6:
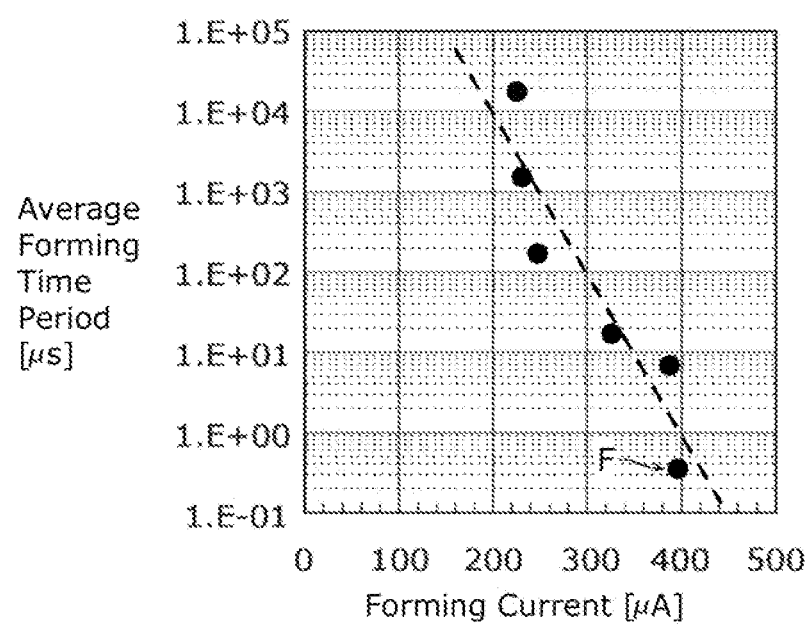
[FIG. 6]

FIG. 6 is a graph plotting a relationship between a forming current and an average forming time period from an average forming time period corresponding to a voltage VP of each voltage pulse shown in FIG. 4 by the above-described technique. The vertical axis indicates the average forming time period, and the horizontal axis indicates the forming current. A point F in FIG. 6 corresponds to a point with the forming current of 395 μA and the average forming time period of 0.35 μs which are determined above. As shown in FIG. 6, the following characteristics of the average forming time period of the variable resistance element 100 including the upper electrode 100c that is made mainly of Ir are newly observed. When a forming current is greatly driven, the average forming time period is decreased in an exponential manner. More specifically, the variable resistance element according to the present invention has characteristics in that if a voltage pulse having a voltage equal to or higher than a predetermined voltage having a positive polarity for the upper electrode 100c with reference to the lower electrode 100a in an initial state, and the voltage is kept being applied for a predetermined time duration, forming occurs. In addition, the variable resistance element according to the present invention has characteristics in that if a current flowing in the variable resistance element is increased, a time required to complete the forming is decreased in an exponential manner.

Figure 7:
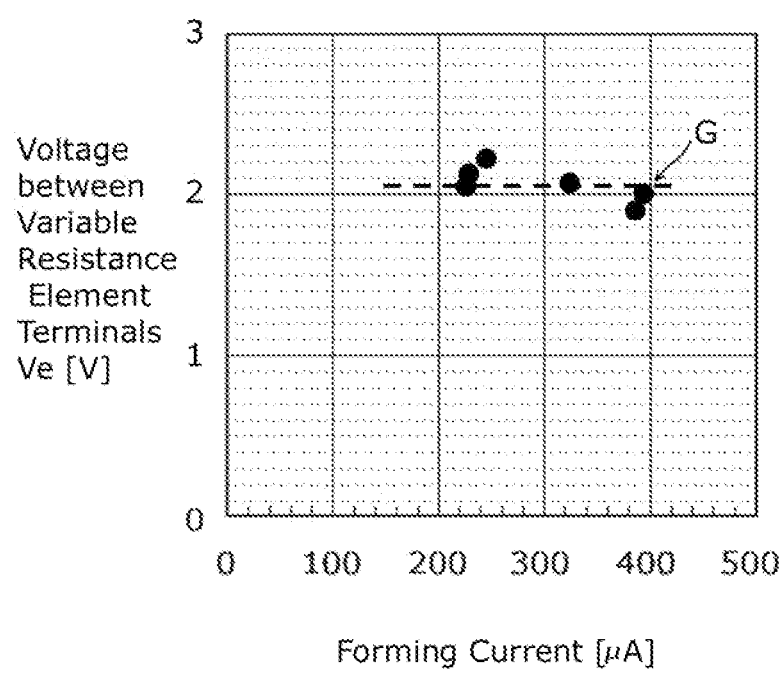
[FIG. 7]

FIG. 7 is a graph plotting a relationship between a forming current and a voltage Ve between variable resistance element terminals which are determined from an average forming time period corresponding to a voltage VP of each voltage pulse shown in FIG. 4 by the above-described technique. The vertical axis indicates the voltage Ve between variable resistance element terminals, and the horizontal axis indicates the forming current. A point G in FIG. 7 corresponds to the point F in FIG. 6 (the forming current of 395 μA, the average forming time period of 0.35 μs). As shown in FIG. 7, the voltage Ve between variable resistance element terminals in forming does not prominently depend on an amount of the current flowing in the variable resistance element 100, and has the constant value of approximately 2 V. In other words, forming occurs when the voltage between terminals A and B of the variable resistance element 100 reaches a predetermined threshold voltage (here, approximately 2 V). It is therefore learned that even if the voltage between terminals A and C of the 1T1R memory cell is increased, the voltage between terminals A and B of the variable resistance element 100 is kept in a state as if clamped by the predetermined voltage (here, approximately 2 V).

Figure 8:
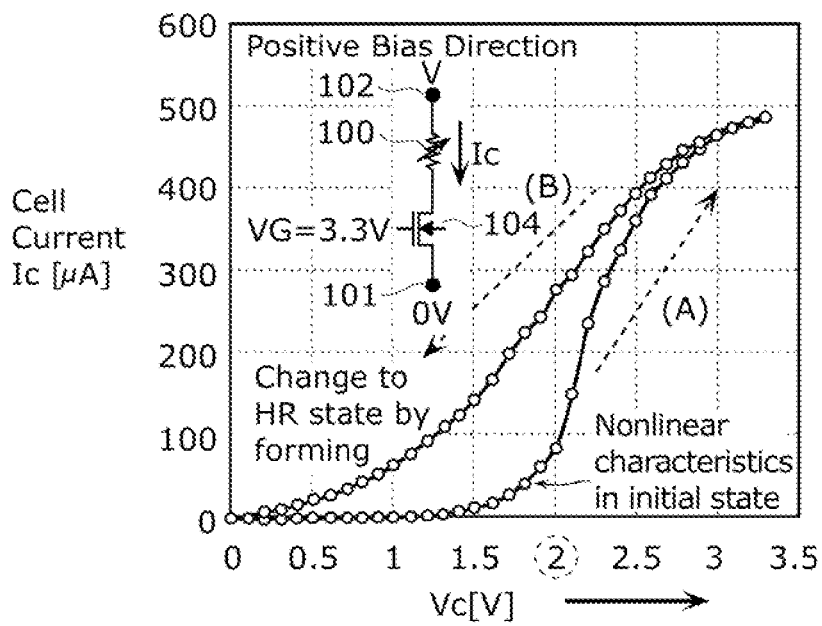
[FIG. 8]

FIG. 8 is a graph plotting I-V characteristics which are obtained by directly measuring currents before and after forming, by applying a voltage having an amplitude gradually increased from 0V to a voltage equal to or higher than the forming voltage, to the 1T1R memory cell shown in FIG. 29 in an initial state before the forming. The horizontal axis indicates a voltage VP applied to the 1T1R memory cell in the case of application to the upper electrode terminal 102 with reference to the lower electrode terminal 101. The vertical axis indicates a memory cell current Ic flowing in the 1T1R memory cell.

It should be noted that the measurement is performed by using a DC voltage source and a DC current measurement device to directly measure a forming current, and each voltage application is performed in DC state. It is considered that most of the phenomenon is the same although the forming conditions are not the same as the previously-described forming conditions in which a voltage with a predetermined pulse width is applied.

As shown in FIG. 8, if a voltage Vc between memory cell terminals in a positive bias direction is increased for a memory cell in an initial state (locus A), in a region lower than approximately 1 V, the resistance state is considerably high of 1 MΩ or higher and therefore a current hardly flows. On the other hand, a current starts flowing precipitously at a voltage around 2 V that corresponds to the threshold voltage explained with reference to FIG. 7, and strong non-linear current-voltage characteristics are shown. Subsequently, the applied voltage V is increased to 3.3 V, and then the voltage Vc between memory cell terminals is gradually decreased, characteristics which returns to the origin along another locus (locusB) are shown. At a voltage close to 0.5 V, approximately 200 kΩ is seen. This means that forming is performed along this locus. As expected from a direction of applying the voltage, it is learned that the resistance state is set to a high resistance state.

Although detailed explanation is not given, it is not always necessary to increase the voltage VP between memory cell terminals to 3.3 V. Even if the voltage is increased to, for example, a still lower voltage of 3.0 V and then decreased, it is confirmed that forming is performed along a locus different from the locus A, forming is performed, and the resistance state is set to a high resistance state.

On the other hand, if the voltage Vc, for example, a voltage lower than 2.2 V, which exceeds approximately 2 V that is a voltage at which a current precipitously flows on the locus A, is applied and then decreased, it is confirmed that forming is performed along the locus A and the forming has not been performed completely.

This is considered as follows. The measurement shown in FIG. 8 is executed by the DC voltage application-current measurement device. In the case of a general DC voltage application-current measurement device, it is considered that each measurement requires 1 ms to 10 ms. Based on the results explained with reference to FIG. 6, a forming current required for forming of 1 ms to 10 ms is approximately 200 μA. Therefore, it is expected that forming occurs around at a voltage value which exceeds 2 V in the measurement of FIG. 8 and also exceeds 200 μA. In FIG. 8, 2.2 V is at a boundary whether or not to allow a forming current of 200 μA to be flowed.

Moreover, in the explanation with reference to FIG. 5, it is assumed for simple description that current-voltage characteristics of the variable resistance element are linear characteristics (ohmic characteristics). However, in practice, the current-voltage characteristics are nonlinear characteristics as shown in FIG. 8. However, in the consideration with reference to FIG. 5, the characteristics of the variable resistance element 100 are the same, and they are shifted in a horizontal direction to calculate operation points of the NMOS transistor 104 so that the crosspoints D and E have the same current. Therefore, whether the characteristics of the variable resistance element are linear or nonlinear does not affect the results.

Accordingly, the characteristics of the basic data according to the present invention are summarized as the following.

In the 1T1R memory cell having the structure as shown in FIG. 29, it is considered that a predetermined voltage is applied, as conventionally known, to the high-resistance second transition metal oxide layer 100b-2 in contact with the upper electrode 100c, which is made of an electrode material that easily causes resistance changing, so as to perform forming, and that a filament path (namely, a conducting path) is thereby formed and resistance is changed.

Even in the case where the upper electrode 100c is made of Ir, the variable resistance element 100 in an initial state is in a considerably high resistance state. However, the variable resistance element 100 has characteristics by which a current suddenly flows in the variable resistance element 100 at application of a voltage equal to or higher than a predetermined voltage. However, forming is not completed only by applying a voltage equal to or higher than the predetermined voltage. By keeping causing a forming current to flow over a predetermined time, a filament path is generated and forming is completed. Moreover, a relationship between this forming current and the forming time period has a great dependency so that, for example, if the forming current is doubled, the forming time period is decreased to approximately 1/10000. It is considered that this is different from the well-known Joule-heat mechanism of time ∝ 1/(square of current). Mechanisms such as time Dependent Dielectric Breakdown (TDDB) that is used in explanation of dielectric strength voltage characteristics of an oxide film, and the like have been examined, but they are not the subject of this description and therefore not explained here.

If the above-described characteristics are used, designing of a 1T1R memory cell and operation of the forming can be performed more appropriately in the following manner.

The initial state is a state where the variable resistance element is in a considerably high resistance state. Therefore, a current flowing in the memory cell in the initial state is considerably small. Therefore, a direction of flow of a current does not produce a large difference. However, in the variable resistance element 100, which includes an material in which a large current flows in non-linear manner even in the initial state of the variable resistance element 100 when a voltage equal to or higher than a predetermined voltage is applied, the NMOS transistor 104 can drive more current in a direction not increasing the source voltage of the NMOS transistor 104, namely, in a direction of applying a positive voltage to the upper electrode terminal 102 with reference to the lower electrode terminal 101. As a result, a forming time period can be shortened. This is because, as described earlier, negative substrate bias effects do not occur in the NMOS transistor 104.

Moreover, if an area of the variable resistance element 100 is designed or manufactured to be smaller, a current density of a current flowing in the variable resistance element 100 is relatively increased even if the size of the transistors is not changed. As a result, a forming time period can be decreased.

In addition, forming can be controlled by a forming time period and a forming current driven by a transistor. Therefore, it is desirable to design a transistor (switch element) in a memory cell to be as small as possible if the memory is to have more capacity and higher integration. In this case, forming is possible by application of a pulse adjusted with an appropriate pulse time for achieving forming. Here, although the forming time period is increased, the forming is necessary only once prior to data writing in a product inspection step. Therefore, it is possible to offer a low-cost memory device without affecting performance of the product. This technique will be described in detail later.

On the other hand, if the small-capacity use or the memory size does not directly effect, a size of a transistor in a memory cell is designed to be appropriately large. Therefore, the current performance of the transistor is increased, and the forming time period can be increased.

Figure 9:
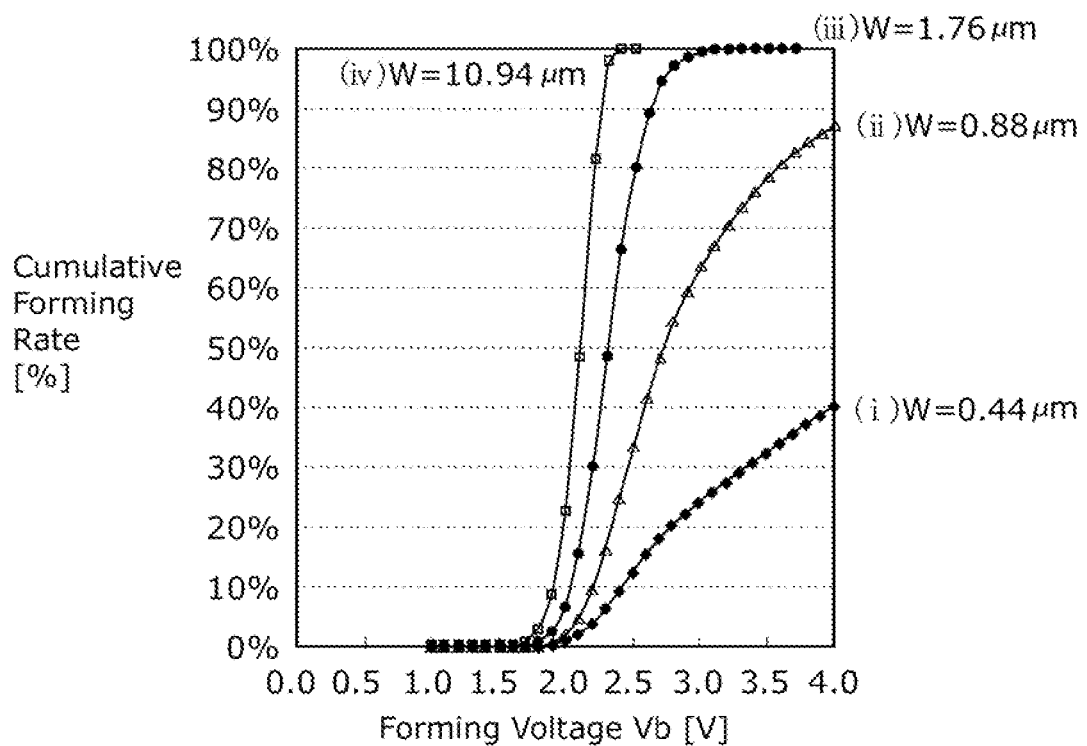
[FIG. 9]

FIG. 9 shows a cumulative probability distribution graph of a forming voltage Vb in the case where a gate width W of the NMOS transistor 104 varies to (i) 0.44 μm, (ii) 0.88 μm, (iii) 1.76 μm, and (iv) 10.94 μm. The horizontal axis, the vertical axis, and the measurement method are the same as described with reference to FIG. 31, so that they are not described in detail.

As shown in FIG. 9, as the gate W of the NMOS transistor 104 that is a selection transistor in the 1T1R memory cell is increased, a current available for the variable resistance element 100 in forming is increased. For example, if the gate width W is (iii) 1.76 μm or more, forming becomes possible with a positive voltage pulse width of 50 ns in forming.

As described above, the optimum forming method has been described, and it has been observed that the forming method relates to resistance change characteristics after the forming. The following describes (a) the above-described typical forming and (b) a variation of the forming in which forming conditions are changed.

Figure 10:
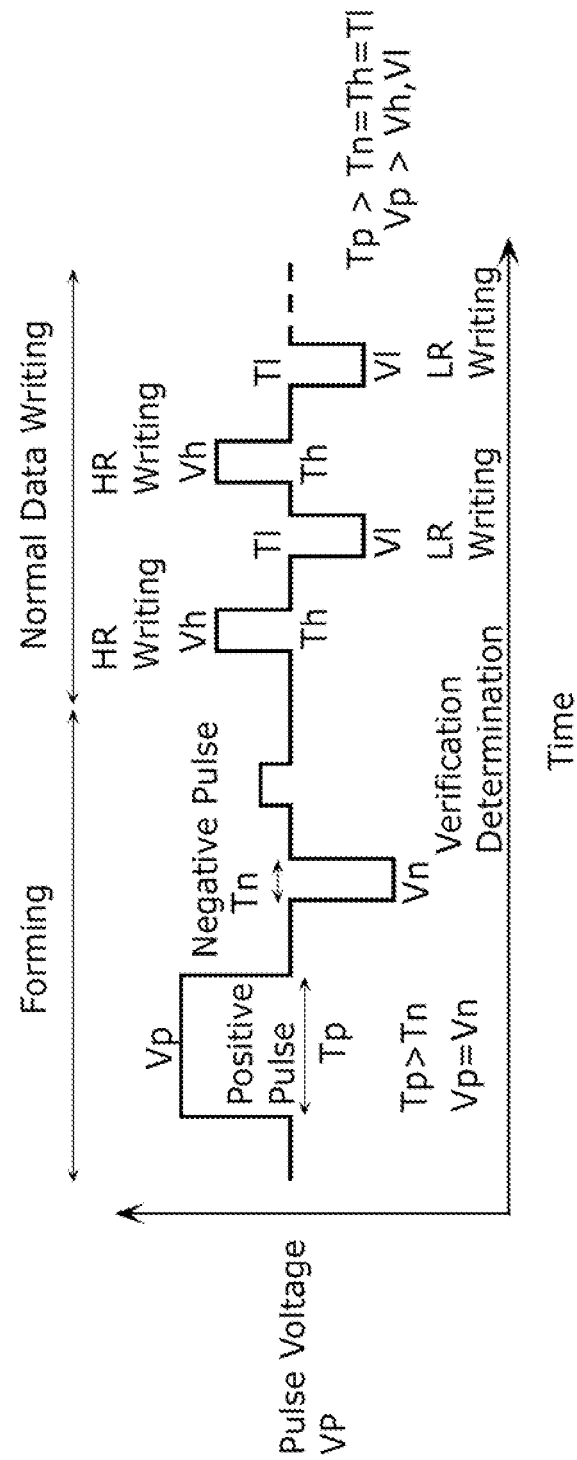
[FIG. 10]

FIG. 10 is a time chart showing a voltage waveform of a voltage pulse applied to a memory cell in forming and in normal data writing for the 1T1R memory cell including the variable resistance element 100 having the upper electrode 100c made of Ir. The vertical axis indicates a voltage VP of a voltage pulse applied between the upper electrode terminal 102 and the lower electrode terminal 101 of the memory cell of FIG. 29. The horizontal axis indicates a time. In the time chart, a direction of applying a voltage pulse of a voltage higher than that of the lower electrode terminal 101 to the upper electrode terminal 102 with reference to the lower electrode terminal 101 is defined as a positive voltage pulse, while a direction of applying a voltage pulse of a voltage higher than that of the upper electrode terminal 102 to the lower electrode terminal 101 is defined as a negative voltage pulse. In forming shown in FIG. 10, for the memory cell in the initial state as shown in FIG. 29, first, the gate voltage VG=3.3 V is applied to the gate terminal, and a voltage pulse having a voltage Vp=+3.3 V (pulse width Tp=1 ms) is applied to the upper electrode terminal 102 (here, the lower electrode terminal 101 has a ground potential), in other words, a positive voltage pulse of +3.3 V is applied to perform forming. After than, when the gate voltage VG=3.3 V is applied to the gate terminal, and a voltage pulse having a voltage Vn=+3.3 V (pulse width Tn=50 ns) is applied to the lower electrode terminal 101 is applied (here, the upper electrode terminal 102 has a ground potential), in other words, a negative voltage pulse of −3.3 V is applied to change the resistance state to nearly a low resistance (LR) state which facilitates verification determination as to whether or not a cell current relatively flows to complete forming. After that, the verification determination is made. If it is determined that the state of the variable resistance element 100 is changed to nearly LR state, then the forming is ended. On the other hand, if forming has not been completed, then the application (forming) of the positive voltage pulse (namely, a new first positive voltage pulse), the application of the negative voltage pulse, and the verification determination are repeated. The example shown in FIG. 10 shows the situation where the application of the first positive voltage pulse completes forming. After the forming success, in normal data writing (alternate writing between HR writing and LR writing), (i) a gate voltage VG=2.4 V is applied to the gate terminal, (ii) a voltage pulse having a voltage Vh=+2.4 V (pulse width Th=50 ns) is applied to the upper electrode terminal 102 (here, the lower electrode terminal 101 has a ground potential), in other words, a positive voltage pulse of +2.4 V (HR writing voltage pulse) is applied so as to change the state of the variable resistance element 100 to a high resistance, (iii) a gate voltage VG=2.4 V is applied to the gate terminal, and (iv) a voltage pulse having a voltage VI=+2.4 V (pulse width T1=50 ns) is applied to the lower electrode terminal 101 (here, the upper electrode terminal 102 has a ground potential), in other words, a negative voltage pulse of −2.4 V (LR writing voltage pulse) is applied so as to change the state of the variable resistance element 100 to a low resistance. After that, positive voltage pulse application and negative voltage pulse application are alternately repeated to enable data writing.

Figure 11:
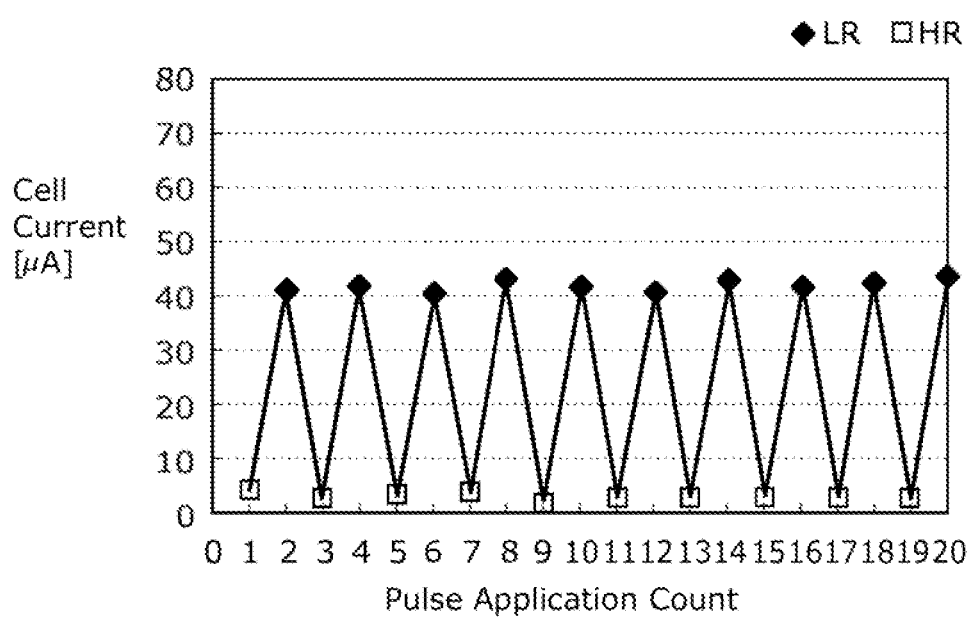
[FIG. 11]

FIG. 11 is a graph plotting resistance change characteristics in the case of positive/negative alternation pulse application to a 1T1R memory cell for which forming has been completed in FIG. 10. A vertical axis indicates a cell current in a high resistance state and a low resistance state when a gate voltage VG=1.8 V is applied to the gate terminal, a voltage of +0.4 V is applied to the upper electrode terminal 102 (here, the lower electrode terminal 101 has a ground potential) in the memory cell shown in FIG. 29. A horizontal axis indicates a voltage pulse application count. If the forming is successfully completed as described above, alternation application of a normal HR writing voltage pulse and a normal LR writing voltage pulse produces considerably stable pulse resistance change characteristics.

Figure 12:
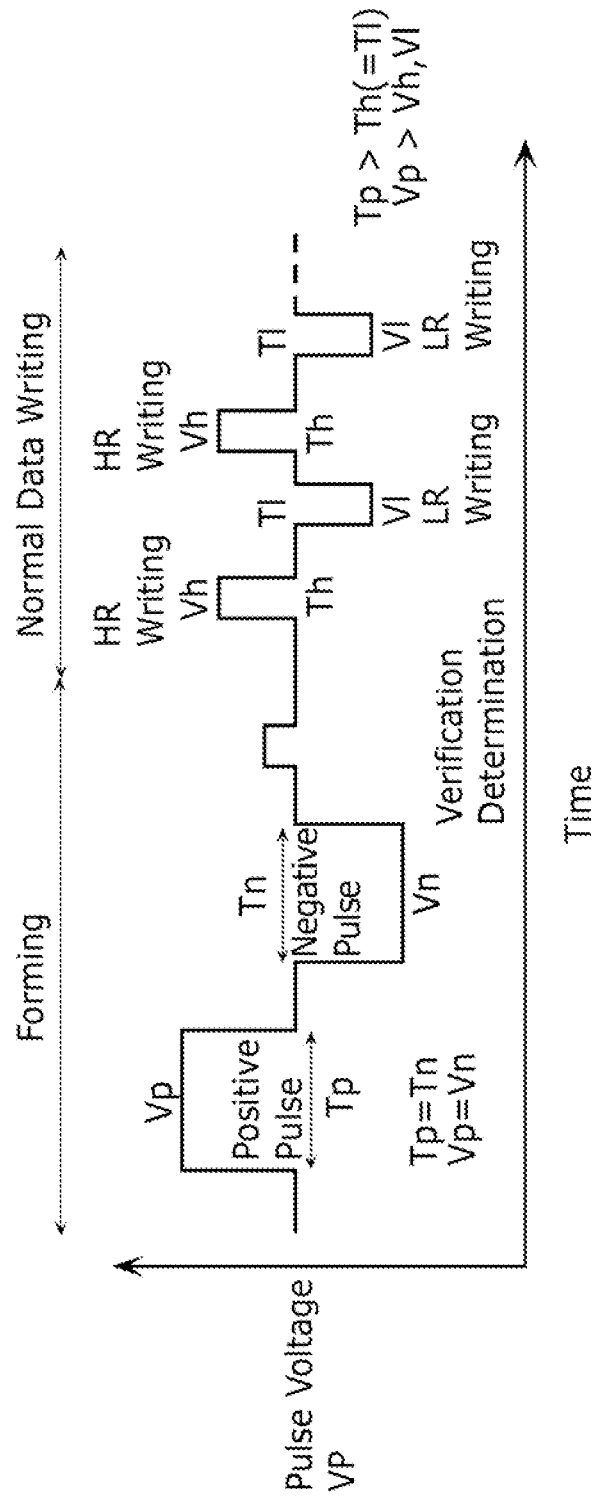
[FIG. 12]

FIG. 12 is a time chart showing a voltage waveform of a voltage pulse applied to a memory cell in forming and in normal data writing for the 1T1R memory cell including the variable resistance element 100 having the upper electrode 100c made of Ir. A vertical axis and a horizontal axis are the same as those in FIG. 10. Here, the same reference numerals of FIG. 10 are assigned to the identical elements of FIG. 12, so that the identical elements are not explained again below. In the forming in FIG. 10, a negative voltage pulse having a pulse width Tn (for example, 50 ns) shorter than a pulse width Tp (for example, 1 ms) of the first positive voltage pulse is applied, and then the verification determination is performed. However, in FIG. 12, the pulse width Tn of the negative voltage pulse in the forming is set to be equal to the pulse width Tp (for example, 1 ms) of the first positive voltage pulse. The other voltage pulses are the same as those in FIG. 10.

Figure 13:
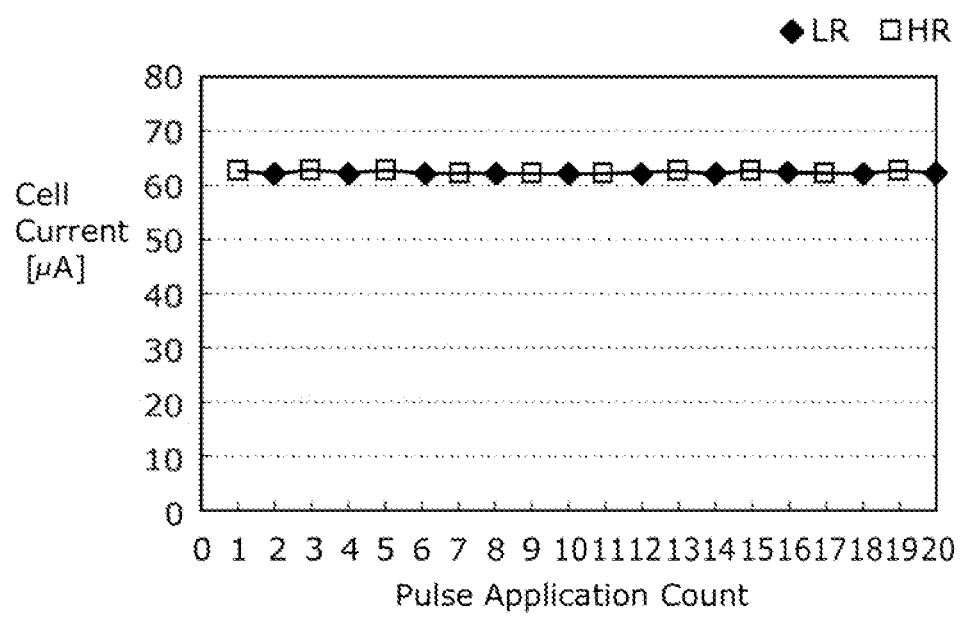
[FIG. 13]

FIG. 13 is a graph plotting resistance change characteristics in the case where positive/negative alternation pulses (HR writing voltage pulse and LR writing voltage pulse) are applied to a 1T1R memory cell for which the forming has been completed in FIG. 12. Likewise FIG. 11, FIG. 13 shows resistance change characteristics of the resistance change element 100 in the case where normal pulses (HR writing voltage pulse and LR writing voltage pulse) are applied after the completion of the forming. As seen in the figure, there is a new problem as follows. After the completion of the forming, a negative voltage pulse of −3.3 V (pulse width Tn=1 ms) applied in the verification determination in the forming is applied. As a result, the resistance state of the variable resistance element 100 becomes unchangeable form a LR state (cell current of approximately 62 μA) that is lower than a normal LR state (cell current of approximately 41 μA). After than, when a HR writing voltage pulse (+2.4 V) with a normal pulse width Th=50 ns is applied, a writing trouble of failing to change the resistance state to a high resistance state often occurs (occurrence rate of approximately 80%).

Figure 14:
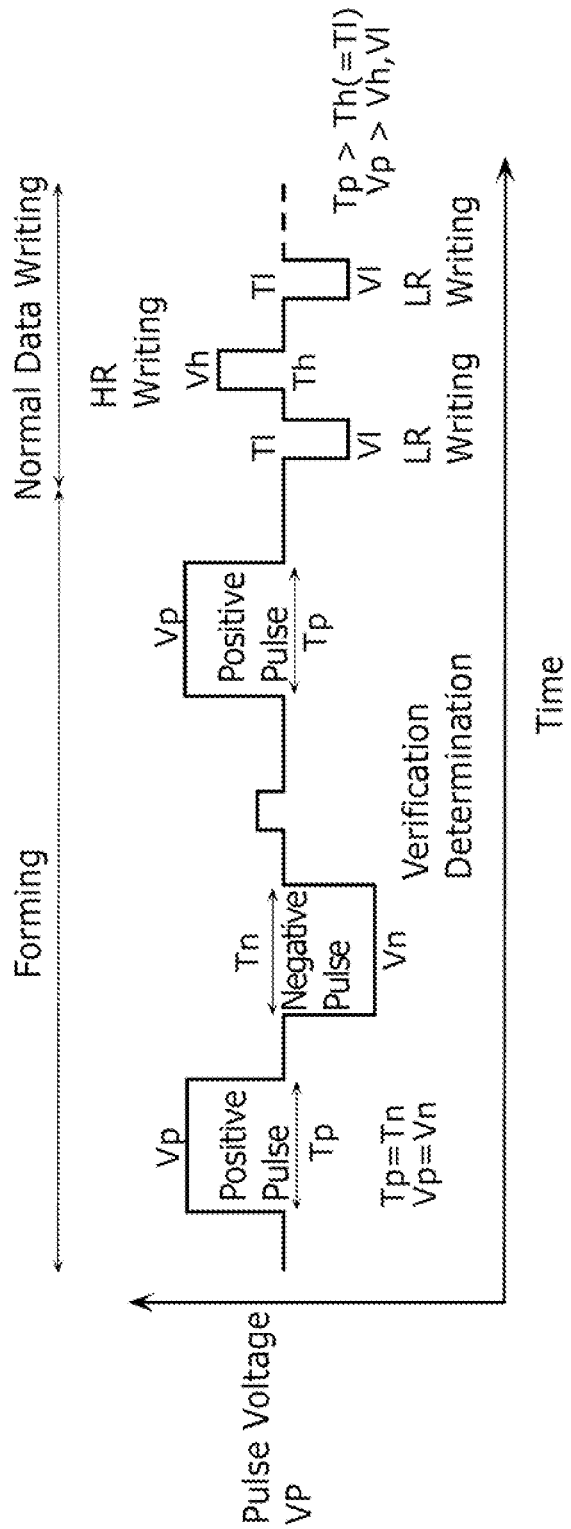
[FIG. 14]

FIG. 14 is a time chart showing a variation of a voltage waveform of a voltage pulse applied to a memory cell in forming and in normal data writing for the 1T1R memory cell including the variable resistance element 100 having the upper electrode 100c made of Ir. A vertical axis and a horizontal axis are the same as those in FIG. 12. Here, the same reference numerals of FIG. 12 are assigned to the identical elements of FIG. 14, so that the identical elements are not explained again below. In the forming in FIG. 14, after negative voltage pulse application in the forming and success of the verification determination in FIG. 12, finally, a second positive voltage pulse with a pulse width Tp (=1 ms) is applied. The other voltage pulses are the same as those in FIG. 12.

Figure 15:
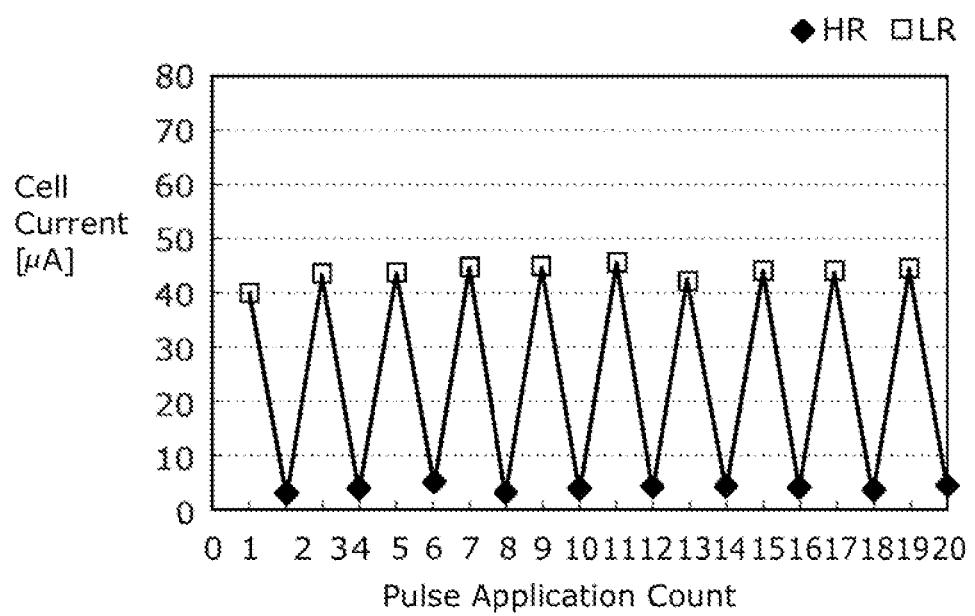
[FIG. 15]

Under the above conditions, in the forming in FIG. 12, after the negative voltage pulse application in the forming and success of the verification determination, like the forming shown in FIG. 14, the second positive voltage pulse having the same polarity, voltage amplitude, and pulse width as those of the first positive voltage pulse with the pulse width Tp (1 ms) is applied, so that the trouble that the resistance state is not changed from the LR state lower than the normal LR state seen in FIG. 13 can be solved. After that, if a normal LR writing voltage pulse and a normal HR writing voltage pulse are alternately applied as shown in FIG. 15, the variable resistance element 100 shows considerably stable pulse resistance change characteristics. A vertical axis and a horizontal axis in FIG. 15 are the same as those in FIG. 11.

As described above, as the variation, the new reliable forming technique is found.

It should be noted that FIG. 14 shows the case where the forming is completed by single application of a positive voltage pulse, but if the forming is not completed, it is also possible that the first application of the positive voltage pulse (forming), application of the negative voltage pulse, and the verification determination are repeated again, and then if the verification determination is successful, then finally, the second positive voltage pulse is applied only once to solve the trouble that the state is not changeable from the LR state. Furthermore, if the positive voltage pulse application (forming) and the negative voltage pulse application are repeated, it is also possible to gradually increase the pulse widths (Tp=Tn) of the pulses.

Next, the embodiment according to the present invention for realizing the forming flow of FIG. 1 is described.

As the embodiment according to the present invention, a 1T1R nonvolatile memory device including the variable resistance elements shown in FIG. 29 is described.

Figure 16:
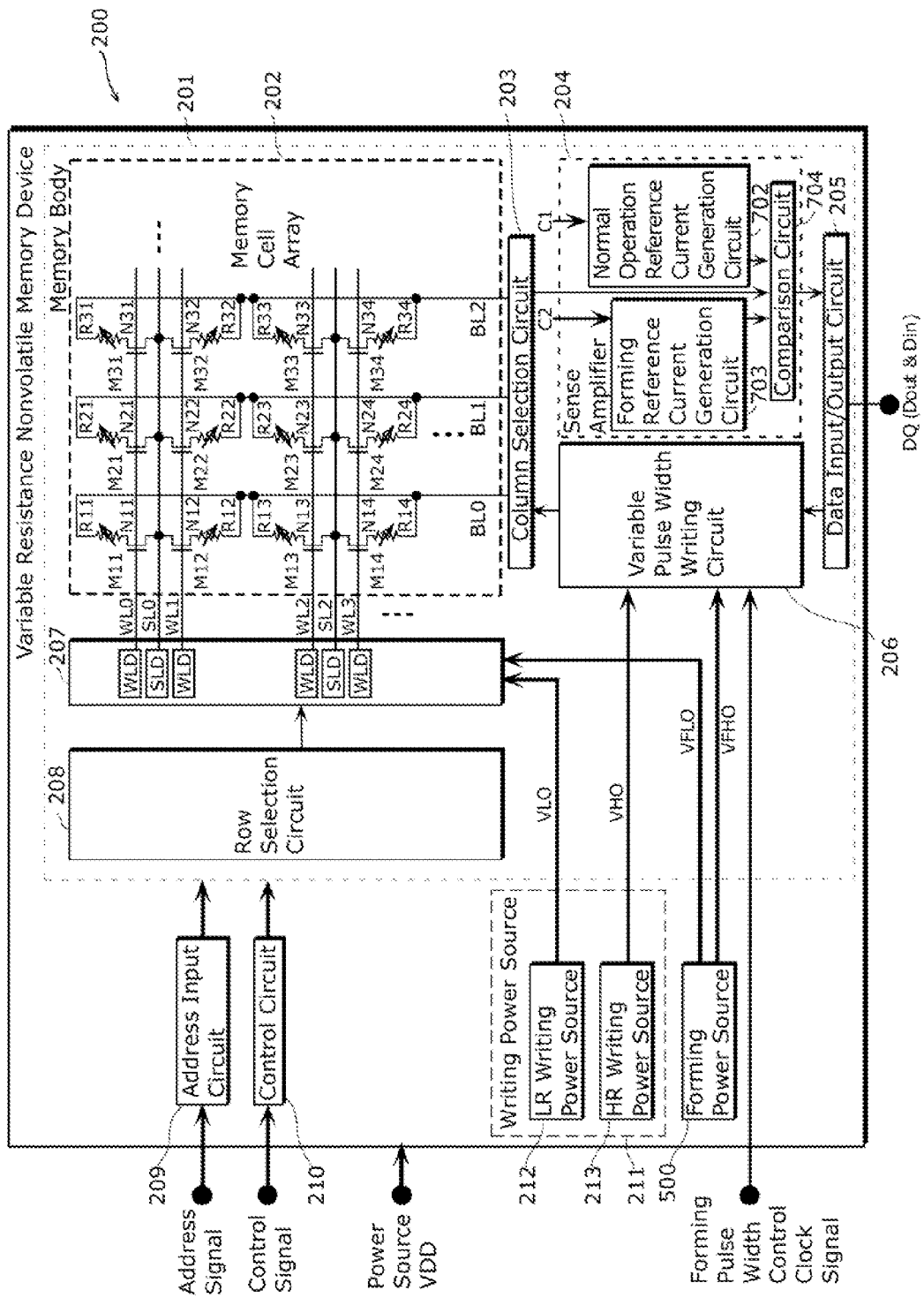
[FIG. 16]

FIG. 16 is a block diagram showing a structure of a variable resistance nonvolatile memory device 200 according to the embodiment of the present invention.

As shown in FIG. 16, the nonvolatile memory device 200 according to the embodiment of the present invention includes a memory body 201 formed on a semiconductor substrate. The memory body 201 includes: a memory cell array 202 in which the 1T1R memory cells each including the upper electrode 100c made of iridium (Ir) shown in FIG. 29 are arranged in rows and columns: a row selection circuit 208; a row driver 207 including word line drivers WLD and source line drivers SLD; a column selection circuit 203; a variable pulse width writing circuit 206 that performs forming and writing; a sense amplifier 204 that detects an amount of current flowing in a selected bit line and thereby determines whether a resistance state is a high resistance state as data "0" or a low resistance state as data "1"; and a data input/output circuit 405 that receives and outputs input/output data via a terminal DQ.

The sense amplifier 204 functionally includes a forming determination unit and a normal operation determination unit. The forming determination unit determines whether or not a variable resistance nonvolatile memory element included in at least one memory cell selected from the memory cell array 202 is in a low resistance state. The normal operation determination unit determines whether the variable resistance nonvolatile memory element included in the selected memory cell is in a high resistance state or in a low resistance state. As actual circuits to implement these functions, the sense amplifier 204 includes a normal operation reference current generation circuit 702, a forming reference current generation circuit 703, and a comparison circuit 704. In other words, a set of the normal operation reference current generation circuit 702 and the comparison circuit 704 serve as the normal operation determination unit, and a set of the forming reference current generation circuit 703 and the comparison circuit 704 serve as the forming determination unit.

In addition, the nonvolatile memory device 200 includes, as the writing power source 211, a high resistance (HR) writing power source 213 and a low resistance (LR) writing power source 212, and also a forming power source 500.

The nonvolatile memory device 200 further includes: an address input circuit 209 that receives an address signal from the outside; and a control circuit 210 that controls operations of the memory body 201 based on a control signal provided from the outside.

The memory cell array 202 includes a plurality of memory cells in each of which a variable resistance nonvolatile memory element and a switch element (here, a transistor) are connected in series with each other. More specifically, the memory cell array 202 includes a plurality of word lines WL0, WL1, WL2, . . . and a plurality of bit lines BL0, BL1, BL2, . . . , on the semiconductor substrate. The word lines WL0, WL1, WL2, . . . cross the bit lines BL0, BL1, BL2, . . . , respectively. The memory cell array 202 also includes, as one example of the switch elements, a plurality of NMOS transistors N11, N12, N13, N21, N22, N23, N31, N32, N33, . . . (hereinafter, referred to as "transistors N11, N12, . . . ") at respective cross-points between the word lines WL0, WL1, WL2, . . . and the bit lines BL0, BL1, BL2, . . . . The memory cell array 202 further includes a plurality of variable resistance elements R11, R12, R13, R21, R22, R23, R31, R32, R33, . . . (hereinafter, referred to as "variable resistance elements R11, R12, . . . ") each of which is connected in series with a corresponding one of the transistors N11, N12, . . . to form a pair. As a result, each of the pairs serves as a corresponding one of memory cells M11, M12, M13, M21, M22, M23, M31, M32, M33, . . . (hereinafter, referred to as "memory cells M11, M12, . . . ").

As shown in FIG. 16, gates of the transistors N11, N21, N31, . . . are connected to the word line WL0, gates of the transistors N12, N22, N32, . . . are connected to the word line WL1, gates of the transistors N13, N23, N33, . . . are connected to the word line WL2, and gates of the transistors N14, N24, N34, . . . are connected to the word line WL3.

Furthermore, all of the transistors N11, N21, N31, . . . and the transistors N12, N22, N32, . . . are connected to the source line SL0, and all of the transistors N13, N23, N33, . . . and the transistors N14, N24, N34, . . . are connected to the source line SL2.

Each of the variable resistance elements R11, R12, . . . are the variable resistance element 100 shown in FIG. 29, so that they have the above-described characteristics. More specifically, each of the variable resistance elements has the following characteristics (1) to (4). (1) When a LR writing voltage pulse, which has a positive voltage equal to or higher than the first threshold voltage, is applied to the lower electrode (first electrode) 100a with reference to the upper electrode (second electrode) 100c, the resistance state of the variable resistance element is changed to a low resistance state, and when a HR writing voltage pulse, which has a positive voltage equal to or higher than the second threshold voltage, is applied to the upper electrode 100c with reference to the lower electrode 100a, the resistance state of the variable resistance element is changed to a high resistance state. (2) In an initial state where any voltage has not been applied after manufacturing (in other words, an initial state after manufacturing where the state is not changeable between a high resistance state and a low resistance state depending on a polarity of an applied voltage pulse), the variable resistance element has non-linear current-voltage characteristics. (3) When a voltage pulse, which has a positive potential equal to or higher than that of a predetermined voltage, is applied to the upper electrode 100c with reference to the lower electrode 100a in the initial state, and the voltage is kept being applied during a predetermined time period, forming occurs to change the initial state to a state where the resistance state can be changed between a high resistance state and a low resistance state depending on a polarity of an applied voltage pulse, and when a current flowing in the variable resistance nonvolatile memory element is increased, a time period required for the forming is decreased in an exponential manner. (4) In forming, as a cumulative pulse application time period of at least one applied voltage pulse is increased, a probability of forming completion is increased.

Furthermore, the variable resistance elements R11, R12, R13, R14, . . . are connected to the bit line BL0, the variable resistance elements R21, R22, R23, R24, . . . are connected to the bit line BL1, and the variable resistance elements R31, R32, R33, R34, . . . are connected to the bit line BL2. As described above, the memory cell array 202 according to the present embodiment has a structure in which the variable resistance elements R11, R12, R13, . . . are connected directly to corresponding one of the bit lines BL0, BL1, BL2, . . . , not via the NMOS transistors N11, N12, . . . . However, the present invention is not limited to the above structure. For example, in FIG. 16, it is also possible that each of the bit lines BL0, BL1, BL2, . . . is connected to an end of corresponding one of the NMOS transistors N11, N12, . . . , and each of the source lines SL0, SL1, SL2, . . . is connected to an end of corresponding one of the variable resistance elements R11, R12, R13, R14, . . . . It is also possible that the NMOS transistor is replaced by a PMOS transistor. It should also be noted that FIG. 16 shows a structure example in which the source lines are in parallel to the word lines, but it is also possible that the source lines are in parallel to the bit lines.

In forming, the control circuit 210 provides the forming power source 500 and the variable pulse width writing circuit 206 with a forming signal instructing application of a forming voltage. In a data writing cycle, the control circuit 210 provides the variable pulse width writing circuit 206 with a write signal instructing application of a writing voltage, based on input data Din provided to the data input/output circuit 205. On the other hand, in a data reading cycle, the control circuit 210 provides the sense amplifier 204 with a read signal instructing a reading operation.

It should be noted that the row selection circuit 208 and the column selection circuit 203 serve as a selection unit that selects at least one memory cell from the memory cell array 202.

The row selection circuit 208 receives a row address signal from the address input circuit 209. Based on the row address signal, the row selection circuit 208 causes the row driver 207 to apply a predetermined voltage to a word line selected in the row address signal, by using the word line driver circuit WLD corresponding to one of the plurality of word lines WL0, WL1, WL2, . . . .

At the same time, when the row selection circuit 208 receives a row address signal from the address input circuit 209, the address input circuit 209 causes, based on the row address signal, the row driver 207 to apply a predetermined voltage to a source line selected in the row address signal, by using the source line driver circuit SLD corresponding to one of the plurality of source lines SL0, SL2, . . . .

The variable pulse width writing circuit 206 is a circuit that generates a writing voltage pulse to change a resistance state of a variable resistance nonvolatile memory device included in a memory cell selected by the above-described selection unit to a desired state, when forming or writing is performed on the variable resistance nonvolatile memory device. Therefore, at a normal operation mode (an operation mode for changing resistance state of variable resistance elements between a high resistance state and a low resistance state), the variable pulse width writing circuit 206 generates the writing voltage pulse having a width of 50 ns when the control circuit 210 issues writing instruction. On the other hand, at a forming mode (in forming), the variable pulse width writing circuit 206 generates the forming pulse having the same width as a desired width of a pulse signal provided from a forming pulse width control clock signal terminal. The writing pulse and the forming pulse generated as above are applied to the bit line selected by the column selection circuit 203.

More specifically, in order to perform forming under control of the control circuit 210 on a variable resistance nonvolatile memory element included in a selected memory cell, the variable pulse width writing circuit 206 applies the first voltage pulse (herein, the first positive voltage pulse), which has an amplitude greater than that of a predetermined voltage having a positive potential and has the first pulse width, to the upper electrode 100c with reference to the lower electrode 100a of the memory cell. If the above-described forming determination unit determines that the forming for the variable resistance nonvolatile memory element after the application of the first voltage pulse (here, the first positive voltage pulse) is not completed, the variable pulse width writing circuit 206 applies a new first voltage pulse (here, the first positive voltage pulse), which has an amplitude equal to or greater than that of the predetermined voltage having the positive potential and has a pulse width greater than that of the first pulse width, to the upper electrode 100c with reference to the lower electrode 100a of the memory cell.

It should be noted that, unlike the above-described forming using positive voltage pulses, forming using negative voltage pulses may be performed. More specifically, in order to perform forming under io control of the control circuit 210 on a variable resistance nonvolatile memory element included in a selected memory cell, the variable pulse width writing circuit 206 applies a first voltage pulse, which has an amplitude greater than that of a predetermined voltage having a negative potential and has the first pulse width, to the upper electrode 100c with reference to the lower electrode 100a. If the above-described forming determination unit determines that the forming for the variable resistance nonvolatile memory element after the application of the first voltage pulse is not completed, the variable pulse width writing circuit 206 may apply a new first voltage pulse, which has an amplitude equal to or greater than that of the predetermined voltage having the negative potential and has a pulse width greater than that of the first pulse width, to the upper electrode 100c with reference to the lower electrode 100a in the memory cell. It is also possible that the negative voltage pulse has an amplitude greater than that of the predetermined voltage having a positive potential and have a pulse width greater than that of the first pulse width, and is applied to the upper electrode 100a with reference to the lower electrode 100c. After performing the forming by the negative voltage pulses, in the flow of FIG. 1, S22 becomes negative pulse application with pulse width Tp (LR writing direction), and S23 is eliminated.

In other words, the application of the first positive or negative voltage pulse by the variable pulse width writing circuit 206 and the determination by the forming determination unit are repeated until the forming determination unit determines that the forming is completed. Then, in the repetition, the variable pulse width writing circuit 206 applies a new first positive or negative voltage pulse, which has a pulse width greater than the pulse width of the first positive or negative voltage pulse that has been applied immediately prior to the new pulse, to the variable resistance nonvolatile memory device.

The writing power source 211 is a circuit that generates a writing io voltage for changing the resistance state of the variable resistance nonvolatile memory element included in the memory cell selected by the above-described selection unit from a high resistance state to a low resistance state or from a low resistance state to a high resistance state. More specifically, the writing power source 211 includes the LR writing power source 212 for LR writing and the HR writing power source 213 for HR writing. An output VL0 of the LR writing power source 212 is provided to the row driver 207, while an output VH0 of the HR writing power source 213 is provided to the variable pulse width writing circuit 206.

Furthermore, an output VFL0 of the forming source 500 is provided to the row driver 207, while an output VFHO is provided to the variable pulse width writing circuit 206.

The normal operation reference current generation circuit 702 is activated by a reading enable signal C1 in normal reading (reading at the above-described normal operation mode), and mirrors a read reference current to the comparison circuit 704. Furthermore, the forming reference current generation circuit 703 is activated by a forming enable signal C2 in forming (at the above-described forming mode), and mirrors a forming reference current to the comparison circuit 704. The comparison circuit 704 compares (i) one of the read reference current and the forming reference current to (ii) the memory cell current selected by the column selection circuit 203 so as to make the determination, and provides the determination result to the data input/output circuit 205.

Figure 17:
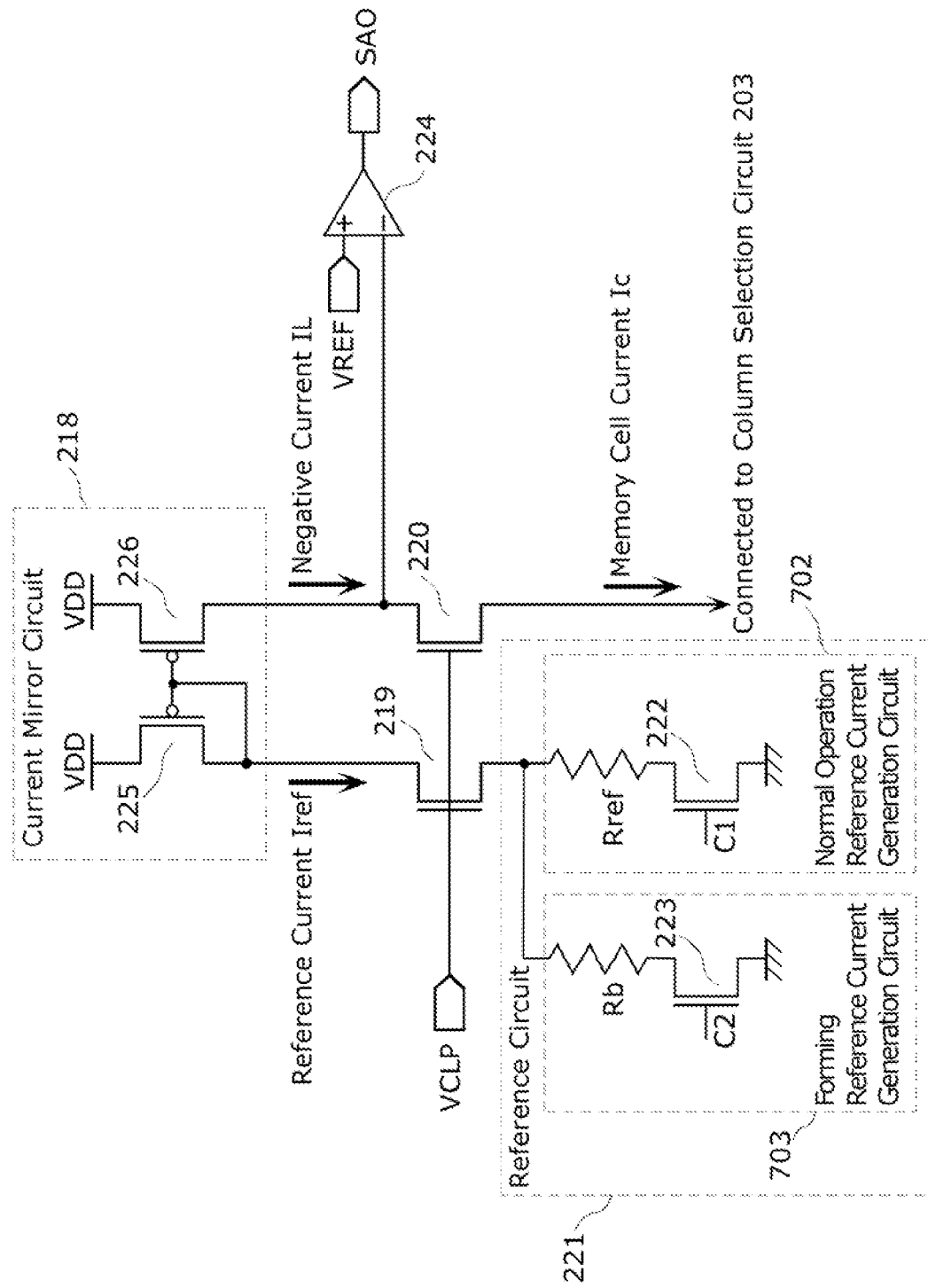
[FIG. 17]

FIG. 17 is a circuit diagram showing an example of a detailed structure of the sense amplifier 204 shown in FIG. 16.

The sense amplifier 204 includes clamp transistors 219 and 220, a reference circuit 221, and a difference amplifier 224. The clamp transistors 219 and 220 have the same size as that of the current mirror circuit 218 having a one-to-one mirror ratio. The reference io circuit 221 includes the normal operation reference current generation circuit 702 and the forming reference current generation circuit 703. In the normal operation reference current generation circuit 702, one end of a branch, in which a selection transistor 222 is connected in series with a reference resistance Rref (for example, 18.2 kΩ), is connected to a ground potential, and the other end of the branch is connected to a source terminal of the clamp transistor 219. Here, the reference resistance Rref is set to have a resistance value corresponding to an almost intermediate current value between HR writing cell current and LR writing cell current for normal reading. A gate terminal of the selection transistor 222 receives a reading enable signal C1. Based on the reading enable signal C1, the selection transistor 222 is switched between a conducting state and a non-conducting state. In the similar manner, in the forming reference current generation circuit 703, one end of a branch, in which a selection transistor 223 is connected in series with a reference resistance Rb (for example, 40 kΩ), is connected to a ground potential, and the other end of the branch is connected to a source terminal of the clamp transistor 219. Here, the reference resistance Rb for the forming is set to have a resistance value slightly lower than the high-resistance resistance value written in the normal operation. A gate terminal of the selection transistor 223 receives a forming enable signal C2. Based on the forming enable signal C2, the selection transistor 223 is switched between a conducting state and a non-conducting state.

A gate terminal of each of the clamp transistors 219 and 220 receives a clamp voltage VCLP (for example, 0.9 V). A source terminal of the clamp transistor 220 is connected to the memory cells via the column selection circuit 203 and the bit lines. Drain terminals of the clamp transistors 219 and 220 are connected to drain terminals of transistors 225 and 226, respectively, which are included in the current mirror circuit 218. The difference amplifier 224, which receives a reference voltage VREF (1.1 V), performs inverting amplification to a potential of the drain terminal of the clamp transistor 220, so as to generate a sense amplifier output SAO to be provided to the data input/output circuit 205.

Figure 18:
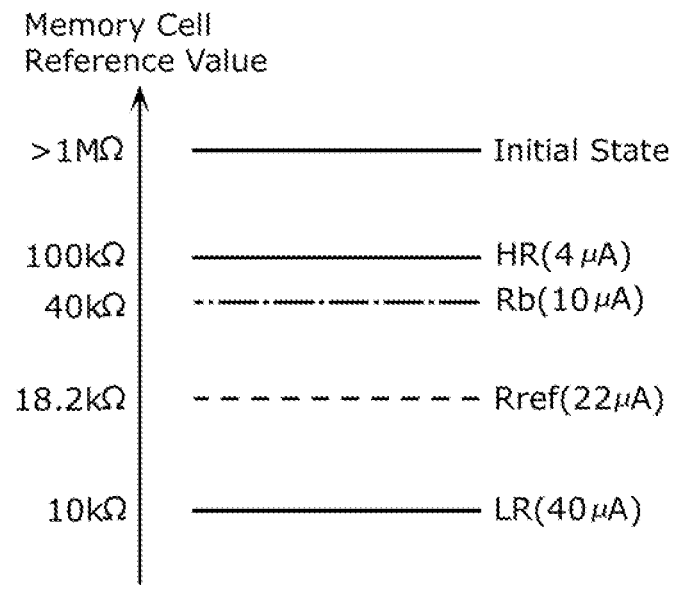
[FIG. 18]

FIG. 18 is a diagram for explaining the determination levels of the sense amplifier 204. As shown in the example of FIG. 18, the sense amplifier 204 has two determination levels which are (i) a normal reading reference resistance Rref (for example, 18.2 kΩ) and (ii) a forming reference resistance Rb (for example, 40 kΩ) smaller than a high resistance state HR, between the high resistance state HR (for example, 100 kΩ) and the low resistance state LR (for example, 10 kΩ). In order to determine whether or not the forming of the variable resistance element is completed, the forming reference resistance Rb is set to have a resistance value slightly smaller than the resistance value in the high resistance state HR. Furthermore, in order to determine whether or the variable resistance element is in a high resistance state or in a low resistance state, the common reading reference resistance Rref is set to have a resistance value that is smaller than the resistance value in the high resistance state HR and greater than the resistance value of the low resistance state LR.

FIG. 18 also shows, as reference, an initial state (here, a resistance value of 1 MΩ or greater) of the variable resistance element. Here, a resistance value of the variable resistance element after the forming is not always lower than the resistance value in the high resistance state HR. Therefore, the forming reference resistance Rb is not necessarily to have always a resistance value as shown in the figure which is smaller than that in the high resistance state HR. If it is possible to distinguish the initial state from the high resistance state HR, the forming reference resistance Rb may have a resistance value (for example, 200 kΩ) greater than the resistance value in the high resistance state HR. Thereby, completion of the forming can be detected by examining a resistance value obtained immediately after the application of the forming positive voltage pulse, without applying the negative voltage pulse at Step S23 in FIG. 1.

Next, regarding the nonvolatile memory device 200 having the above structure, the description is first given for operation performed by the sense amplifier 204, and then given for operations (i) in a writing cycle where data writing and forming are performed on the nonvolatile memory device 200, and (ii) in a reading cycle where normal reading and verification reading are performed on the nonvolatile memory device 200.

First, the operation performed by the sense amplifier 204 shown in FIG. 17 is described. In the forming for generating a conducting path in a variable resistance element, the sense amplifier 204 applies a forming positive voltage pulse to a target variable resistance element, and after applying a negative voltage pulse for low resistance writing, the sense amplifier 204 is connected to a target memory cell (including the target variable resistance element) via the column selection circuit 203 and the bit lines. To the target memory cell, a voltage, which is higher than a voltage (for example, 0.4 V) that is lower by a threshold voltage (for example, 0.5 V) of the clamp transistors 219 and 220 from the clamp voltage VCLP (for example, 0.9 V), is not applied. On the other hand, in the reference circuit 221, the selection transistor 223 is activated by the forming enable signal C2 to be in a conducting state, so that the forming reference resistance Rb (for example, 40 kΩ) is selected. The other selection transistors 222 is set to be non-active by the reading enable signal C1 to be in a non-conducting state, so that the reference current Iref (for example, approximately 10 μA (=0.9 V-0.5 V)/4 kΩ) flows. Therefore, the reference current Iref is transferred by the current mirror circuit 218. Thereby, a current of approximately 10 μA flows as a load current IL. The clamp transistor 220 compares the load current IL to the memory cell current Ic to determine a magnitude relation of them. Depending on the comparison result, the difference amplifier 224 detects whether a drain terminal voltage at the clamp transistor 220 is higher or lower than the reference voltage VREF (for example, 1.1 V), and the difference amplifier 224 outputs the sense amplifier output SAO.

Here, if a resistance value after application of a negative voltage pulse for low resistance writing is still in the initial state (for example, 20 MΩ), and the reading voltage is 0. 4V, the memory cell current Ic=0.02 μA (=0.4 V/20Ω) flows. Here, load current IL (approximately of 10 μA)>memory cell current Ic (0.02 μA), a drain terminal voltage at the clamp transistor 220 is higher than the reference voltage VREF (=1.1 V) after a predetermined time period, and the sense amplifier output SAO indicates a L level. In other words, if the selected memory cell is in an initial resistance state (here, 20 MΩ) that is higher than the forming reference resistance Rb (here, 40 kΩ), the sense amplifier 204 determines as "0", namely, a failure of the forming. On the other hand, forming has been completed on the selected memory cell in the forming, and then application of the negative voltage pulse low resistance writing changes the resistance value in a low resistance (for example, 12 kΩ). If the resistance value after the negative voltage pulse application is lower than the forming reference resistance Rb (here, 40 kΩ), the memory cell current Ic=33.3 μA (=0.4 V/12 kΩ) flows. Here, load current IL (approximately 10 μA)<memory cell current Ic (33.3 μA), and a drain terminal voltage at the clamp transistor 220 is lower than the reference voltage VREF (=1.1 V) after a predetermined time period As a result, the sense amplifier output SAO indicates a H level. In other words, if the selected memory cell is in a low resistance state lower than the forming reference resistance Rb (40 kΩ), the output of the sense amplifier 204 determines as "1", in other words, determined that the forming is passed, and indicates that the forming on the target memory cell is completed.

Moreover, in normal reading, in the reference circuit 221, the selection transistor 222 is activated by the reading enable signal C1 to be in a conducting state. Therefore, the normal reading reference resistance Rref is selected. The other selection transistor 223 is set to be non-active by the forming enable signal C2 to be in a non-conducting state. As a result, the reference current Iref of, for example, 22 μA (=0.9 V-0.5 V)/18.2 kΩ) flows. The reference current Iref is transferred by the current mirror circuit 218. Thereby, the load current IL of 22 μA flows. The load current IL is compared to the memory cell current Ic to determine a magnitude relation of them.

Depending on the comparison result, the difference amplifier 224 detects whether a drain terminal voltage at the clamp transistor 220 is higher or lower than the reference voltage VREF (=1.1 V), and the difference amplifier 224 outputs the sense amplifier output SAO.

Here, when a high resistance state is 100 kΩ and a low resistance state is 10 kΩ, if the selected memory cell is in the high resistance state, the memory cell current Ic=4 µA (=0.4 V/100 kΩ) flows. Here, load current IL (22 µA)>memory cell current Ic (4 µA), a drain terminal voltage at the clamp transistor 220 becomes higher than the reference voltage VREF (=1.1 V), and the sense amplifier output SAO indicates a L level. In other words, if the selected memory cell is in the high resistance state (100 kΩ) that is higher than the normal reading reference resistance Rref (here, 18.2 kΩ), the sense amplifier 204 determines as "0" data. On the other hand, if the selected memory cell is in a low resistance state, memory cell current Ic of 40 µA(=0.4 V/10 kΩ) flows. Here, load current IL (22 µA) <memory cell current Ic (40 µA), a drain terminal voltage at the clamp transistor 220 becomes lower than the reference voltage VREF (=1.1 V), and the sense amplifier output SAO indicates a H level. In other words, if the selected memory cell is in the low resistance state (10 kΩ) that is lower than the normal reading reference resistance Rref (18.2 kΩ), the sense amplifier 204 determines as "1" data.

Next, FIG. 19 shows a table of various setting voltages including a word line (WL) voltage, a source line (SL) voltage, and a bit line (BL) voltage for each of modes including forming, forming determination (verification) reading, "1" writing (LR writing), "0" writing (HR writing), and reading.

In FIG. 19, the BL voltage in each of positive voltage pulse application io and negative voltage pulse application in forming is a pulse voltage with amplitude VH (for example, 3.3 V). The BL voltage in each of the "1" writing (LR writing) and the "0" writing (HR writing) is a writing pulse voltage with an amplitude VH (for example, 2.4). Here, VH in forming >VH in writing.

In the "1" writing (LR) writing, VL (2.4 V) is a voltage generated by the LR writing power source 212, and also a word line voltage applied from the word line driver circuit WLD and the source line voltage applied from the source line driver circuit SLD. VH (2.4 V) is a voltage generated by the HR writing power source 213 to be applied to the variable pulse width writing circuit 206.

In the "0" writing (HR) writing, VL (2.4 V) is a voltage generated by the LR writing power source 212, and also a word line voltage applied from the word line driver circuit WLD. VH is a voltage generated by the HR writing power source 213 to be applied to the variable pulse width writing circuit 206.

Furthermore, in positive voltage pulse application in the forming, VH is an amplitude (3.3 V) of a voltage pulse which is applied from the variable pulse width writing circuit 206 and which has a pulse width Tp (variable from 50 ns to 10 ms) that is equal to or longer than a pulse width (Th=Tl=50 ns) of a voltage pulse for normal rewriting. VL (3.3 V) is a voltage generated by the forming power source 500 and a word line voltage applied from the word line driver circuit WLD.

Moreover, in negative voltage pulse application in the forming, VH is an amplitude (3.3 V) of a voltage pulse which is applied from the variable pulse width writing circuit 206 and which has a voltage width Tn (50 ns) that is equal to the pulse width (Th=Tl=50 ns) of the voltage pulse for normal rewriting. VL (3.3 V) is a voltage generated by the forming power source 500, and a word line voltage applied from the word line driver circuit WLD and a source line voltage applied from the source line driver circuit SLD.

In the forming determination (verification) reading and in normal reading, Vread is a reading voltage (0.4 V) clamped by the sense amplifier 204, and corresponds to a voltage value (+0.4 V) adjusted not to cause reading disturbance (in other words, not to change a resistance state of a variable resistance element). VDD corresponds to a power source voltage applied to the nonvolatile memory device 200.

Furthermore, in the forming determination (verification) reading, as shown in FIG. 8, regardless of whether the forming is possible or impossible, application of a voltage of approximately 2 V suddenly increases a cell current due to non-linear characteristics of the variable resistance element 100, thereby causing a current of 10 µA or more to flow. Therefore, it is necessary to set the forming determination reading voltage Vread to be enough lower than 2 V (for example, 0.4 V).

Figure 20:
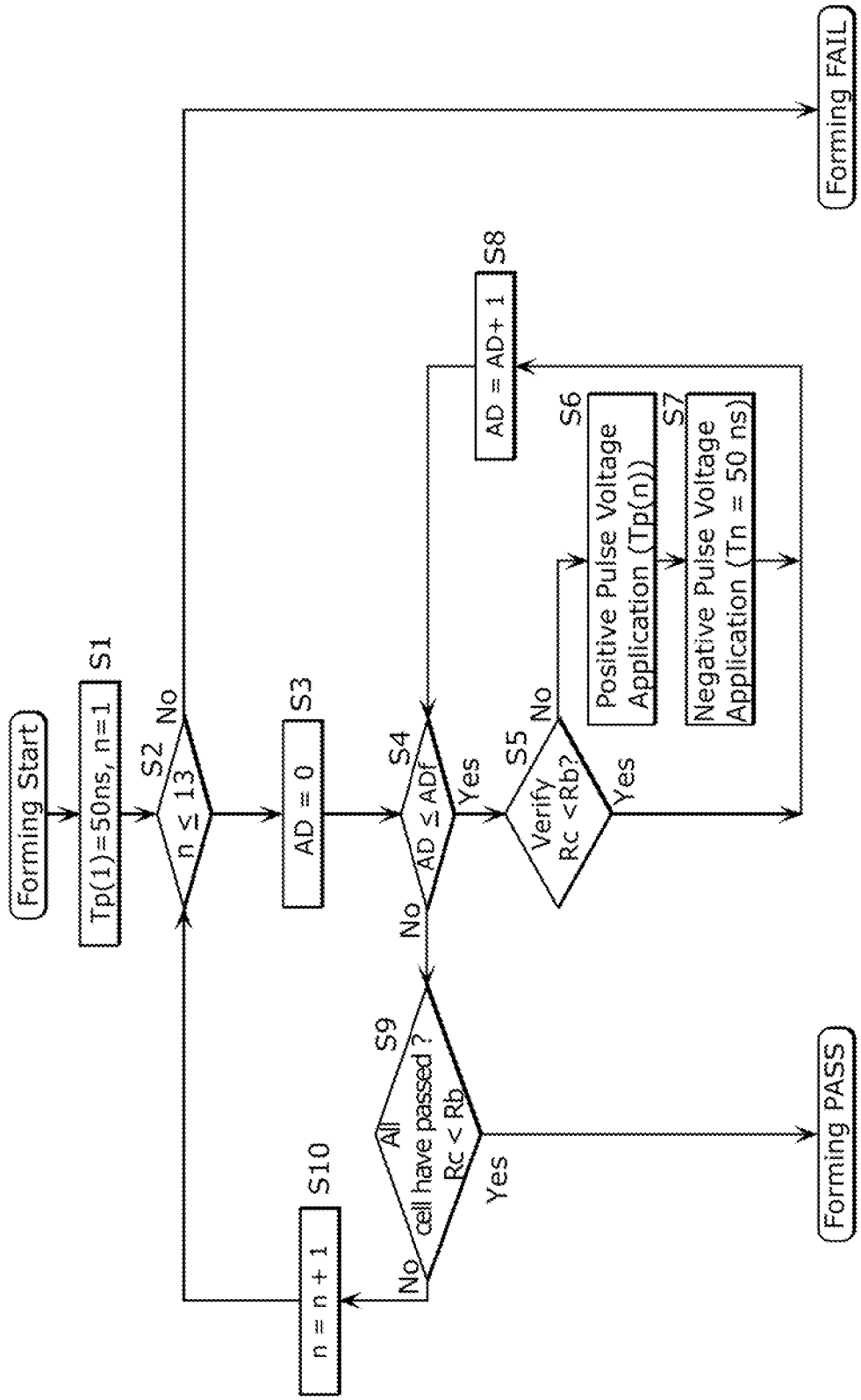
[FIG. 20]

Next, the description is given for an example of the forming operations for the nonvolatile memory device 200 with reference to the forming flow shown in FIG. 20. As shown in FIG. 20, first, a pulse width of a positive voltage pulse VP (voltage VP=3.3 V) is set to Tp(1) (here, as one example, 50 ns), and a loop count variable n is initialized to 1 (S1: the first step).

Next, it is determined whether or not the loop count variable n is equal to or smaller than 13 (S2: the second step). If the loop count variable n is greater than 13 (No at the second step), then it is determined as a forming failure and the forming is terminated. On the other hand, if the loop count variable n is equal to or smaller than 13 (Yes at the second step), then an address AD of the memory cell is initialized (AD=0) (S3: the third step). Next, it is determined whether or not the address AD of the selected memory cell M11 is equal to or smaller than a final address ADf in the memory cell array 202 (S4: the fourth step).

As a result, if the address AD of the selected memory cell M11 is equal to or smaller than the final address ADf (Yes at the fourth step), then verification reading (S5: the fifth step (determination step)) is performed on the selected memory cell to determine whether or not a resistance value Rc of the selected memory cell is smaller than the reference resistance Rb (Rc<Rb). As a result, if the resistance value Rc of the selected memory cell is smaller than the forming reference resistance Rb (Rc<Rb) (Yes at the fifth step), then it is determined that the resistance value Rc is low enough to avoid the necessity of future forming, so that the address AD of the selected memory cell is incremented (S8: the eighth step) and a memory cell of a next address AD is selected. On the other hand, if the resistance value Rc of the selected memory cell is equal to or greater than the forming reference resistance Rb (Rc Rb) (No at the fifth step), then, by using the pulse width Tp(1) (for example, 50 ns) of the setting forming positive voltage pulse VP (for example, voltage VP=3.3 V), a forming positive voltage pulse (for example, +3.3 V, pulse width Tp(1)= 50 ns) is applied to the selected memory cell (S6: the sixth step (the first voltage application step)), and then, as preparation for a determination as to whether forming is successful, a negative voltage pulse (for example, −3.3 V, pulse width Tn=50 ns) is applied (S7: the seventh step (a part of the determination step)).

After that, the address AD of the selected memory cell is incremented (S8: the eighth step), and a memory cell of a next address AD is selected. Subsequently, the processing from the fourth step (S4) to the eighth step (S8) is repeated until an address AD of a selected memory cell becomes greater than the final address ADf. If it is determined at the fourth step (S4) that the address AD of the selected memory cell is greater than the final address ADf (AD>ADf) (No at the fourth step), then an external device such as a memory tester determines whether or not a resistance value Rc of each of the memory cells in the memory cell array 202 is smaller than the forming reference resistance Rb (Rc<Rb) (S9: the ninth step). If a resistance value Rc of each of the memory cells is not smaller than the reference resistance Rb (No at the ninth step), the loop count variable n is incremented by +1 so that n=2 (S10: the tenth step). Then, it is determined whether the loop count variable n is equal to or smaller than 13 (S2: the second step). After that, the processing from the second step (S2) to the tenth step (S10) is repeated until the loop count variable n becomes greater than 13 or until forming for all memory cells are passed at the ninth step (S9).

Here, a value of a width Tp(n) (where n is an integer of 1 or more, n =1, 2, 3 . . . ) of the forming positive voltage pulse is set to be as shown in the above-presented Table 1.

As described above, this forming flow includes: the determination step S5 for determining whether or not a resistance value of the variable resistance element 100 is smaller than the forming reference resistance Rb; the pulse application step S6 for applying, if it is determined that the resistance value is not smaller than the forming reference resistance Rb (No at S5), a forming positive voltage pulse (for example, +3.3 V, pulse width Tp(n)) having a pulse width that is equal to or longer than a pulse width (Th=TI=50 ns) used in normal writing; and the pulse application step S7 for applying a negative voltage pulse (for example, −3.3 V, a pulse width Tn=50 ns) as preparation for a determination as to whether or not forming is successful. Then, the determination step S5 and the pulse application steps S6 and 7 are repeated for each of the memory cells included in the memory cell array 202 (S4 to S8). Then, if there is any cell for which forming is not yet successful after applying the same positive voltage pulse and the same negative voltage pulse for a target memory cell for which forming is to be performed, the determination step S5 and the pulse application steps S6 and 7 are repeated again on all of the memory cells (S4 to S8).

It should be noted that FIG. 20 shows the flowchart example in which a target address AD is incremented at S8 after S7 to apply a positive voltage pulse with a corresponding pulse width to each of bits.

However, it is also possible that the processing returns to S5 after performing S7, and an address AD is incremented to a next bit after confirming a forming success of each bit.

By performing, as described above, according to the forming flow in which a pulse width of a forming positive voltage pulse steps up, it is possible to apply a positive voltage pulse and a negative voltage pulse only to a memory cell for which filament path generation is necessary. As a result, high-speed forming can be performed for the memory cell array.

The following describes operation examples in a data writing cycle, in a reading cycle, and in forming regarding the nonvolatile memory device 200 having the above-described structure with reference to the time charts shown in FIGS. 21(a) to (c) and FIG. 22 and the block diagram of the nonvolatile memory device 200 according to the embodiment of the present invention shown in FIG. 16.

FIG. 21(a) to (c) are time charts showing operation examples of the nonvolatile memory device 200 according to the embodiment of the present invention. Here, the operation examples are described assuming that data "0" is assigned to the situation where a variable resistance layer is in a high resistance state and data "1" is assigned to the situation where a variable resistance layer is in a low resistance state. The description is given only for the case of data writing and reading for the memory cell M11.

In the data "1" writing cycle for the memory cell M11 shown in FIG. 21(a), first, a selected bit line BL0 is set to have a voltage VH (for example, 2.4 V) and a selected source line SL0 is set to have a voltage VL (for example, 2.4 V). Next, a selected word line WL0 is set to have a voltage VL (for example, 2.4 V). Here, the NMOS transistor N11 in the selected memory cell M11 shown in FIG. 16 is still OFF. At this state, since the same voltage of 2.4 V is applied to both the drain terminal and the source terminal of the NMOS transistor N11 in FIG. 16, a current does not flow whichever the transistor is ON or OFF.

Next, the selected bit line BL0 is set to have a voltage of 0 V for a predetermined time period (for example, TI=50 ns), and after the predetermined time period, a pulse waveform of the voltage VH (for example, 2.4 V) is applied again. At this state, the LR writing voltage pulse (for example, voltage=− 2.4 V) is applied to the memory cell M11 in FIG. 16, so as to perform writing to change from the high resistance value to a low resistance value. After that, the word line WL0 is set to have a voltage 0 V, and the data "0" writing is completed. In other words, first, memory cells are selected in a row direction by the source line and the world line, and then, a pulse waveform in a negative voltage direction is applied to a certain bit line, so that the negative voltage pulse is applied to the variable resistance element in the memory cell selected by the source line, the word line, and the bit line to change the resistance state to the low resistance state.

In the data "0" writing for the memory cell M11 shown in FIG. 21(b), first, a selected bit line BL0 and a selected source line SL0 are set to have a voltage of 0 V. Next, a selected word line WL0 is set to have a voltage VL (for example, 2.4 V), so that the NMOS transistor N11 in the selected memory cell M11 shown in FIG. 16 is turned ON.

Next, the selected bit line BL0 is set to have the voltage VH (for example, 2.4 V) equal to the voltage VL for a predetermined time period (for example, Th=50 ns), and after the predetermined time period, a pulse waveform is applied to achieve the voltage of 0 V again. At this state, a positive voltage pulse (in other words, a HR writing voltage pulse) is applied to the memory cell M11 in FIG. 16, so as to perform writing to change the low resistance value to a high resistance value. After that, the word line WL0 is set to have a voltage of 0 V, and the data "0" writing is completed. In other words, first, memory cells are selected in a row direction by a source line and a world line, and then, a pulse waveform in a positive voltage direction is applied to a certain bit line, so that the positive voltage pulse is applied to the variable resistance element in the memory cell selected by the source line, the word line, and the bit line to change the resistance state to the high resistance state. However, the present invention is not limited to this method.

In the data reading cycle for the memory cell M11 shown in FIG. 21(c), first, a selected bit line BL0 and a selected source line SL0 are set to have a voltage of 0 V. Next, a selected word line WL0 is set to have a voltage VDD (for example, 1.8 V), so that the NMOS transistor N11 in the selected memory cell M11 is turned ON.

Next, a selected bit line BL0 is set to have a read voltage Vread having a predetermined voltage (for example, 0.4 V), and the sense amplifier 204 detects a value of a current flowing in the selected memory cell M11 so as to determine whether or not the recorded data is data "0" or data "1". After that, the word line WL0 is set to have the voltage of 0 V, and the data reading is completed.

Next, the forming of the nonvolatile memory device 200 according to the present embodiment of the present invention is described.

Figure 22:
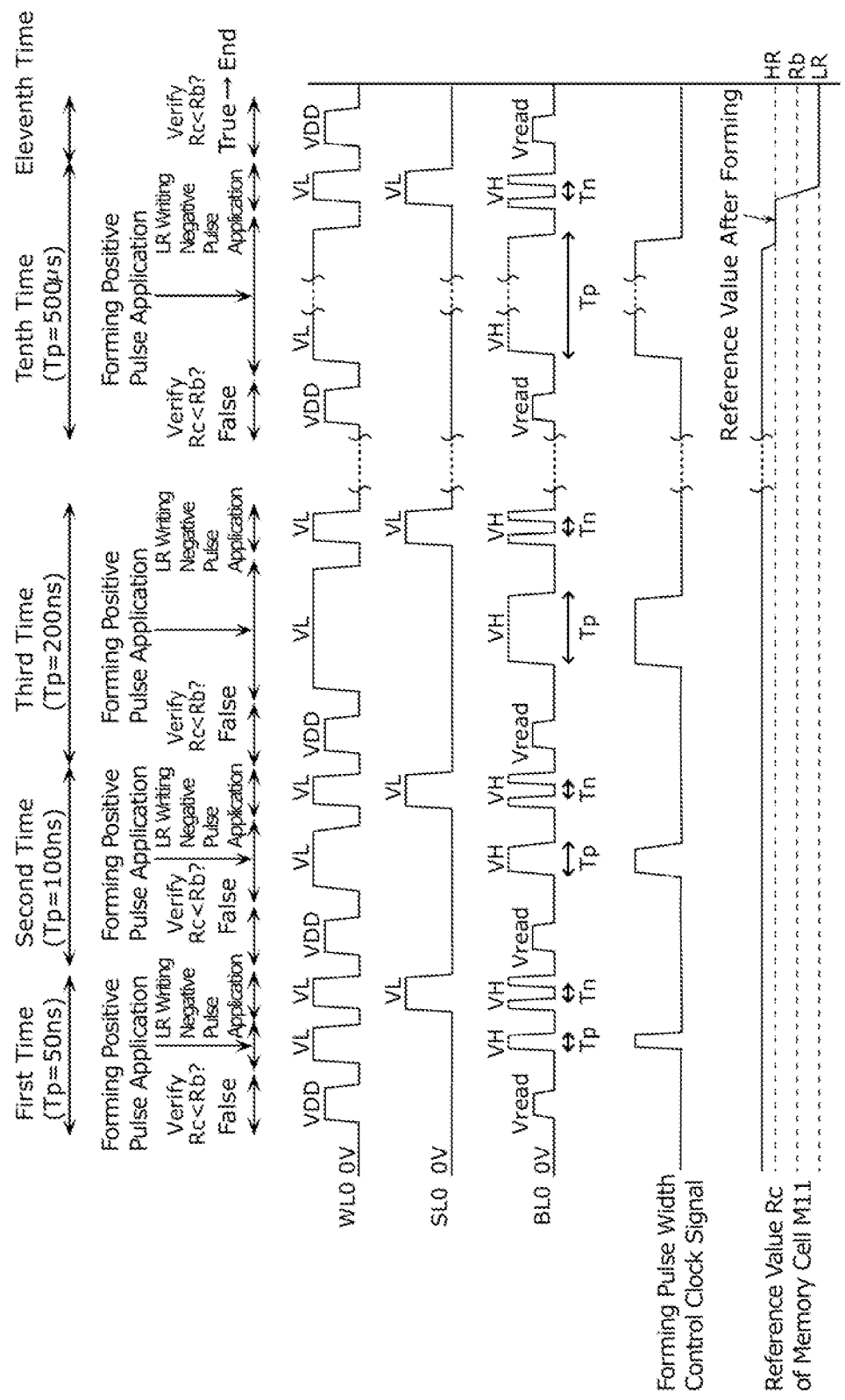
[FIG. 22]

FIG. 22 is a time chart of an example of the forming for the variable resistance nonvolatile memory device 200 according to the embodiment of the present invention. In the forming shown in FIG. 22, by accessing only one bit of the memory cell M11 having the address AD of 0, the forming flows shown in FIG. 20 is achieved for the bit, not for the array (however, S4 and S8 are eliminated because of the one-bit access).

In FIG. 22, when the forming starts, each voltage state of the word line WL0, the bit line BL0, and the source line SL0 of the target memory cell M11 is 0 V, and each of the forming pulse width control clock signal and the terminal DQ is in a L level. The memory cell M11 is in an initial state.

At first, at the first step (S1) in the flowchart shown in FIG. 20, by setting a pulse width of the forming pulse width control clock signal to 50 ns, a pulse width Tp(1) of a positive voltage pulse VP (for example, voltage VP=3.3 V) is set to 50 ns, and the loop count variable n is initialized to 1, so that the variable pulse width writing circuit 206 can apply a positive voltage pulse (for example, voltage=+3.3 V, Tp(1)=50 ns).

Next, at the second step (S2), it is determined that the loop count variable n is equal or smaller than 13, then at the third step (S3), the address AD of the memory cell is initialized (AD=0), and the processing proceeds to the fifth step (S5).

At the fifth step, in order to perform a verification reading to verify whether or not the resistance value Rc of the selected memory cell is smaller than the forming reference resistance Rb (Rc<Rb), the selected word line WL0 is set to have a voltage VDD (for example, 1.8 V), thereby turning ON the NMOS transistor N11 in the selected memory cell M11.

Next, the selected bit line BL0 is set to have the read voltage Vread (for example, 0.4 V) for a predetermined time period. The sense amplifier 204 detects a value of the current flowing in the selected memory cell M11 to determine whether or not the reference value Rc of the selected memory cell M11 is smaller than the forming reference resistance Rb (Rc<Rb). Here, since it is determined that the reference value Rc is equal to or greater than the forming reference resistance Rb, the sense amplifier output SAO outputs a L level, provides data "0" to the terminal DQ, and informs the external device (a memory tester, for example) of that the forming fails (false) (here, necessity of forming). After that, each of the word line WL0 and the bit line BL0 is set to have a voltage of 0 V, and the verification reading is completed.

Next, in order to apply the forming positive voltage pulse (for example, +3.3 V, pulse width Tp(1)=50 ns) shown in FIG. 20 is applied to the selected memory cell (the sixth step (S6)), first, the selected bit line BL0 and the selected source line SL0 are set to have a voltage of 0 V. Next, the selected word line WL0 is set to have a voltage VL (for example, 3.3 V), so that the NMOS transistor N11 in the selected memory cell M11 shown in FIG. 16 is turned ON. Next, according to the forming pulse width clock signal, the selected bit line BL0 is set to have the voltage VH (for example, 3.3 V) for a predetermined time period (Tp(1)=50 ns), and after the predetermined time period, a pulse waveform is applied to achieve the voltage of 0 V again. At this stage, it is assumed that the resistance value Rc of the memory cell M11 shown in FIG. 16 is still in the initial state and the forming is not successful. In short, here, the forming fails. After that, the word line WL0 is set to have the voltage of 0 V, and the application of the positive voltage pulse is completed.

Next, as preparation for the verification reading shown in FIG. 20, in order to apply a negative voltage pulse (for example, −3.3 V, pulse width Tn=50 ns) is applied to the selected memory cell (the seventh step (S7)), first, the selected bit line BL0 is set to have the voltage VH (for example, 3.3 V) and the selected source line SL0 is set to have the voltage VL (for example, 3.3 V). Next, a selected word line WL0 is set to have a voltage VL (for example, 3.3 V). Here, the NMOS transistor N11 in the selected memory cell M11 shown in FIG. 16 is still OFF. At this state, since the same voltage of 3.3 V is applied to both the drain terminal and the source terminal of the NMOS transistor N11 in FIG. 16, a current does not flow whichever the transistor is ON or OFF.

Next, the selected bit line BL0 is set to have a voltage of 0 V for a predetermined time period (for example, Tn=50 ns), and after the predetermined time period, a pulse waveform of the voltage VH (for example, 3.3 V) is applied again. At this state, the LR writing voltage pulse (for example, -3.3 V) is applied to the memory cell M11 in FIG. 16, but the forming is not successful for the selected memory cell M11 and the resistance state is not changed to close to a low resistance state. After that, the word line WL0 is set to have the voltage of 0 V, and the application of the negative voltage pulse is completed.

After that, at the ninth step, it is confirmed that the determination at the fifth step is made that the forming fails (false) (not shown in FIG. 22), then the processing proceeds to the tenth step, then the loop count variable n is incremented by +1, and setting is performed as n=2.

Next, at the second step, it is determined that the loop count variable n is equal or smaller than 13, then at the third step, the address AD of the memory cell is initialized (AD=0), and the processing proceeds to the fifth step.

At the fifth step for the second time, the verification reading (Rc<Rb?) is performed in the same manner as the fifth step for the first time. Now, the resistance value Rc of the selected memory cell M11 is still in the initial resistance state and is equal to or greater than the forming reference resistance Rb. Therefore, the sense amplifier output SAO outputs a L level, outputs "0" data to the terminal DQ, notifies the external device (such as a memory tester) that the forming fails (false), and completes the verification reading.

Next, in order to apply the forming positive voltage pulse (for example, +3.3 V, pulse width Tp(2)=100 ns) shown in FIG. 20 is applied to the selected memory cell (the sixth step), first, the selected bit line BL0 and the selected source line SL0 are set to have a voltage of 0 V. Next, the selected word line WL0 is set to have a voltage VL (for example, 3.3 V), so that the NMOS transistor Nil in the selected memory cell M11 shown in FIG. 16 is turned ON. Next, according to the forming pulse width clock signal, the variable pulse width writing circuit 206 sets the selected bit line BL0 to have the voltage VH (for example, 3.3 V) for a predetermined time period (for example, Tp(2)=100 ns), and after the predetermined time period, applies a pulse waveform to achieve the voltage of 0 V again. At this stage, it is assumed that the memory cell M11 shown in FIG. 16 is still in the initial state and the forming is not successful. In short, here, the forming fails. After that, the word line WL0 is set to have the voltage of 0 V, and the application of the positive voltage pulse is completed.

Next, as preparation for the verification reading shown in FIG. 20, in order to apply a negative voltage pulse (for example, −3.3 V, pulse width Tn=50 ns) is applied to the selected memory cell (the seventh step), first, the selected bit line BL0 is set to have the voltage VH (for example, 3.3 V) and the selected source line SL0 is set to have the voltage VL (for example, 3.3 V). Next, the selected word line WL0 is set to have the voltage VL (for example, 3.3 V). Here, the NMOS transistor N11 in the selected memory cell M11 shown in FIG. 16 is still OFF. At this state, since the same voltage of 3.3 V is applied to both the drain terminal and the source terminal of the NMOS transistor N11 in FIG. 16, a current does not flow whichever the transistor is ON or OFF.

Next, the selected bit line BL0 is set to have a voltage of 0 V for a predetermined time period (for example, Tn=50 ns), and after the predetermined time period, a pulse waveform of the voltage VH (for example, 3.3 V) is applied again. At this state, the LR writing voltage pulse (for example, -3.3 V) is applied to the memory cell M11 in FIG. 16, but the forming is not successful for the selected memory cell M11 and the resistance state is not changed to close to a low resistance state. After that, the word line WL0 is set to have the voltage of 0 V, and the application of the negative voltage pulse is completed.

After that, the loop from the second step to the tenth step (except the fourth and eighth steps) in FIG. 20, namely, the verification reading, the positive voltage pulse application, and the negative voltage pulse application, is repeated three to nine times. However, the resistance value Rc of the memory cell M11 is still in the initial state and is still equal to or greater than the reference resistance Rb. In short, here, the forming fails.

After that, at the ninth step, it is confirmed that the determination at the fifth step is made that the forming fails (false) (not shown in FIG. 22), then the processing proceeds to the tenth step, then the loop count variable n is incremented by +1, and setting is performed as n=10.

Next, at the second step, it is determined that the loop count variable n is equal or smaller than 13, then at the third step, the address AD of the memory cell is initialized (AD=0), and the processing proceeds to the fifth step.

At the fifth step for the tenth time, the verification reading (Rc<Rb ?) is performed in the same manner as the fifth step for the first time. Now, the resistance value Rc of the selected memory cell M11 is still in the initial resistance state and is equal to or greater than the forming reference resistance Rb. Therefore, the sense amplifier output SAO outputs a L level, outputs "0" data to the terminal DQ, notifies the external device (such as a memory tester) that the forming fails (false), and completes the verification reading.

Next, in order to apply the forming positive voltage pulse (for example, +3.3 V, pulse width Tp(10)=500 μs) shown in FIG. 20 is applied to the selected memory cell (the sixth step), first, the selected bit line BL0 and the selected source line SL0 are set to have a voltage of 0 V.

Next, the selected word line WL0 is set to have a voltage VL (for example, 3.3 V), so that the NMOS transistor N11 in the selected memory cell M11 shown in FIG. 16 is turned ON. Next, according to the forming pulse width clock signal, the selected bit line BL0 is set to have the voltage VH (for example, 3.3 V) for a predetermined time period (for example, Tp(10)=500 μs), and after the predetermined time period, a pulse waveform is applied to achieve the voltage of 0 V again. At this stage, the forming positive voltage pulse having the long pulse width Tp(10) (for example, 500 μs) is applied to the memory cell M11 shown in FIG. 16. Therefore, in the selected memory cell M11, a conducting path has been generated since the initial high resistance state, and the resistance value is changed to a resistance value close to the high resistance state HR after the forming. As a result, the forming has been performed. It means that the forming is successful. After that, the word line WL0 is set to have the voltage of 0 V, and the application of the positive voltage pulse is completed.

Next, as preparation for the verification reading shown in FIG. 20, in order to apply a negative voltage pulse (for example, -3.3 V, pulse width Tn=50 ns) is applied to the selected memory cell (the seventh step), first, the selected bit line BL0 is set to have the voltage VH (for example, 3.3 V) and the selected source line SL0 is set to have the voltage VL (for example, 3.3 V). Next, the selected word line WL0 is set to have the voltage VL (for example, 3.3 V). Here, the NMOS transistor N11 in the selected memory cell M11 shown in FIG. 16 is still OFF. At this state, since the same voltage of 3.3 V is applied to both the drain terminal and the source terminal of the NMOS transistor N11 in FIG. 16, a current does not flow whichever the transistor is ON or OFF.

Next, the selected bit line BL0 is set to have a voltage of 0 V for a predetermined time period (for example, Tn=50 ns), and after the predetermined time period, a pulse waveform of the voltage VH (for example, 3.3 V) is applied again. At this state, the LR writing voltage pulse (for example, -3.3 V) is applied to the memory cell M11 in FIG. 16, and the forming is successful for the selected memory cell M11. Therefore, the resistance state is changed from the high resistance state (HR) to the low resistance state (LR). After that, the word line WL0 is set to have the voltage of 0 V, and the application of the negative voltage pulse is completed.

After that, at the ninth step, it is confirmed that the determination at the fifth step is made that the forming fails (false), then the io processing proceeds to the tenth step, then the loop count variable n is incremented by +1, and setting is performed as n=11.

Next, at the second step, it is determined that the loop count variable n is equal or smaller than 13, then at the third step, the address AD of the memory cell is initialized (AD=0), and the processing proceeds to the fifth step.

At the fifth step for the eleventh time, the verification reading (Rc <Rb ?) is performed. Now, the resistance value Rc of the selected memory cell M11 is smaller than the forming reference resistance Rb. Therefore, the sense amplifier output SAO outputs a H level, outputs "1" data to the terminal DQ, notifies the external device (such as a memory tester) that the forming is passed (true), and completes the verification reading.

After that, at the ninth step, it is confirmed that the determination at the immediately-prior fifth step is made that the forming is passed (true), and the forming is completed.

Figure 21:
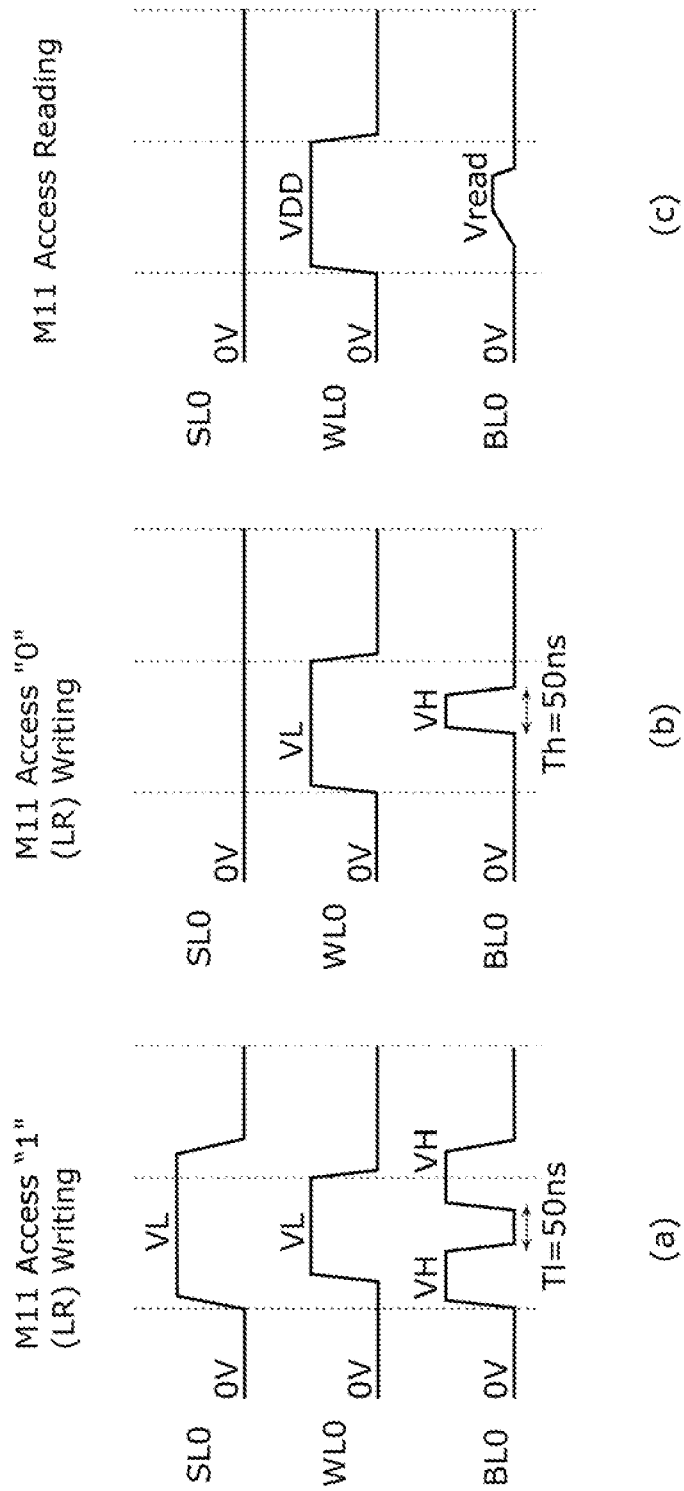
[FIG. 21]

After the forming, as shown in FIG. 21, a voltage of a HR writing voltage pulse is set to, for example, +2.4 V, a voltage of a LR writing voltage pulse is se to, for example, -2.4 V, and a pulse width (Th=Tl) is sent to, for example, 50 ns. Therefore, normal "0" data writing (HR writing) and normal "1" data writing (LR writing) are allowed.

Figure 23:
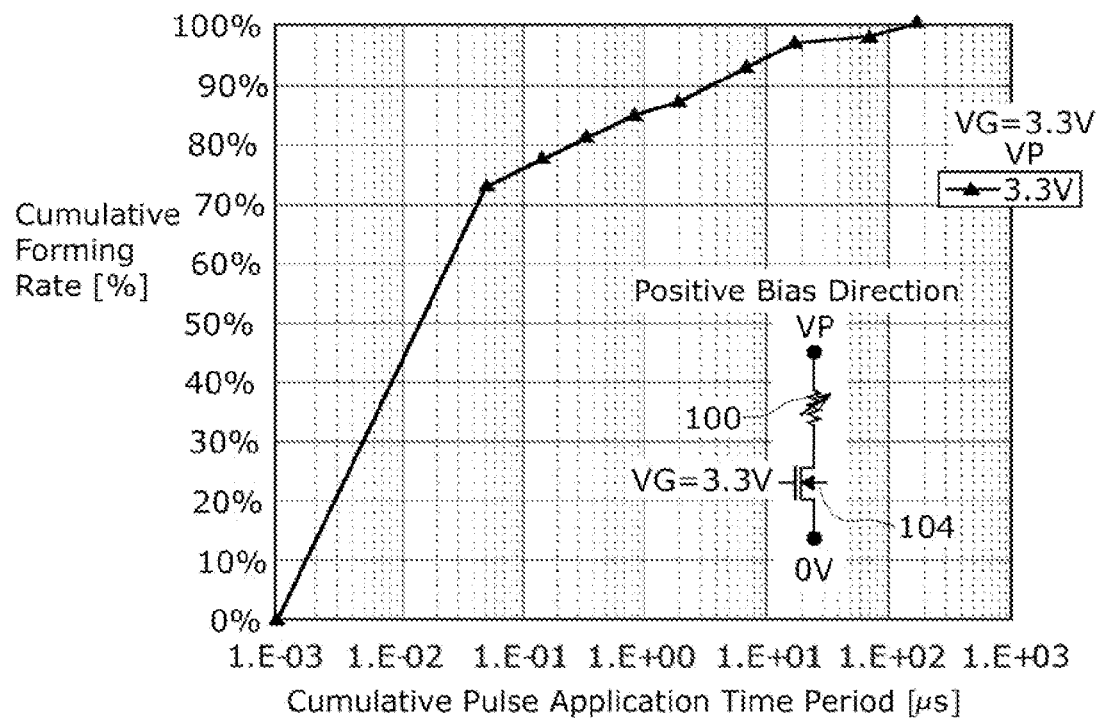
[FIG. 23]

FIG. 23 shows a relationship between a cumulative pulse application time period and a cumulative forming ratio in the case where, as described above, based on the forming flow shown in FIG. 20, forming is performed on the array (256 Kbits) of the 1T1R memory cells shown in FIG. 16 to generate a conducting path for each of the memory cells.

A horizontal axis in FIG. 23 indicates a cumulative pulse application time period of each of the memory cells in the case where a positive voltage pulse (for example, a pulse voltage VP: 3.3 V) with a pulse width Tp(n) (where n is an integer from 1 to 13) is applied to the memory cell shown in FIG. 29. A vertical axis in FIG. 23 indicates a cumulative forming ratio in the array.

As shown in FIG. 23, when the positive voltage pulse width is gradually increased in the forming, the forming is progressed and successful in every memory cell in the array (256 Kbits), by application of a positive voltage pulse (for example, voltage VP=+3.3 V) for a cumulative pulse application time period of approximately 167 μs at maximum.

Figure 24:
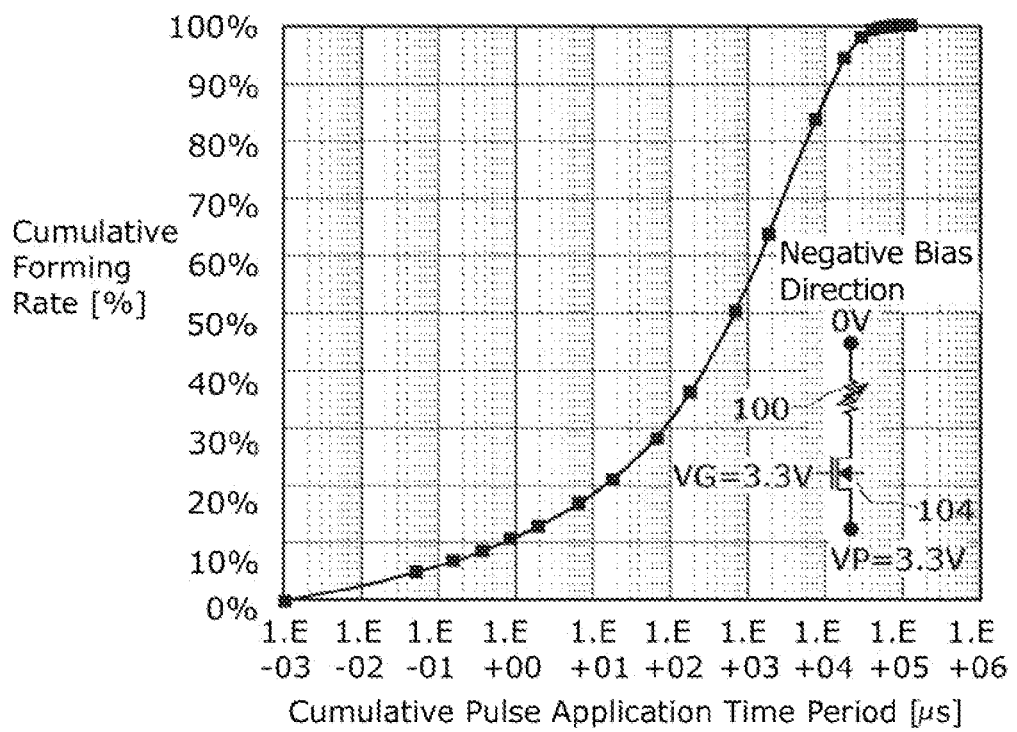
[FIG. 24]
Figure 25:
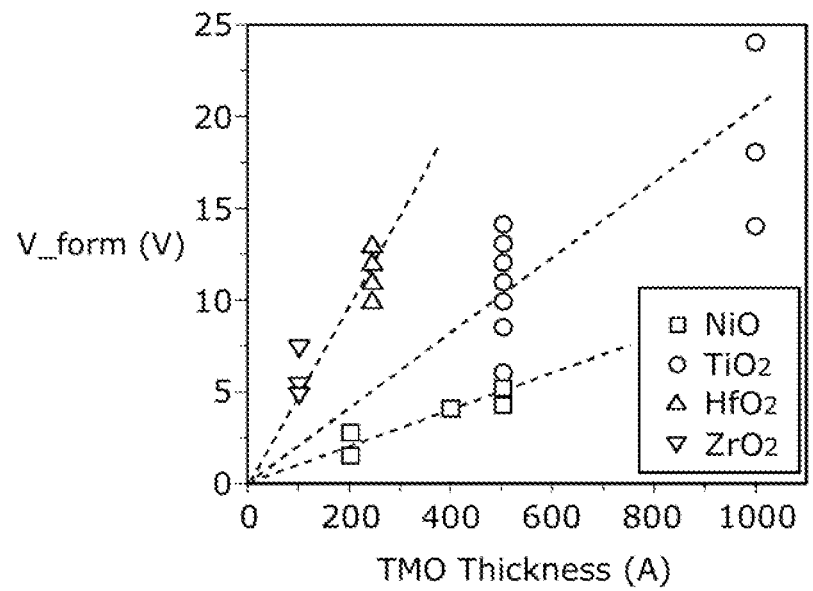
[FIG. 25]
Figure 26:
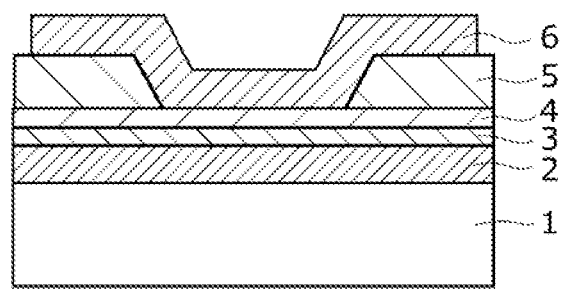
[FIG. 26]
Figure 27:
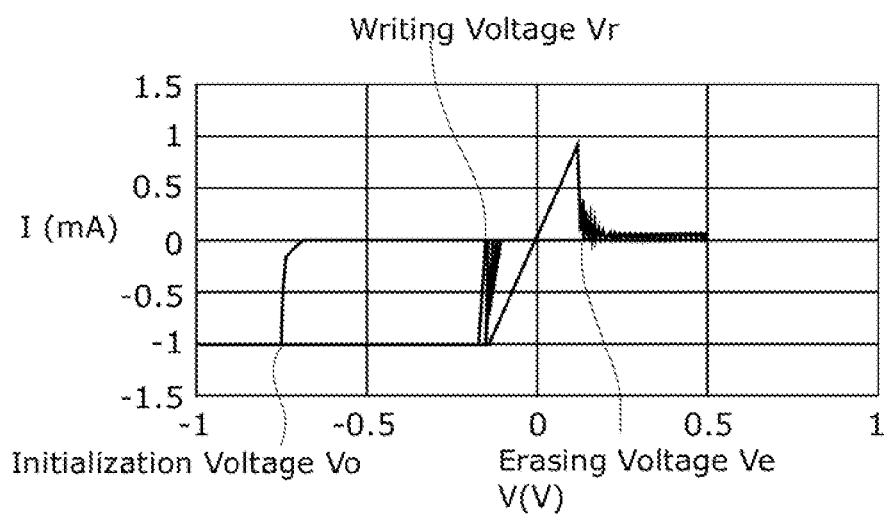
[FIG. 27]
Figure 28:
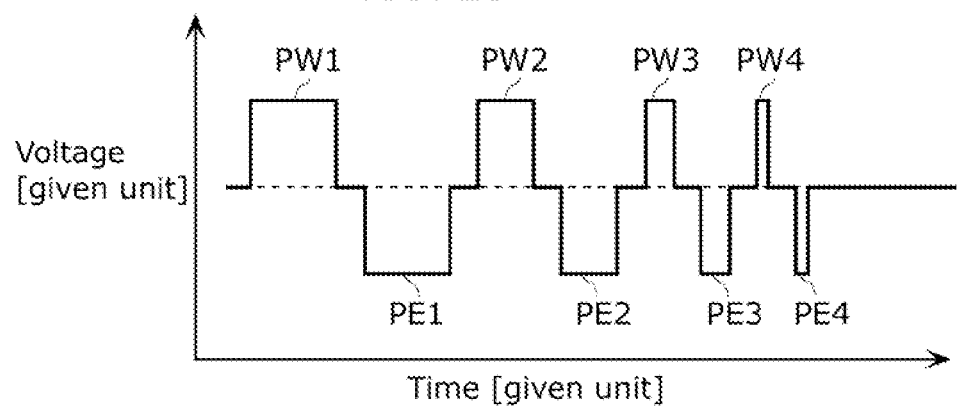
[FIG. 28]

Moreover, as reference data, FIG. 24 shows a relationship between a cumulative pulse application time period and a cumulative forming ratio in the case where, in the forming flow shown in FIG. 20, Step S7 is eliminated, a forming pulse application direction at Step S6 is set to be a negative voltage application direction (LR writing direction), and a negative voltage pulse width is gradually increased to perform forming. A vertical axis and a horizontal axis are the same as those in FIG. 23. As shown in FIG. 24, at the negative voltage pulse application, a source voltage of the NMOS transistor 104 is increased by flow of a forming current, and eventually a driving current of the NMOS transistor 104 is reduced. It takes a forming time period (approximately 117 ms) that is longer by approximately three digits than the maximum forming time period (167 μs) of a positive voltage in FIG. 23, to perform forming for all bits (256 Kbits) in the array. Therefore, it is not efficient.

Therefore, in the conventional method, in the case where of a pulse width of a forming positive voltage pulse is, for example, 50 ns, a cumulative forming rate is approximately 73% (see FIG. 23: the cumulative forming rate distribution with respect to a cumulative pulse application time period in the case of VG=VP=3.3 V) and forming is not successful for all of the cells (256 kb). However, by using the forming flow in which forming is performed gradually increasing a positive voltage pulse width as shown in FIG. 20, it is possible to perform forming for all cells, within a practical voltage io range and without increasing an array area (a gate width W of an NMOS transistor is 0.44 μm). Furthermore, application of a positive voltage pulse and application of a negative voltage pulse can be additionally performed only for memory cells for which forming is necessary. Therefore, it is possible to efficiently perform the forming for the memory cell array. Moreover, by setting the pulse width Tn of the negative voltage pulse to be the same as the pulse width of the HR writing voltage pulse and the LR writing voltage pulse in the normal data writing (in the embodiment, Tn=Th=Tl=50 ns), it is possible to prevent the troubles that the resistance state becomes unchangeable from further LR state and to achieve a reliable forming technique.

It should be noted that as apparent from comparison between FIG. 23 and FIG. 24, in the case where the forming by a positive voltage pulse (application of a positive voltage pulse to the upper electrode with reference to the lower electrode) is compared to the forming by a negative voltage pulse (application of a negative voltage pulse to the upper electrode with reference to the lower electrode), the forming by a positive voltage pulse is more efficient, but both of the formings can increase the cumulative forming rate in accordance with the increase of the cumulative pulse application time period. Therefore, the present invention in which forming is tried while the pulse width of the first voltage pulse is increased until the forming becomes successful can be applied, of course, not only to the forming by a positive voltage pulse but also to the forming by a negative voltage pulse.

Although the forming method and the variable resistance nonvolatile memory device according to the present invention have been described with reference to the embodiments and variations as above, the present invention is not limited to these embodiments. Those skilled in the art will be readily appreciated that various modifications and desirable combinations of the steps and structural elements in the embodiments and variations are possible without materially departing from the novel teachings and advantages of the present invention.

For example, although it has been described in the embodiments that the upper electrode in the variable resistance element 100 is made of Ir, the upper electrode may be an alloy electrode made of Ir and Pt, for example.

Furthermore, although it has been described in the embodiments that the variable resistance layer (namely, transition metal oxide layer) in the variable resistance elements 100 is made of tantalum oxide ($TaO_x$), the variable resistance layer is not limited to tantalum oxide, but may be any transition metal oxide, such as hafnium oxide or zirconium oxide, which is changed to a low resistance state when a voltage (LR writing voltage pulse) equal to or higher than a predetermined voltage (for example, a first threshold voltage) is applied to a lower electrode terminal with reference to an upper electrode terminal and changed to a high resistance state when a voltage (HR writing voltage pulse) equal to or higher than another predetermined voltage (for example, a second threshold voltage) is applied to the upper electrode terminal with reference to the lower electrode terminal, and the same effects as those in the present invention can be produced.

More specifically, the structure and the materials of the variable resistance element 100 included in the memory cell on which the forming method according to the present invention is to be performed are as follows. As shown in FIG. 29, the variable resistance element 100 according to the present embodiments includes a lower electrode 100a, a variable resistance layer 100b, and an upper electrode 100c. Here, the variable resistance layer 100b includes a first transition metal oxide layer 100b-1 and a second transition metal oxide layer 100b-2 which is stacked on the first transition metal oxide layer 100b-1. The first transition metal oxide layer 100b-1 comprises an oxygen-deficient transition metal oxide. The second transition metal oxide layer 100b-2 comprises a transition metal oxide having an oxygen deficient degree lower than that of the first transition metal oxide layer 100b-1. In the present embodiments, as one example, io the variable resistance layer 100b includes a first oxygen-deficient tantalum oxide layer (hereinafter, referred to as a "first Ta oxide layer") as the first transition metal oxide layer 100b-1 and a second tantalum oxide layer (hereinafter, referred to as a "second Ta oxide layer") as the second transition metal oxide layer 100b-2 which is stacked on the first oxygen-deficient tantalum oxide layer. Here, an oxygen content percentage of the second Ta oxide layer is higher than an oxygen content percentage of the first Ta oxide layer. In other words, an oxygen deficient degree of the second Ta oxide layer is smaller than an oxygen deficient degree of the first Ta oxide layer. The oxygen deficient degree is defined as a ratio of a deficient oxygen to an amount of oxygen included in the stoichiometric composition oxygen, in each transition metal. For example, in the case where a transition metal is tantalum (Ta), since the composition of the stoichiometric oxide is $Ta_2O_5$, it can be expressed as $TaO_{2.5}$. An oxygen deficient degree of TaO2.5 is 0%. For example, for an oxygen deficient degree of an oxygen-deficient tantalum oxide having a $TaO_{1.5}$ composition, the oxygen deficient degree=(2.5-1.5)/2.5=40%. Furthermore, an oxygen content percentage of $Ta_2O_5$, which is a ratio of oxygen to a total atom number (O/(Ta+O)), is 71.4 atm %. Therefore, the oxygen content percentage of an oxygen-deficient tantalum oxide is greater than 0 and less than 71.4 atm %.

The metal included in the variable resistance layer 100b may be other transition metal except tantalum. For the transition metal, tantalum (Ta), titanium (Ti), hafnium (Hf), zirconium (Zr), niobium (Nb), tungsten (W), or the like may be used. Since a transition metal is capable of being in various oxidation states, different resistance states can be achieved by oxidation reductive reaction. For example, it is confirmed that, in the case of using hafnium oxide where x ranges from 0.9 to 1.6 when the composition of the first hafnium oxide layer as the first transition metal oxide layer 100b-1 is $HfO_x$, and y is greater than a value of x when the composition of the second hafnium oxide layer as the second transition metal oxide layer 100b-2 is $HfO_y$, it is possible to change the resistance value of the variable resistance layer 100b steadily and at a high speed. In this case, it is desirable that a thickness of the second hafnium oxide layer ranges from 3 nm to 4 nm. Furthermore, it is confirmed that, in the case of zirconium oxide where x ranges from 0.9 to 1.4 when the composition of the first zirconium oxide layer is $ZrO_x$ and y is greater than a value of x when the composition of the second zirconium oxide layer is $ZrO_y$, it is possible to change the resistance value of the variable resistance layer 100b steadily and at a high speed. In this case, it is desirable that a thickness of the second zirconium oxide layer ranges from 1 nm to 5 nm.

It should be noted that the first transition metal included in the first transition metal oxide layer 100b-1 may be different from the second transition metal included in the second transition metal oxide layer 100b-2. In this case, it is desirable that the second transition metal oxide layer 100b-2 has an oxygen deficient degree lower than that of the first transition metal oxide layer 100b-1, in other words, resistance higher than that of the first transition metal oxide layer 100b-1. With the above structure, a voltage applied between the lower electrode 100a and the upper electrode 100c in resistance changing is distributed more to the second transition metal oxide layer 100b-2, so that oxidation reductive reaction is easily occurred in the second transition metal oxide layer 100b-2. In addition, if the material of the first transition metal is different from the material of the second transition metal, it is desirable that a standard electrode potential of the second transition metal is lower than a standard electrode potential of the first transition metal. This is because it is considered that the resistance changing phenomenon occurs when oxidation reductive reaction occurs in a refine filament (conducting path) generated in the high-resistance second transition metal oxide layer 100b-2 and the resistance value of the second transition metal oxide layer 100b-2 is changed. For example, if the first transition metal oxide layer 100b-1 comprises an oxygen-deficient tantalum oxide and the second transition metal oxide layer 100b-2 comprises a titanium oxide ($TiO_2$), it is possible to achieve stable resistance changing. Titanium (with a standard electrode potential=−1.63 eV) is a material having a standard electrode potential lower than that of tantalum (with a standard electrode potential=−0.6 eV). A standard electrode potential having a larger value indicates less likeliness to be oxidized. If a metal oxide having a standard electrode potential lower than that of the first transition metal oxide layer 100b-1 is used in the second transition metal oxide layer 100b-2, oxidation reductive reaction is more likely to occur in the second transition metal oxide layer 100b-2.

With any of the above-described materials, the resistance changing phenomenon in the variable resistance layer having a multi-layered structure is considered to be occurred when oxidation reductive reaction occurs in a refine filament generated in the high-resistance second transition metal oxide layer 100b-2 and the resistance value of the second transition metal oxide layer 100b-2 is changed. More specifically, if a positive voltage is applied to the upper electrode 100c in contact with the second transition metal oxide layer 100b-2 with reference to the lower electrode 100a, it is considered that oxidation reaction occurs in a refine filament generated in the second transition metal oxide layer 100b-2 when oxygen ion in the variable resistance layer 100b is attracted towards the second transition metal oxide layer 100b-2, and then resistance of the refine filament is increased. On the other hand, when a negative voltage is applied to the upper electrode 100c in contact with the second transition metal oxide layer 100b-2 with reference to the lower electrode 100a, it is considered that oxygen ion in the second transition metal oxide layer 100b-2 is pushed towards the first transition metal oxide layer 100b-1, reductive reaction occurs in a refine filament generated in the second transition metal oxide layer 100b-2, and then resistance of the refine filament is decreased.

The upper electrode 100c in contact with the second transition metal oxide layer 100b-2 having a smaller oxygen deficient degree is made of a material, such as platinum (Pt) or iridium (Ir), which has a standard electrode potential higher than that of the transition metal included in the second transition metal oxide layer 100b-2 and the material included in the lower electrode 100a. With the above structure, in a part of the second transition metal oxide layer 100b-2 which is close to the interface between the upper electrode 100c and the second transition metal oxide layer 100b-2, oxidation reductive reaction occurs selectively, and stable resistance changing phenomenon is obtained.

It should also be noted that an NMOS transistor is used as the selection transistor in the 1T1R memory cell in the embodiments, but a PMOS transistor may also be used as the selection transistor. In this case, it is desirable that a source of the PMOS transistor is connected to a positive potential (in other words, a drain of the PMOS transistor is connected to the variable resistance element). As a result, it is possible to ensure higher current driving performance.

In addition, although it has been described in the embodiments that the selection transistor is used as the switch element, it is also possible to use a bi-directional diode as the switch element in a cross-point array.

It should also be noted in the embodiments that the pulse width Tn of the negative voltage pulse in the forming is set to the same as the pulse width Th of the high resistance writing voltage pulse and the pulse width Tl of the low resistance voltage pulse in normal data writing, respectively, (for example, 50 ns), but the pulse widths Tn, Th, and Tl are not necessarily the same.

It should also be noted in the embodiments that in normal "0" and "1" data writing, the word line WL0 voltage (for example, +2.4 V), the voltage VP of the low resistance writing voltage pulse (for example, −2.4 V), and the voltage VP of the high resistance writing voltage pulse (for example, +2.4 V) are set to have the same absolute value, but they are not necessarily the same.

It should also be noted in the embodiments that the forming is necessary once prior to the first data writing. Therefore, it is possible that a forming voltage is applied directly from the outside, without providing the forming power source 500.

It should also be noted in the embodiments that the present invention can be implemented not only as (a) the forming method of performing forming on a variable resistance nonvolatile memory element and (b) the variable resistance nonvolatile memory device, but also as a variable resistance nonvolatile memory element. More specifically, the present invention can be implemented as the variable resistance nonvolatile memory element that has the same structure as that of the variable resistance element 100 shown in FIG. 29, with the following characteristics (1) to (4). (1) When a LR writing voltage pulse, which has a positive potential and a voltage equal to or higher than the first threshold voltage, is applied to the first electrode (the lower electrode 100a in the above-described embodiments) with reference to the second electrode (the upper electrode 100c in the above-described embodiments), the resistance state of the variable resistance element is changed to a low resistance state, and when a HR writing voltage pulse, which has a positive potential and a voltage equal to or higher than the second threshold voltage, is applied to the second electrode with reference to the first electrode, the resistance state of the variable resistance element is changed to a high resistance state. (2) In an initial state, the variable resistance element has non-linear current-voltage characteristics. (3) When a voltage pulse of a voltage equal to or higher than a predetermined voltage is applied in the initial state and is kept being applied for a predetermined time period, the forming is performed, and a time period required to complete the forming is determined in an exponential manner depending on a current flowing in the variable resistance nonvolatile memory element. (4) In the forming, as a cumulative pulse application time period of at least one applied voltage pulse is increased, a probability of forming success io (completion) is increased.

Industrial Applicability

The present invention, as (a) the forming method of performing forming on a variable resistance nonvolatile memory element and (b) the variable resistance nonvolatile memory device, can perform forming on the variable resistance nonvolatile memory device, which has memory cells each of which includes a variable resistance element with a variable resistance value varying depending on electrical signals and a switch element such as a transistor or the like, to perform forming within a practical voltage range and without increasing an array area. Therefore, the present invention is useful to implement a memory which is high-speed, reliable, and with a small area to be used in electronic devices such as mobile phones and notebook computers.

REFERENCE SIGNS LIST 100 variable resistance element (variable resistance nonvolatile memory element)
100a lower electrode (first electrode)
100b variable resistance layer (transition metal oxide layer)
100b-1 first transition metal oxide layer
100b-2 second transition metal oxide layer
100c upper electrode (second electrode)
101, 105 lower electrode terminal
102 upper electrode terminal
103 gate terminal
104 NMOS transistor
110 memory cell
200 variable resistance nonvolatile memory device
201 memory body
202 memory cell array
203 column selection circuit
204 sense amplifier
205 data input/output circuit
206 variable pulse width writing circuit
207 row driver
208 row selection circuit
209 address input circuit
210 control circuit
211 writing power source
212 low resistance (LR) writing power source
213 high resistance (HR) writing power source
218 current mirror circuit
219, 220 clamp transistor
221 reference circuit
222, 223 selection transistor
224 difference amplifier
225, 226 transistor
500 forming power source
702 normal operation reference current generation circuit
703 forming reference current generation circuit
704 comparison circuit

The invention claimed is:

1. A forming method of performing forming on a variable resistance nonvolatile memory element, by applying a voltage pulse to a memory cell in which the variable resistance nonvolatile memory element is connected in series with a switch element, so as to change a resistance state of the variable resistance nonvolatile memory element from an initial state after manufacturing to a changeable state, the initial state being higher than a high resistance state and having not yet been changed to the changeable state, and the changeable state being a state where the resistance state is reversibly changeable between the high resistance state and a low resistance state according to a polarity of an applied voltage pulse and being lower than the initial state, the variable resistance nonvolatile memory element including: a first electrode connected to the switch element; a second electrode; and an oxygen-deficient transition metal oxide layer provided between the first electrode and the second electrode, the oxygen-deficient transition metal oxide layer including: a first transition metal oxide layer in contact with the first electrode; and a second transition metal oxide layer in contact with the second electrode, the second transition metal oxide layer having an oxygen deficient degree lower than an oxygen deficient degree of the first transition metal oxide layer, the variable resistance nonvolatile memory element having:

characteristics by which the resistance state is changed to the low resistance state when a low resistance writing voltage pulse having a positive potential and equal to or higher than a first threshold voltage is applied to the first electrode with reference to the second electrode, and the resistance state is changed to the high resistance state when a high resistance writing voltage pulse having a positive potential and equal to or higher than a second threshold voltage is applied to the second electrode with reference to the first electrode;

non-linear current-voltage characteristics in the initial state; and characteristics by which as a current flowing in the variable resistance nonvolatile memory element is increased in the initial state, a time period required for the forming is decreased in an exponential manner, and the forming method comprising:

applying a first voltage pulse to the variable resistance nonvolatile memory element when the variable resistance nonvolatile memory element is in the initial state, the first voltage pulse (1) having (1-i) a positive potential at the second electrode with reference to the first electrode and an amplitude equal to or greater than an amplitude of a predetermined voltage higher than the second threshold voltage or (1-ii) a negative potential at the second electrode with reference to the first electrode and an amplitude equal to or greater than an amplitude of a predetermined voltage higher than the first threshold voltage, and the first voltage pulse (2) having a first pulse width; and determining whether or not the forming is successful by the applying of the first voltage pulse, wherein the applying of the first voltage pulse and the determining are repeated until it is determined in the determining that the forming is successful, and in the applying of the first voltage pulse in the repeating, a new first voltage pulse is applied to the variable resistance nonvolatile memory element, the new first voltage pulse having a pulse width longer than a pulse width of the first voltage pulse applied in the applying of the first voltage pulse which is performed immediately prior to the applying of the new first voltage pulse.

2. The forming method according to claim 1,
wherein in the applying of the first voltage pulse, as the first voltage pulse, a first positive voltage pulse is applied to the variable resistance nonvolatile memory element, the first positive voltage pulse (1) having an amplitude equal to or greater than an amplitude of the predetermined voltage having a positive potential at the second electrode with reference to the first electrode, and the first positive voltage pulse (2) having the first pulse width, and
in the determining, a first negative voltage pulse is applied to the variable resistance nonvolatile memory element, the first negative voltage pulse (1) having a voltage amplitude equal to or greater than a voltage amplitude of the low resistance writing voltage pulse, and the first negative voltage pulse (2) having a same polarity as a polarity of the low resistance writing voltage pulse, and after the applying of the first negative voltage pulse, it is determined whether or not the variable resistance nonvolatile memory element is in the low resistance state, so as to determine whether or not the forming is successful.

3. The forming method according to claim 2,
wherein a pulse width of the first negative voltage pulse is equal to a pulse width of the low resistance writing voltage pulse.

4. The forming method according to claim 2, further comprising
applying a second positive voltage pulse to the variable resistance nonvolatile memory element after the applying of the first negative voltage pulse in the determining, the second positive voltage pulse having a polarity, a voltage amplitude, and a pulse width which are equal to a polarity, the amplitude, and the first pulse width of the first positive voltage pulse, respectively.

5. The forming method according to claim 4,
wherein a pulse width of the first negative voltage pulse is longer than a pulse width of the low resistance writing voltage pulse.

6. The forming method according to claim 1,
wherein in the applying of the first voltage pulse in the repeating, the new first voltage pulse is applied to the variable resistance nonvolatile memory element, the new first voltage pulse having the pulse width that is increased in an exponential manner from the pulse width of the first voltage pulse applied in the applying of the first voltage pulse which is performed immediately prior to the applying of the new first voltage pulse.

7. The forming method according to claim 1,
wherein a material of the first electrode is different from a material of the second electrode, and
the second electrode comprises one of: iridium; and an alloy of Ir and platinum.

8. The forming method according to claim 1,
wherein the first transition metal oxide layer comprises a composition expressed by $TaO_x$, and
the second transition metal oxide layer comprises a composition expressed by $TaO_y$, where $x<y$.

9. The forming method according to claim 1,
wherein a transition metal included in the first transition metal oxide layer is different from a transition metal included in the second transition metal oxide layer.

10. The forming method according to claim 1,
wherein the variable resistance nonvolatile memory element in the initial state has an initial resistance value that is higher than a resistance value of the variable resistance nonvolatile memory element in the high resistance state, and
the initial resistance value is higher than 1 MΩ.

11. The forming method according to claim 1,
wherein the switch element is a MOS transistor.

12. The forming method according to claim 1,
wherein the switch element is a bi-directional diode.

13. A variable resistance nonvolatile memory device including memory cells in each of which a variable resistance nonvolatile memory element is connected in series with a switch element,
the variable resistance nonvolatile memory element including: a first electrode connected to the switch element; a second electrode; and an oxygen-deficient transition metal oxide layer provided between the first electrode and the second electrode,
the oxygen-deficient transition metal oxide layer including: a first transition metal oxide layer in contact with the first electrode; and a second oxygen-deficient transition metal oxide layer in contact with the second electrode, the second oxygen-deficient transition metal oxide layer having an oxygen deficient degree lower than an oxygen deficient degree of the first transition metal oxide layer,
the variable resistance nonvolatile memory element having:
characteristics by which a resistance state of the variable resistance nonvolatile memory element is changed to the low resistance state when a low resistance writing voltage pulse having a positive voltage and equal to or higher than a first threshold voltage is applied to the first electrode with reference to the second electrode, and the resistance state is changed to a high resistance state when a high resistance writing voltage pulse having a positive voltage and equal to or higher than a second threshold voltage is applied to the second electrode with reference to the first electrode;
non-linear current-voltage characteristics in an initial state after manufacturing where the resistance state is higher than the high resistance sate and has not yet been changed to a changeable state where the resistance state is reversibly changeable between the high resistance state and the low resistance state according to a polarity of an applied voltage pulse and is lower than the initial state; and
characteristics by which (i) when a voltage pulse of a voltage equal to or higher than a predetermined voltage is applied in the initial state and is kept being applied for a predetermined time period, forming occurs to change the resistance state from the initial state to the changeable state, and (ii) as a current flowing in the variable resistance nonvolatile memory element is increased, a time period required for the forming is decreased in an exponential manner, and
the variable resistance nonvolatile memory device comprising:
a memory cell array including the memory cells in each of which the variable resistance nonvolatile memory element is connected in series with the switch element;
a selection unit configured to select at least one memory cell from the memory cell array;
a forming power source unit configured to generate a forming voltage to perform the forming on the variable resistance nonvolatile memory element included in the at least one memory cell selected by the selection unit;

a writing power source unit configured to generate a writing voltage to perform writing to change the resistance state of the variable resistance nonvolatile memory element included in the at least one memory cell selected by the selection unit from the high resistance state to the low resistance state or from the low resistance state to the high resistance state;

a variable pulse width writing voltage pulse generation unit configured to generate a writing voltage pulse having a variable pulse width to change the resistance state of the variable resistance nonvolatile memory element to a desired state, when one of the forming and the writing is performed on the variable resistance nonvolatile memory element included in the at least one memory cell selected by the selection unit; and a reading unit including (a) a forming determination unit configured to determine whether or not the forming is successful on the variable resistance nonvolatile memory element included in the at least one memory cell selected by the selection unit and (b) a normal determination unit configured to determine whether or not the variable resistance nonvolatile memory element included in the at least one memory cell selected by the selection unit is in the high resistance state or in the low resistance state, wherein the variable pulse width writing voltage pulse generation unit is configured, for the forming on the variable resistance nonvolatile memory element, to apply a first voltage pulse to the variable resistance nonvolatile memory element, the first voltage pulse (1) having (1-i) a positive potential at the second electrode with reference to the first electrode and an amplitude equal to or greater than an amplitude of a predetermined voltage higher than the second threshold voltage or (1-ii) a negative potential at the second electrode with reference to the first electrode and an amplitude equal to or greater than an amplitude of a predetermined voltage higher than the first threshold voltage, and the first voltage pulse (2) having a first pulse width, the application by the variable pulse width writing voltage pulse generation unit and the determination by the forming determination unit are repeated until the forming determination unit determines that the forming is successful, and in the repetition, the variable pulse width writing voltage pulse generation unit is configured to apply a new first voltage pulse to the variable resistance nonvolatile memory element, the new first voltage pulse having a pulse width longer than a pulse width of the first voltage pulse applied immediately prior to the new first voltage pulse.

14. The variable resistance nonvolatile memory device according to claim 13, wherein the variable pulse width writing voltage pulse generation unit is configured to apply a first positive voltage pulse, as the first voltage pulse, to the variable resistance nonvolatile memory element, the first positive voltage pulse (1) having a positive potential at the second electrode with reference to the first electrode and an amplitude equal to or greater than an amplitude of the predetermined voltage, and the first positive voltage pulse (2) having the first pulse width, and the forming determination unit is configured to determine whether or not the variable resistance nonvolatile memory element is in the low resistance state, so as to determine whether or not the forming of the variable resistance nonvolatile memory element after the application of the first positive voltage pulse is successful.

15. The variable resistance nonvolatile memory device according to claim 14, wherein the forming determination unit is configured to (i) apply a first negative voltage pulse to the variable resistance nonvolatile memory element, the first negative voltage pulse (1) having a voltage amplitude equal to or greater than a voltage amplitude of the low resistance writing voltage pulse, and the first negative voltage pulse (2) having a same polarity as a polarity of the low resistance writing voltage pulse, and (ii) determine, after the application of the first negative voltage pulse, whether or not the variable resistance nonvolatile memory element is in the low resistance state.

16. The variable resistance nonvolatile memory device according to claim 15, wherein a pulse width of the first negative voltage pulse is equal to a pulse width of the low resistance writing voltage pulse.

17. The variable resistance nonvolatile memory device according to claim 13, wherein a material of the first electrode is different from a material of the second electrode, and the second electrode comprises one of: iridium; and an alloy of Ir and platinum.

18. The variable resistance nonvolatile memory device according to claim 13, wherein the first transition metal oxide layer comprises a composition expressed by $TaO_x$, and the second oxygen-deficient transition metal oxide layer comprises a composition expressed by $TaO_y$, where $x<y$.

19. The variable resistance nonvolatile memory device according to claim 13, wherein a transition metal included in the first transition metal oxide layer is different from a transition metal included in the second oxygen-deficient transition metal oxide layer.

20. The variable resistance nonvolatile memory device according to claim 13, wherein the variable resistance nonvolatile memory element in the initial state has an initial resistance value that is higher than a resistance value of the variable resistance nonvolatile memory element in the high resistance state, and the initial resistance value is higher than 1 MΩ.

21. The variable resistance nonvolatile memory device according to claim 13, wherein the switch element has (a) current driving performance that is greater in the application of a voltage pulse having a positive potential at the second electrode with reference to the first electrode to the variable resistance nonvolatile memory element than (b) current driving performance in the application of a voltage pulse having a negative potential at the second electrode with reference to the first electrode to the variable resistance nonvolatile memory element.

22. The variable resistance nonvolatile memory device according to claim 13, wherein the switch element is a MOS transistor.

23. The variable resistance nonvolatile memory device according to claim 13, wherein the switch element is a bi-directional diode.

24. The variable resistance nonvolatile memory device according to claim 13, wherein the selection unit is configured to sequentially select all of the memory cells included in the memory cell array, and the variable pulse width writing voltage pulse generation unit is configured to apply, after the application of the first voltage pulse to variable resistance nonvolatile memory elements included in the all of the memory cells selected by the selection unit, the new first voltage pulse to a memory cell including a variable resistance nonvolatile memory element determined by the forming determination unit as not being successful in the forming from among the all of the memory cells selected by the selection unit.

25. A variable resistance nonvolatile memory element connected in series with a switch element to form a memory cell, the variable resistance nonvolatile memory element comprising:

a first electrode connected to the switch element; a second electrode; and an oxygen-deficient transition metal oxide layer provided between the first electrode and the second electrode, wherein the oxygen-deficient transition metal oxide layer includes: a first transition metal oxide layer in contact with the first electrode; and a second transition metal oxide layer in contact with the second electrode, the second transition metal oxide layer having an oxygen deficient degree lower than an oxygen deficient degree of the first transition metal oxide layer, and the variable resistance nonvolatile memory element has:

characteristics by which a resistance state of the variable resistance nonvolatile memory element is changed to a low resistance state when a low resistance writing voltage pulse having a positive potential and equal to or higher than a first threshold voltage is applied to the first electrode with reference to the second electrode, and the resistance state is changed to a high resistance state when a high resistance writing voltage pulse having a positive potential and equal to or higher than a second threshold voltage is applied to the second electrode with reference to the first electrode;

an initial state after manufacturing where the resistance state is higher than the high resistance state and has not yet been changed to a changeable state where the resistance state is reversibly changeable between the high resistance state and the low resistance state according to a polarity of an applied voltage pulse and is lower than the initial state;

non-linear current-voltage characteristics in the initial state;

characteristics by which (i) when a voltage pulse of a voltage equal to or higher than a predetermined voltage is applied in the initial state and is kept being applied for a predetermined time period, forming occurs to change the resistance state to the changeable state, and (ii) as a current flowing in the variable resistance nonvolatile memory element is increased, a time period required for the forming is decreased in an exponential manner; and characteristics, in the forming, by which as a cumulative pulse application time period of at least one applied voltage pulse is increased, a probability that the forming is successful is increased.

* * * * *